(12) United States Patent
Kuroki et al.

(10) Patent No.: US 6,751,128 B2
(45) Date of Patent: Jun. 15, 2004

(54) SEMICONDUCTOR MEMORY DEVICE HAVING SHORTENED TESTING TIME

(75) Inventors: Koji Kuroki, Tokyo (JP); Hidekazu Noguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/106,351

(22) Filed: Mar. 27, 2002

(65) Prior Publication Data

US 2002/0182800 A1 Dec. 5, 2002

(30) Foreign Application Priority Data

Jun. 5, 2001 (JP) ........................................ 2001-169578

(51) Int. Cl.[7] ................................................. G11C 7/00
(52) U.S. Cl. ............. 365/189.04; 365/200; 365/230.04; 365/230.05
(58) Field of Search ........................... 365/189.04, 200, 365/201, 230.03, 230.04, 230.05

(56) References Cited

U.S. PATENT DOCUMENTS

| | | | | |
|---|---|---|---|---|
| 5,930,194 A | * | 7/1999 | Yamagata et al. | 365/230.03 |
| 6,104,648 A | * | 8/2000 | Ooishi | 365/200 |
| 6,295,618 B1 | * | 9/2001 | Keeth | 714/718 |

FOREIGN PATENT DOCUMENTS

| | | |
|---|---|---|
| JP | 11-176188 | 7/1999 |
| JP | 11-213697 | 8/1999 |

* cited by examiner

*Primary Examiner*—Son Mai
(74) *Attorney, Agent, or Firm*—Volentine Francos, PLLC

(57) ABSTRACT

The period of time required for a parallel test can be shortened by widening the application range of the parallel test. In the semiconductor memory device having memory cell portions, there are provided a column controller that simultaneously activates a plurality of columns which are subject to degenerate substitution in a column redundant substitution; and a data read-out circuit that simultaneously reads out the data from a plurality of memory cells as selected by the above plurality of columns.

10 Claims, 36 Drawing Sheets

FIG.12

H : Hi level
L : Lo level

| AY<0> | SDB-B0<i> | SDBb-B0<i> | SDB-B1<i> | SDBb-B1<i> | A | Ab | B | Bb | EXP | EXP0 | EXP0b | EXP1 | EXP1b | C | Cb | EN-B0 | EN-B1 | DB<i> | DBb<i> | TST1 | |
|---|---|---|---|---|---|---|---|---|---|---|---|---|---|---|---|---|---|---|---|---|---|
| H | H | L | H | L | H | L | H | L | H | L | H | H | L | H | L | H | L | H | L | H | TRUE |
| H | H | L | L | H | H | L | L | H | H | L | H | H | L | L | H | H | L | L | H | H | FALSE |
| H | L | H | H | L | L | H | H | L | H | L | H | H | L | L | H | H | L | L | H | H | FALSE |
| H | L | H | L | H | L | H | L | H | H | L | H | H | L | L | H | H | L | L | H | H | FALSE |
| L | L | H | L | H | L | H | L | H | L | H | L | L | H | L | H | H | L | H | L | H | TRUE |
| L | H | L | H | L | H | L | H | L | L | H | L | L | H | H | L | H | L | L | H | H | FALSE |
| L | L | H | H | L | H | H | L | L | L | H | L | L | H | H | L | H | L | H | L | H | FALSE |
| L | H | L | L | H | L | L | H | L | L | H | L | L | H | H | L | H | L | L | H | H | FALSE |

FIG.23

H : HI level
L : Lo level

| | AY<0> | SDB-B0 | SDBb-B0 | SDB-B1 | SDBb-B1 | A | Ab | B | Bb | EXP0 | EXP0b | EXP1 | EYP1b | C | Cb | EN-test | EN-B0 | EN-B1 | DB | DBb |
|---|---|---|---|---|---|---|---|---|---|---|---|---|---|---|---|---|---|---|---|---|
| TRUE  | H | H | L | L | L | H | L | H | L | L | H | H | L | H | L | H | L | L | H | L |
| FALSE | H | H | L | L | H | H | L | L | H | L | H | H | L | L | H | H | L | L | L | H |
| FALSE | H | L | H | H | L | L | H | H | L | L | H | H | L | L | H | H | L | L | L | H |
| FALSE | H | L | H | H | L | L | H | L | L | L | H | H | L | H | H | H | L | L | L | H |
| TRUE  | L | L | H | H | L | L | H | L | L | H | L | L | H | L | H | H | L | L | L | H |
| FALSE | L | H | L | L | H | H | L | H | H | H | L | L | H | L | H | H | L | L | H | L |
| FALSE | L | H | H | H | L | L | H | H | L | H | L | L | H | L | H | H | L | L | H | L |
| FALSE | L | H | H | H | L | H | L | H | L | H | L | L | H | H | L | H | L | L | H | L |

FIG.28(a)

H : Hi level
L : Lo level

| | AY<0> | SDB-B0 | SDB-B1 | SDBb-B0 | SDBb-B1 | A | Ab | B | Bb | TEST1 | TESTTPH0 | TESTTPHA | EXP0 | EXP0b | EXP1 | EXP1b | C | Cb | EN-B0 | EN-B1 | DB | DBb |
|---|---|---|---|---|---|---|---|---|---|---|---|---|---|---|---|---|---|---|---|---|---|---|
| DQ0 | H | H | L | L | H | H | L | H | L | H | H | H | L | H | L | H | H | L | H | L | H | L |
| DQ1 | H | H | L | L | H | H | L | H | L | H | H | H | L | H | L | H | H | L | H | L | H | L |
| DQ2 | H | H | L | L | H | H | L | H | L | H | H | H | L | H | L | H | H | L | H | L | H | L |
| DQ3 | H | H | L | L | H | H | L | H | L | H | H | H | L | H | L | H | H | L | H | L | H | L |

FIG.28(b)

H : Hi level
L : Lo level

| | AY<0> | SDB-B0 | SDB-B1 | SDBb-B0 | SDBb-B1 | A | Ab | B | Bb | TEST1 | TESTTPH0 | TESTTPHA | EXP0 | EXP0b | EXP1 | EXP1b | C | Cb | EN-B0 | EN-B1 | DB | DBb |
|---|---|---|---|---|---|---|---|---|---|---|---|---|---|---|---|---|---|---|---|---|---|---|
| DQ0 | H | H | L | L | H | H | L | H | L | H | H | H | L | H | L | H | H | L | H | L | H | L |
| DQ1 | H | L | H | L | H | L | H | L | H | H | H | H | H | L | H | L | L | H | H | L | L | H |
| DQ2 | H | H | L | H | L | L | H | H | L | H | H | H | L | H | L | H | H | L | H | L | H | L |
| DQ3 | H | L | H | H | L | L | H | L | H | H | H | H | H | L | H | L | L | H | H | L | L | H |

SEMICONDUCTOR MEMORY DEVICE HAVING SHORTENED TESTING TIME

BACKGROUND OF THE INVENTION

1. Field of the Invention

The present invention relates to a semiconductor memory device, and more particularly to a semiconductor memory device of the synchronous type including a memory cell portion which allows the data read/write to be executed.

2. Related Art

Referring to FIG. 35 of the accompanying drawings, which is a diagram for describing a data read test in a prior art semiconductor memory device. In this figure, each of blocks A and B is made up of a memory cell portion and a sense amplifier circuit portion, respectively, wherein SDBP-A<j> and SDBP-B<j> indicate a subdata bus pair belonging to blocks A and B, respectively; 909-A<j> and 909-B<j> a read sense amplifier circuit portion (referred to as "RSAMP circuit portion" hereinafter) of blocks A and B; a DBP<j> data bus; 11<j> a read amplifier circuit (referred to as "Read Amp circuit" hereinafter); 12<j> an output buffer circuit (referred to as "Dout Buffer circuit" hereinafter); and DQ<j> a data I/O pins. In the above, the letter "j" indicates the bit of the data as read or written, and it may be one of digits 0~7 in case of the semiconductor memory device of the 8-bit configuration while being one of digits 0~15 in case of the semiconductor memory device of the 16-bit configuration. Accordingly, in case of the semiconductor memory device of the 8-bit configuration, for instance, there are provided 16 RSAMP circuit portions 909-A<0>~909-A<7> and 909-B<0>~909-B<7>, and 8 data bus pairs DBP<0>~DBP<7>.

In the semiconductor memory device as shown in FIG. 35, the data read-out in the normal mode is carried out as follows. First, the block A or B is selected according to the most significant bit (block selection bit) of the input Y-address data while the column (bit line) within the block is selected according to the other Y-address data. The row (word line) within the block is selected according to the input X-address data. The data in the memory cell defined by the selected column and row of the selected block is then read out to the data bus pairs DBP<j> by means of the RSAMP circuit portion 909-A<j> or 909-B<j>.

In contrast to the above, in case of the data read in the test mode (data read test), the above block selection bit is ignored by "Don't Care" operation and two data of the blocks A and B are simultaneously read out to the data bus pair DBP<J> by RSAMP circuit portions 909-A<j> and 909-B<j>, and then it is judged if these two data are correct or not. The test in which the address is made degenerate and two data are simultaneously read or written, is called a parallel test. In the prior art parallel test, two data are simultaneously read out by simultaneously selecting two X-addresses, which is called a degenerate X-address parallel test.

FIG. 36 is a diagram for explaining the redundant substitution of a faulty memory cell. In this FIG, 5-A and 5-B indicate respective memory cell portions of blocks A and B; 5-R a redundant memory portion; CL0, CL1 . . . CLm respective columns of memory cell portions 5-A and 5-B; RCL0, RCL1 . . . columns of the redundant memory portion 5-R; and WL0, WL1 . . . WLn word lines.

In FIG. 36, if the memory cell defined by the column CL0 and the word line WL1 of the block A is faulty, the memory cells defined by columns CL0 and CL1 and word lines WL0~WLn of the block A are subject to the redundant substitution by0 using memory cells defined by columns CL0~CL1 and word lines WL0~WLn of the redundant memory cell portion 5-R. Accordingly, in the redundant substitution of FIG. 36, if a faulty memory cell exists in Y-address=#000 when making the least significant bit of the Y-address degenerate, two Y-addresses #000 and #001 are subject to the redundant substitution.

Like this, the redundant substitution of the faulty memory cell is to redundantly replace all the memory cells belonging to the same column as the faulty memory cell, and this is called "column redundant substitution system." As the above column redundant substitution is executed with respect to the memory cells belonging to two Y-address (two columns), it may be called "degenerate Y-address redundant substitute."

The prior art semiconductor memory device is provided with a Y-address decode circuit including a plurality of decode circuits for decoding the Y-address data. In each of these decode circuits, the decode signals are generated based on the Y-address data from which the other one bit for the block selection bit and Y-degeneration control is deleted. With these decode signals, either two of the Y-addresses (the degenerate Y-addresses of which either one bit is made degenerate) are selected, and either one of the above two Y-addresses is selected according to the signal generated based on the above other one bit of the Y-degenerate control circuit. The reason for the redundant substitution means to takes two steps of making two Y-addresses degenerate and then carrying out the redundant substitution, is that it is judged whether or not the Y-address data as inputted is the data of the Y-address that has been subject to the redundant substitution, based on the bit of the Y-address data as inputted to the above decode circuit or based on the above decode signal.

In the above prior art semiconductor memory device, however, there has been such a problem that the above X-address degenerate parallel test can not be carried out in the test including the redundant substitution of the faulty memory cell. Because, in the above degenerate X-address parallel test, it is impossible to judge which block the faulty memory cell belongs to, and the above column redundant substitution is that which is applied to two degenerate Y-addresses in the block, so that it is hard to simultaneously relief the different blocks.

For instance, in case of the semiconductor memory device of the 8-bit configuration, there is mainly adopted such a configuration that is convenient for the unit data of 8-bit to be read from/written to either the block A or B. Furthermore, for instance, in case of the semiconductor memory device of the 16-bit configuration, there is mainly adopted such a configuration that the Y-address data is provided with no block selection bit and 8-bit each of the unit data of 16 bit is read from/written to the blocks A and B. However, in case of the semiconductor device having no block selection bit, there was the problem that the degenerate X-address parallel test can not be executed. Because it is not possible to simultaneously read out two data of the different block to the same data bus pair. As the multiplex of the read/write data unit bit is strongly desired, so that the configuration without the block selection might form the main current in future as described above.

SUMMARY OF THE INVENTION

The present invention has been made in order to solve such problems as described above, and it is an object of the invention to provide a semiconductor memory device of which the test time can be shortened by widening the application range of the parallel test such that the parallel test becomes possible even in the test of the semiconductor memory device provided with neither the test including the redundant substitution nor the block selection.

In order to achieve the above object, according to the invention, there is provided a semiconductor memory device having a memory portion wherein the data read/write is carried out by means of an EVEN/ODD system provided with an EVEN subdata bus and an ODD subdata bus, the above semiconductor memory device comprising:

a column control means for simultaneously activating a plurality of columns which are subject to the degenerate substitution in the column redundant substitution;

a data read-out means for simultaneously reading out the data from a plurality of memory cells as selected by the above plurality of columns, the data read-out means reading out the data of the memory cells of the first address to the EVEN subdata bus and reading out the data of memory cells of the second address to the ODD subdata bus, with regard to simultaneously activated columns of the first and second addresses; and a judgement means for judging the data as read out to the EVEN subdata bus and the data as read out to the ODD subdata bus.

Furthermore, according to the invention, there is provided another semiconductor memory device having a memory cell portion to which the data read/write can be carried out, the above semiconductor memory device comprising:

a column control means for simultaneously activating a plurality of columns which are subject to the degenerate substitution in the column redundant substitution; and a data read-out means for simultaneously reading out the data from a plurality of memory cells selected by the above plurality of columns.

Still further, according to the invention, there is provided another semiconductor memory device having a memory portion wherein the data read/write is carried out by means of an EVEN/ODD system provided with an EVEN subdata bus and an ODD subdata bus as well, the above semiconductor memory device comprising:

a column control means for simultaneously activating a plurality of columns which is subject to the degenerate substitution in the column redundant substitute; and a data write means for simultaneously writing the data to a plurality of memory cells as selected by the above plurality of columns, wherein with respect to the simultaneously activated columns of the first address and the same of the second address, the data write means simultaneously transmits the data to the EVEN subdata bus and the ODD subdata bus, and it writes the data to the memory cell of the first address through the EVEN subdata bus while it writes the data to the memory cell of the second address through the ODD subdata bus.

Still further, according to the invention, there is provided another semiconductor memory device having a memory cell portion to which the data read/write can be carried out, the above semiconductor memory device comprising:

a column control means for simultaneously activating a plurality of columns which are subject to the degenerate substitution in the column redundant substitute; and a data write means for simultaneously writing the data to a plurality of memory cells selected by the plurality of columns.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings:

FIG. 12 is a truth table for explaining the operation of the expected value circuit as shown in FIG. 6 and the read sense amplifier circuit as shown in FIG. 8, in a parallel test;

FIG. 23 is a truth table for explaining the operation of the expected value circuit as shown in FIG. 21 and the read sense amplifier circuit portion as shown in FIG. 22;

FIG. 28 is a truth table for explaining the operation of the expected value circuit and the read sense amplifier circuit portion in the semiconductor memory device according to the second embodiment;

DETAILED DESCRIPTION OF THE PREFERRED EMBODIMENTS

First Embodiment

Figure 1:
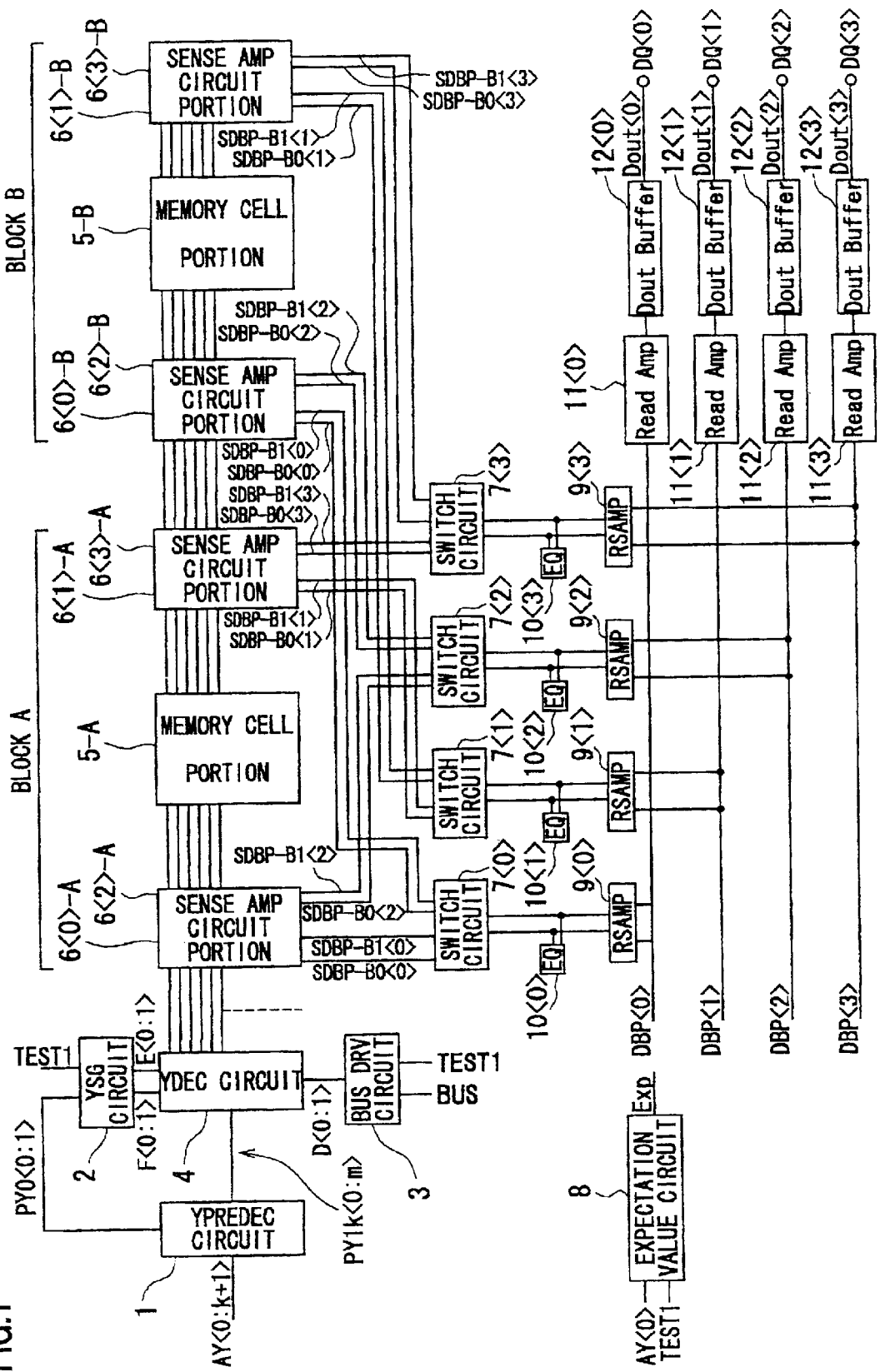
FIG. 1 is a diagram showing the configuration of a semiconductor memory device according the first embodiment of the invention.

Referring to FIG. 1, the semiconductor memory device as shown in this figure includes a Y-predecode (YPREDEC) circuit 1, a Y-degenerate control (YSG) circuit 2, a bus drive (BUS DVR) circuit 3, a Y-decode (YDEC) circuit 4, memory cell portions 5-A and 5-B, sense amplifier circuit portions 6-A (i.e. 6<0>-A~6<3>-A) and 6-B (i.e. 6<0>-B~6<3>-B), switch circuits 7<0>~7<3>, an expected value circuit 8, read sense amplifier (RSAMP) circuit portions 9<0>~9<3>, equalizer circuits 10<0>~10<3>, read amplifier (Read Amp) circuits 11<0>~11<3>, output buffer (Dout Buffer) circuits 12<0>~12<3>, EVEN subdata bus pairs SDBP-B0<0>~SDBP-B0<3>, ODD subdata bus pairs SDBP-B1<0>~SDBP-B1<3>, data bus pairs DBP<0>~DBP<3>, and data I/O pins DQ<0>~DQ<3>. In FIG. 1, however, the following circuits are omitted from the figure, that is, a circuit for data write, a circuit for block selection, a circuit for redundant substitution, and a circuit for decoding the X-address to control the word line.

Figure 36:
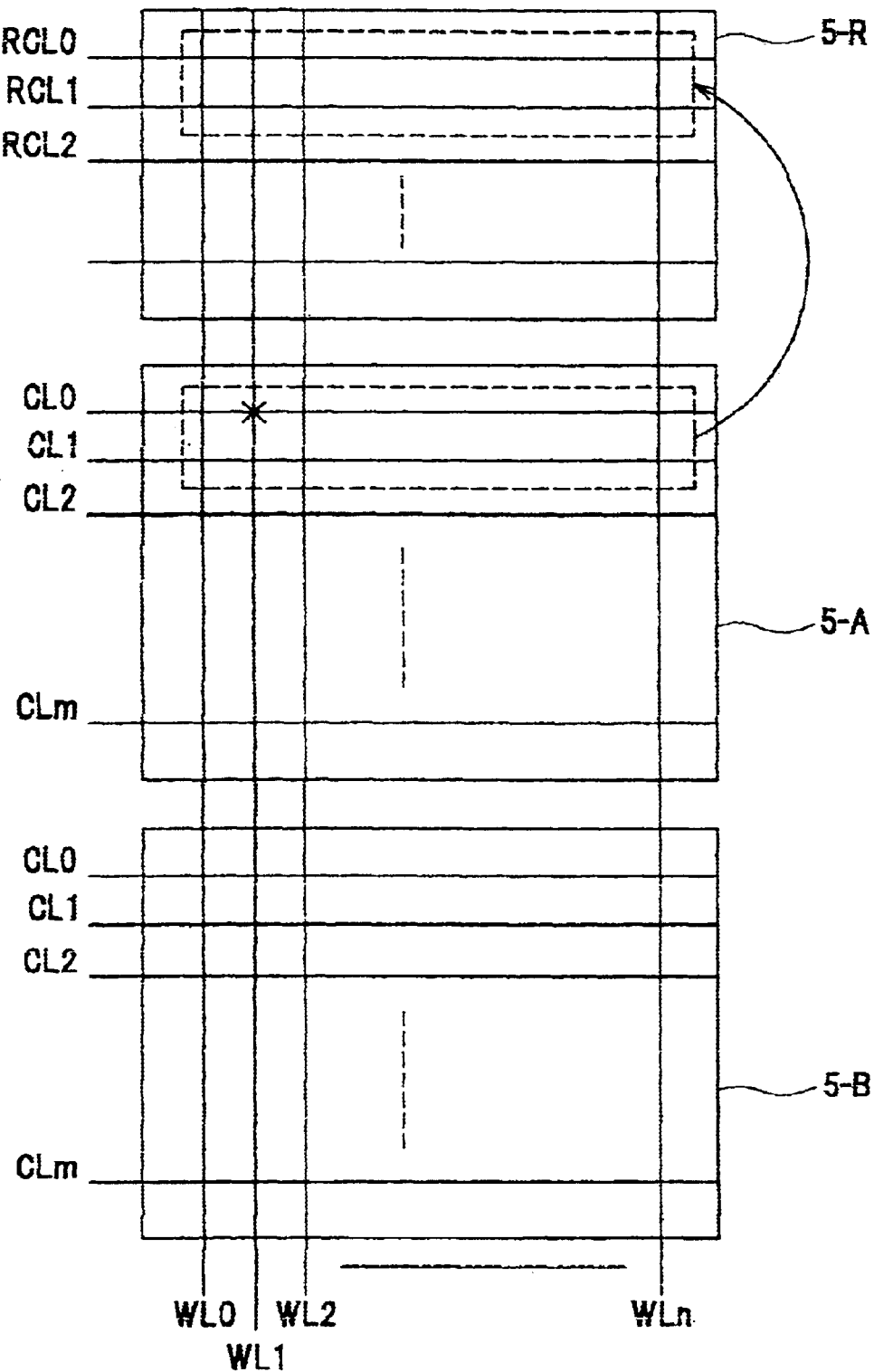
FIG. 36 is a diagram for explaining the redundant substitution of faulty memory cell.

As already explained referring to FIG. 36, the redundant substitution of a faulty memory cell in the semiconductor memory device of FIG. 1 is the column redundant substitution wherein the least significant bit of the Y-addresses is made degenerate. To put it more concretely, for instance, if the faulty memory cell exists in the Y-address #000, the redundant substitution is collectively carried out with respect to two Y-addresses #000 and #001. Here, let us assume that the data read/write unit in the semiconductor memory device of FIG. 1 be 4-bit.

This semiconductor memory device according to the first embodiment is characterized in that a plurality of columns being subject to the degenerate substitution in the column redundant substitution are simultaneously activated and the data are simultaneously read out from a plurality of memory cell selected by these activated columns, thereby executing a parallel test with regard to a plurality of Y-addresses in the degenerate state (referred to as "degenerate Y-address(es)) to be substituted by the degenerate substitution.

Figure 2:
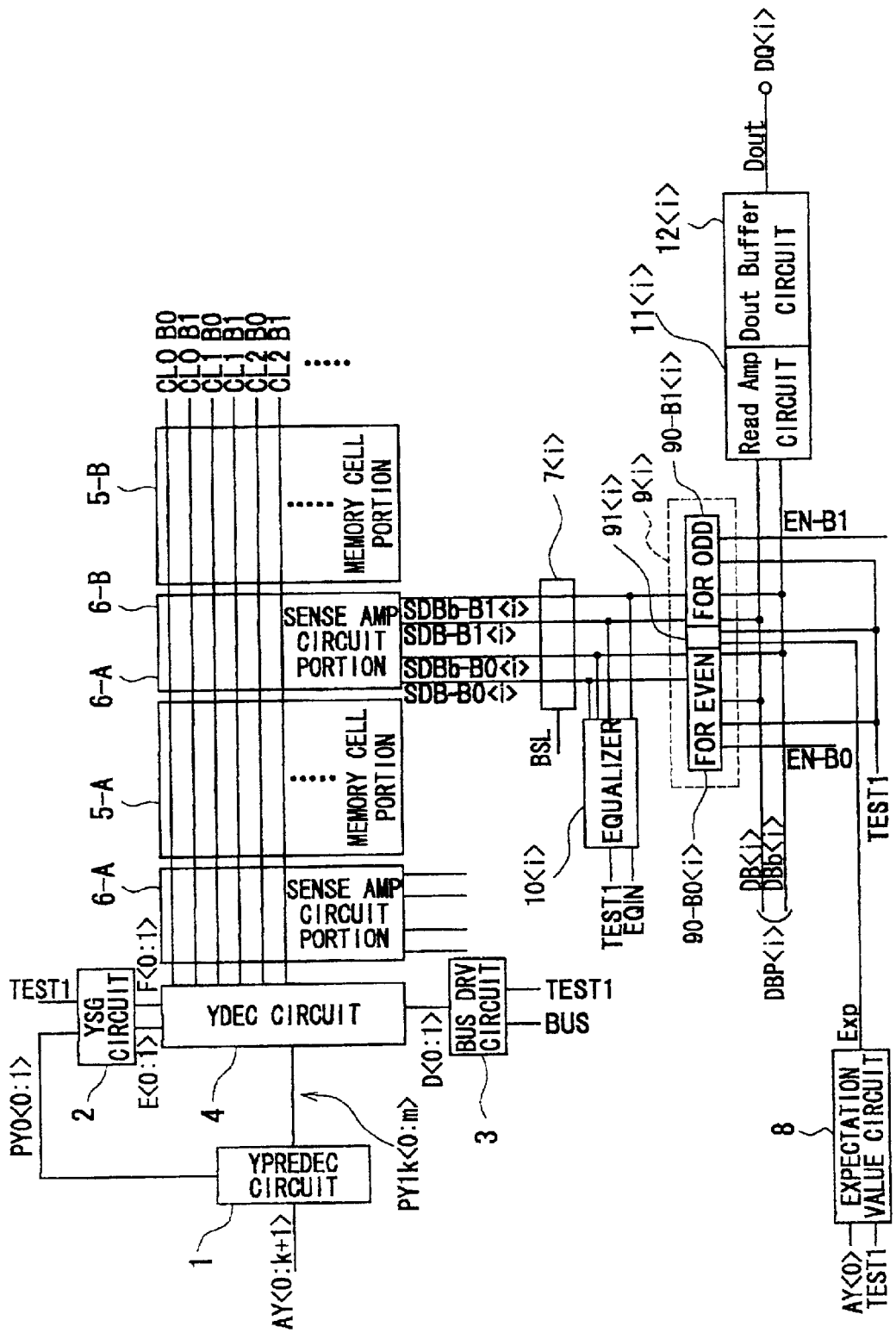
FIG. 2 is a diagram indicating the simplified configuration of the semiconductor memory device as shown in FIG. 1.

Referring to FIG. 2 showing a simplified configuration of the semiconductor memory device as shown in FIG. 2, the EVEN subdata bus pair SDBP-B0<i> is made up of EVEN subdata buses SDB-B0<i>, SDBb-B0<i>. Also, the ODD subdata bus pair SDBP-B1<i> is made up of ODD subdata buses SDB-B1<i>, SDBb-B1<i>. Furthermore, the data bus pair DBP<i> is made up of data buses DB<i>, DBb<i>. In the above, i=0, 1, 2 or 3.

Y-Predecode Circuit 1

To the Y-predecode circuit 1 is a Y-address data AY<0:k+1> of (k+2) bit (k: an integer) inputted. The Y-predecode circuit 1 generates a signal PY1k<0:m> of (m+1) bit (m:integer) based on the Y-address data AY<1:k> and outputs it to the Y-decode circuit 4. Furthermore, the Y-predecode circuit 1 generates a signal PY0<0:1> for the Y-degenerate control based on a Y-address data AY<0> (the least significant bit of Y-address data AY<0>) and outputs it to the Y-degenerate control circuit 2. Still further, the Y-predecode circuit 1 generates a signal for block selection based on the Y-address data AY<k+1> (the most significant bit of the Y-address data AY, i.e. the block selection bit) and outputs it to the circuit for block selection. The above Y-address data AY<1:k> is a signal externally inputted to the semiconductor memory device of FIG. 1.

Y-Degenerate Control Circuit 2

The Y-degenerate control circuit 2 generates signals E<0:1> and F<0:1> of two bits according to the signals PY0<0:1> and TEST1 as inputted thereto, and then outputs them to the Y-decode circuit 4. The above signal TEST1 is a signal which is externally inputted to the semiconductor memory device of FIG. 1 and is used for controlling the switch of the operation mode of the semiconductor memory device, that is, the operational mode switch from the normal mode (normal data read/write operation when the memory device becomes a commercial product) to the test mode (data read/write operation at the time of the parallel test) or vice versa.

Bus Drive Circuit 3

The bus drive circuit 3 generates a signal D<0:1> of two bits according to the inputted signals BUS and TEST1 and then outputs it to the Y-decode circuit 4. The signal BUS is the signal that is externally inputted to the semiconductor memory device of FIG. 1 or generated in the semiconductor memory device of FIG. 1 according to the clock signal externally inputted to the semiconductor memory device of FIG. 1.

Y-Decode Circuit 4

The Y-decode circuit 4 selects the column according to input signals PY1k<0:m>, D<0:1>, E<0:1> and F<0:1> and controls the connection between the bit line pair and the subdata bus pair, that is, controls to which subdata bus pair the data is to be outputted, the EVEN subdata bus pair or the ODD subdata bus pair.

Figure 3:
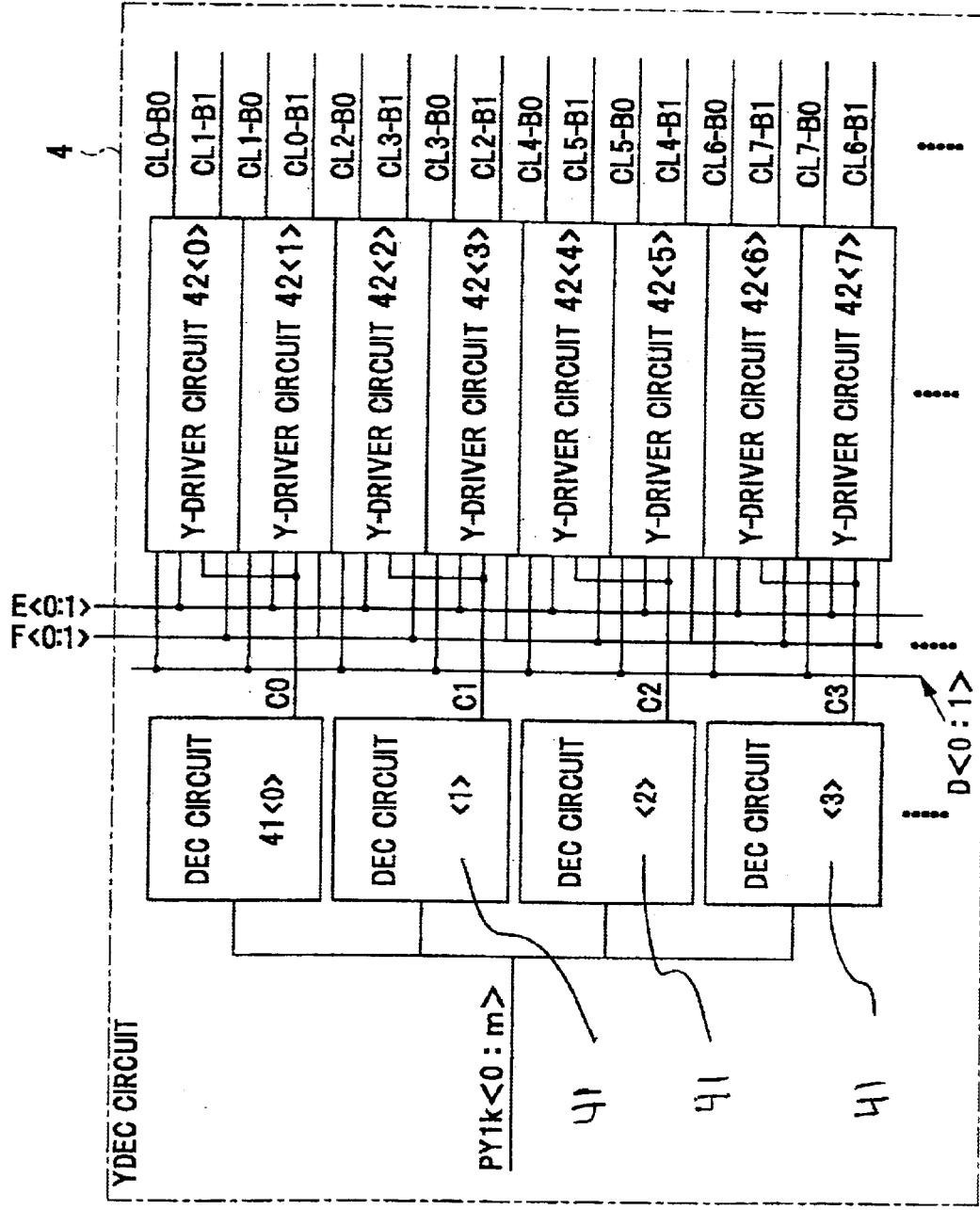
FIG. 3 is a diagram describing the configuration of a Y-decoder circuit in the semiconductor memory device as shown in FIG. 1.

Referring to FIG. 3, the Y-decode circuit 4 includes decode (DEC) circuits of (m+1), that is, 41<0>, 41<1>, ... 41<3>..., 41<m>, and Y-driver circuits of (2m+2), that is, 42<0>, 42<1>, ..., 42<7>, ..., 42<2m>.

Decode circuits 41<0>~41<m> generate and output decode signals C0, C1, ... C3, ... Cm, respectively, according to the signal PY1k<0:M> as inputted thereto. To the Y-driver circuits 42<0>~42<2m> are signals D<0:1>, E<0:1> and F<0:1> inputted. Furthermore, to Y-driver circuits 42<0> and 42<1>, 42<2> and 42<3>, ... 42<2m−1> and 42<2m> are signals C0, C1, ... C3, ... Cm inputted, respectively. Y-drive circuits 42<0>~42<2m> generate column signals CL0-B0, CL0-B1, CL1-B0, CL1-B1, ... CL7-B0, CL7-B1, ... CLm-B0, CLm-B1 according to the signal as inputted thereto.

The Y-addresses of the column signals CL0-B0 and C10-B1 are identical to each other, and the column signal CL0-B0 selects the EVEN subdata bus pair SDBP-B0<i> while the column signal CL0-B1 selects the ODD subdata bus pair SDBP-B1<i>. The column signals CL1-B0 and CL1-B1 and other column signals select the EVEN or ODD subdata bus in the same manner as described above. The Y-driver circuit 42<0> generates the column signals CL0-B0 and CL1-B1 while the Y-driver circuit 42<1> generates the column signals CL1-B0 and CL0-B1. The Y-driver circuits 42<2> and 42<3> generate their respective column signals in the same manner as the above Y-driver circuits 42<0> and 42<1>.

Block A (Memory Cell Portion 5-A and Sense Amplifier Circuit Portion 6-A)

Figure 4:
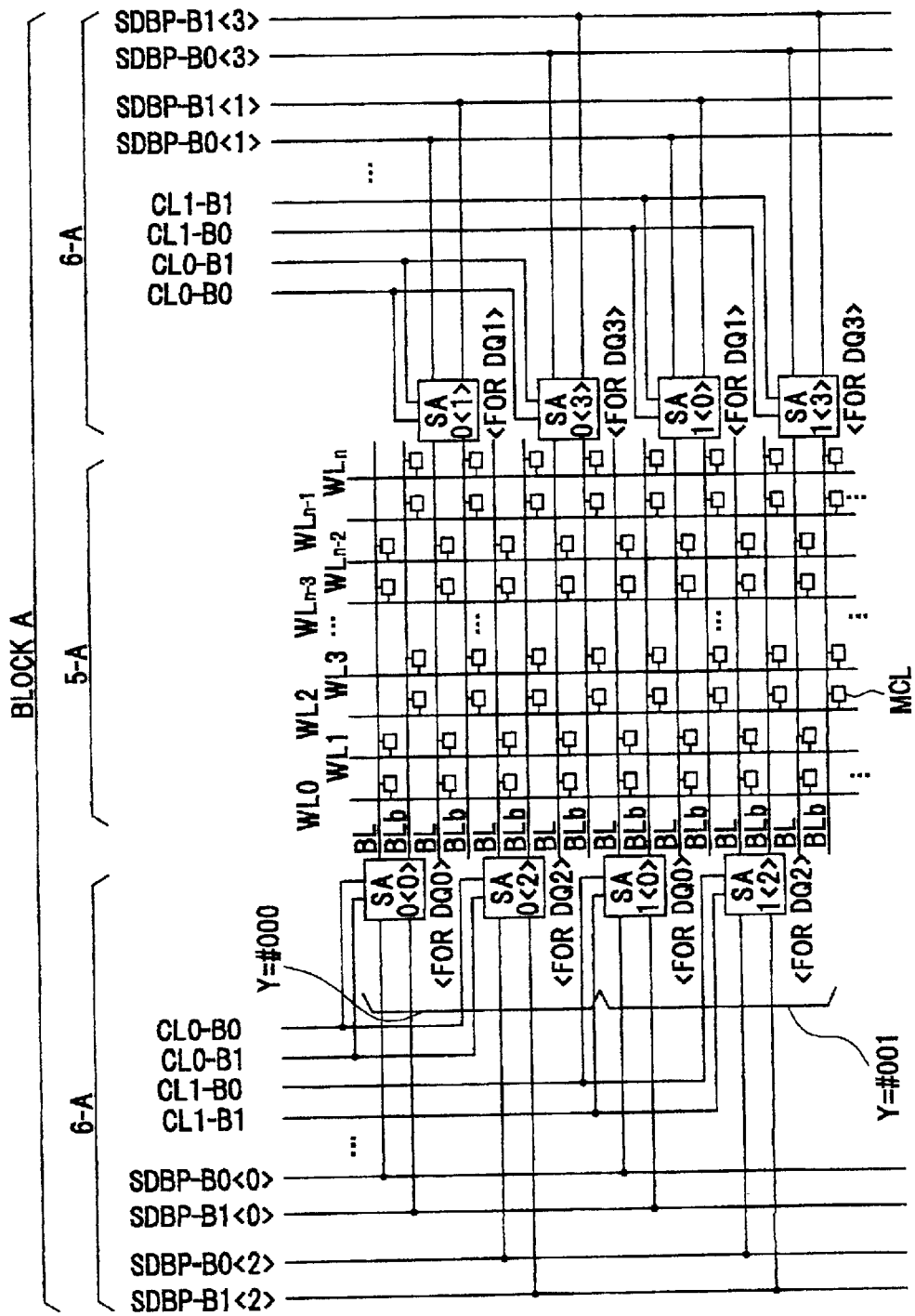
FIG. 4 is a diagram showing the configuration of a memory cell portion and a sense amplifier circuit portion in the semiconductor memory device as shown in FIG. 1.

FIG. 4 is a diagram showing the configuration of the memory cell portion 5-A and the sense amplifier circuit portion 6-A. The block B (memory cell portion 5-B and sense amplifier circuit portion 6-B) has the same configuration as the block A.

The memory cell portion 5-A includes memory cells MCL of m×n (m,n:integer), word lines of m i.e. WL1, WL2, WL3 ...WLn−3, WLn−2, WLn−1, and WLn, and bit line pairs (bit lines BL and BLb) of m. In respective memory cells MCL's is the data stored. The memory cell is arranged in such a position that it is connected with any of word lines WL0, WL1, WL4, WL5, ..., WLn−3, WLn−2 and also connected with any of bit lines BL's and also that it can be connected with any of word lines WL2, WL2, WL6, WL7, ..., WLn−1, WLn and with any of bit lines BLb's.

The sense amplifier circuit portion 6-A includes sense amplifier circuits SA0<0>, SA0<1>, SA0<2>, SA0<3>, the same SA1<0>, SA1<1>, SA1<2>, SA1<3>, ..., and the same SAm<0>, SAm<1>, SAm<2>, SAm<3>. From among these, the sense amplifier circuits SA0<0>, SA1<0>, ... ,SAm<0> make up the sense amplifier circuit portion 6<0>-A; the same SA0<1>, SA1<1>, ... ,SAm<1> make up the sense amplifier circuit portion 6<1 >-A; the same SA0<2>, SA1<2>,... ,SAm<2> make up the sense amplifier circuit portion 6<2>-A; and the same SA0<3>, SA1<3>, ... ,SAm<3> make up the sense amplifier circuit portion 6<3>-A. The sense amplifier circuit portions 6<0>-A and 6<2>-A are arranged on the left side of the memory cell portion 5-A of FIG. 4 while The sense amplifier circuit portions 6<1>-A and 6<3>-A are arranged on the right side of the memory cell portion 5-A of FIG. 4.

Now, letting bit line pairs of m be BLP0<0>, BLP0<1>, BLP0<2>, BLP0<3>, BLP1<0>, BLP1<1>, BLP1<2>, BLP1<3>, ..., BLPm<0>, BLPm<1>, BLPm<2>, and BLPm<3> in descending order in FIG. 4, bit line pairs BLP0<0>, BLP0<1>, BLP0<2>, and BLP0<3> are connected with the input (the output at the time of data write) of respective sense amplifier circuits SA0<0>, SA0<1>, SA0<2>, and SA0<3>. In the same manner, BLP1<0>, BLP1<1>, BLP1<2>, BLP1<3>, ..., BLPm<0>, BLPm<1>, BLPm<2>, and BLPm<3> are connected with the input of respective sense amplifier circuits SA1<0>, SA1<1>, SA1<2>, SA1<3>, ..., SAm<0>, SAm<1>, SAm<2>, and SAm<3>.

Furthermore, one input (input at the time of data write) of sense amplifier circuits SA0<i>, SA1<i>, ..., SAm<i> is connected with the EVEN subdata bus pair SDBP-B0<i> (SDB-B0<i>, SDBb-B0<i>) and also with the ODD subdata bus pair SDBP-B1<i> (SDB-B1<i>, SDBb-B1 <i>).

Still further, to the sense amplifier circuit SA0<i> are column signals CL0-B0 and CL0-B1 inputted while to the sense amplifier circuit SA1<i> are column signals CL1-B0 and CL1-B1 inputted. In the same manner, to the sense amplifier circuits SA2<i>, SA3<i>, ..., SAm<i> are column signals CL2-B0 and CL2-B1, ..., CLm-B0 and CLm-B1 inputted, respectively.

When the column signal CL0-B0 is activated, the sense amplifier circuit SA0<i> amplifies the data of the bit line pair BLP0<i> and then outputs the amplified data to EVEN subdata bus pair SDBP-B0<i>. On one hand, when the column signal CL0-B1 is activated, the data of the bit line pair BLP0<i> is amplified and then the amplified data is outputted to the ODD subdata bus pair SDBP-B1<i>. Each of sense amplifier circuits SA1<i>, SA2<i>, ..., SAm<i> carries out the same operation as the above.

Figure 5:
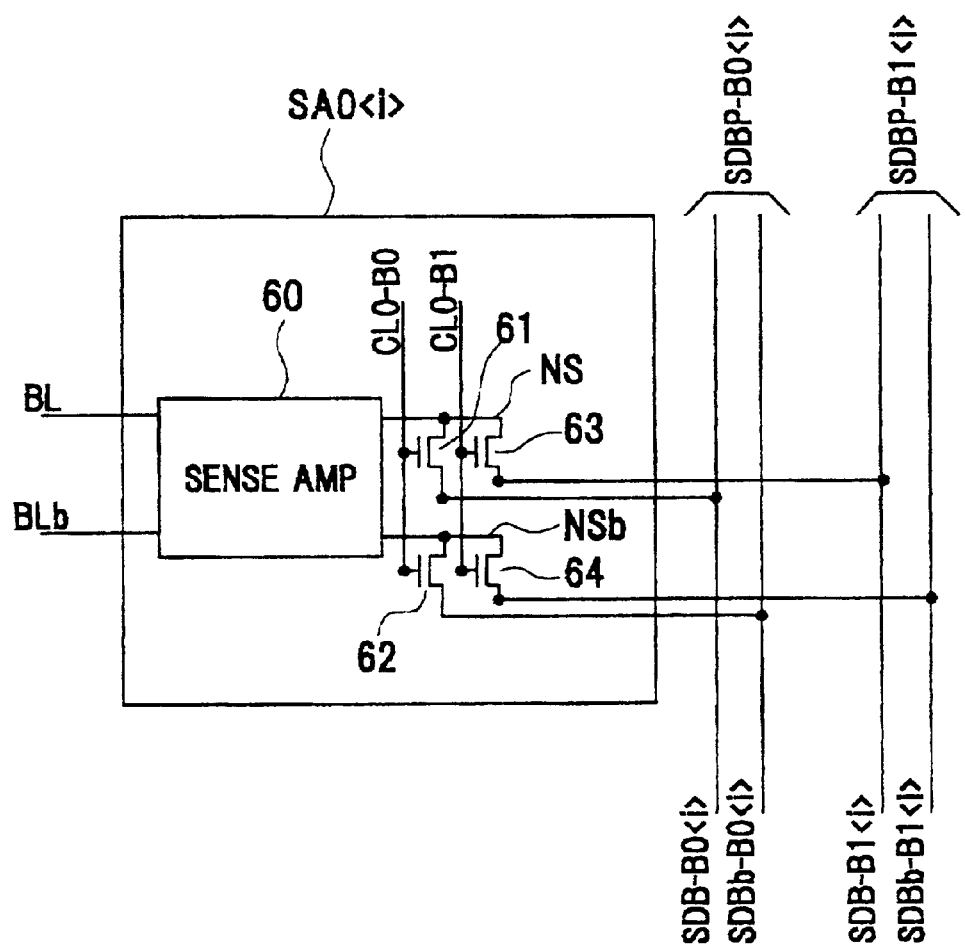
FIG. 5 is a circuit diagram of the sense amplifier circuit in the sense amplifier circuit portion as shown in FIG. 4.

Referring to FIG. 5, the sense amplifier circuit SA0<i> includes a sense amplifier 60, transistors 61, 62, 63 and 64. Other sense amplifier circuits SA1<i>~SAm<i> have the same configuration as the SA0<i> although the bit line pair connected with them and the column signal to be inputted are different.

The sense amplifier 60 amplifies the data of the bit line pair BLP0<i> and outputs the amplified data to nodes NS and NSb. The transistor 61 is inserted between the node NS and the EVEN subdata bus SDB-B0<i>, the transistor 62 between the node NSb and the EVEN subdata bus SDBb-B0<i>, the transistor 63 between the node NS and the ODD subdata bus SDBb-B1<i>, the transistor 64 between the node NSb and the ODD subdata bus SDBb-B1<i>. To each gate of the transistors 61 and 62 is the column signal CL0-B0 inputted, while to each gate of the transistors 63 and 64 is the column signal CL0-B1 inputted.

When the column signal CL0-B0 is activated, the transistors 61 and 62 are turned on, and the data of the bit line pair BLP0<i> amplified by the sense amplifier 60 is outputted to the EVEN subdata bus pair SDBP-B0<i>. On one hand, when the column signal CL0-B1 is activated, the transistors 63 and 64 are turned on, and the data of the bit line pair BLP0<i> amplified by the sense amplifier 60 is outputted to the ODD subdata bus pair SDBP-B0<i>.

Switch Circuit 7<i>

The switch circuit 7<i> connects, according to the signal BSL as inputted, the RSAMP circuit portion 9<i> with either the EVEN subdata bus pair SDBP-B0<i> and the ODD subdata bus pair SDBP-B1<i> arranged in the block A or the EVEN subdata bus pair SDBP-B0<i> and the ODD subdata bus pair SDBP-B1<i> arranged in the block B. The above signal BSL may be generated in the semiconductor memory device as shown in FIG. 1, for instance based on the aforementioned block selection bit (the most significant bit of the Y-address data AY), that is, the signal BSL is a signal for controlling block selection.

Expected Value Circuit 8

The expected value circuit 8 generates an expected value signal EXP according to the least significant bit AY<0> of a Y-address data AY and a signal TEST1 as inputted thereto, and then outputs the generated signal EXP to the RSAMP circuit portions 9<0>~9<3>. Here, let us define the meaning of "correct read data," "faulty read data," and "expected value" for easy understanding the following descriptions. While the data read/write operation is normally carried out, if the data written to memory cell (i.e. the data set as the written data when writing it in the memory cell) is read out without changing its value given at the time of having been written to the memory cell, we call that data "correct read data." To the contrary, if the read data has a value different from the value given at the time of having been written to the memory cell, we call such a data "faulty read data." Furthermore, we call the value of the data having been written to the memory cell "expected value of correct read data" while we call the value different from the value of the data having been written to the memory cell "expected value of faulty read data." According to this definition, the above expectation signal EXP comes to indicate the value of the correct read data in the degenerate parallel test. Therefore, the expected value of the above correct read data (referred to merely as "expected value" hereinafter) is "1" in the parallel test where "1" is written to the memory cell, and is "0" in the parallel test where "0" is written to the memory cell. Accordingly, in the degenerate Y-address parallel test of the first embodiment, the value of the written data (equal to he expected value of the correct read data) can be inputted to the semiconductor memory circuit by means of the least significant bit AY<0> of the Y-address data AY.

Figure 6:
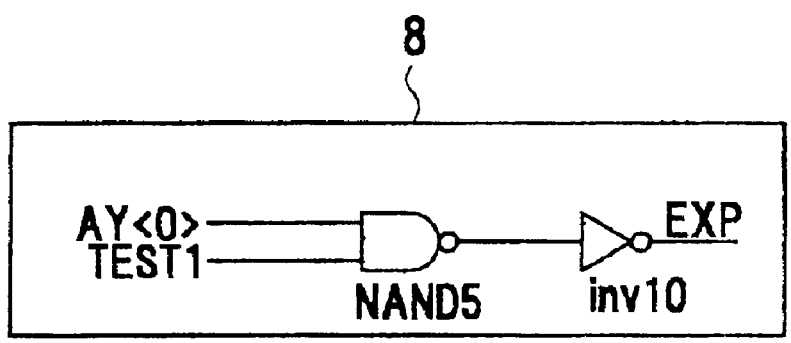
FIG. 6 is a circuit diagram of an expected value circuit in the semiconductor memory device as shown in FIG. 1.

Referring to FIG. 6, the expected value circuit 8 includes a NAND circuit 5 of the 2-input type and an inverter circuit inv10. To the NAND gate are the least significant bit AY<0> of the Y-address data AY and the signal TEST1 inputted. The output from the NAND 5 is inputted to the inverter circuit inv10 and the output from the inverter inv10 comes to indicate the expectation signal EXP. This expected value circuit 8 outputs an expectation signal EXP="L" (low level) when the signal TEST="L" while it outputs the least significant bit AY<0> as the expected value EXP when the signal TEST1="H" (high level).

RSAMP Circuit Portion 9<i>

Figure 7:
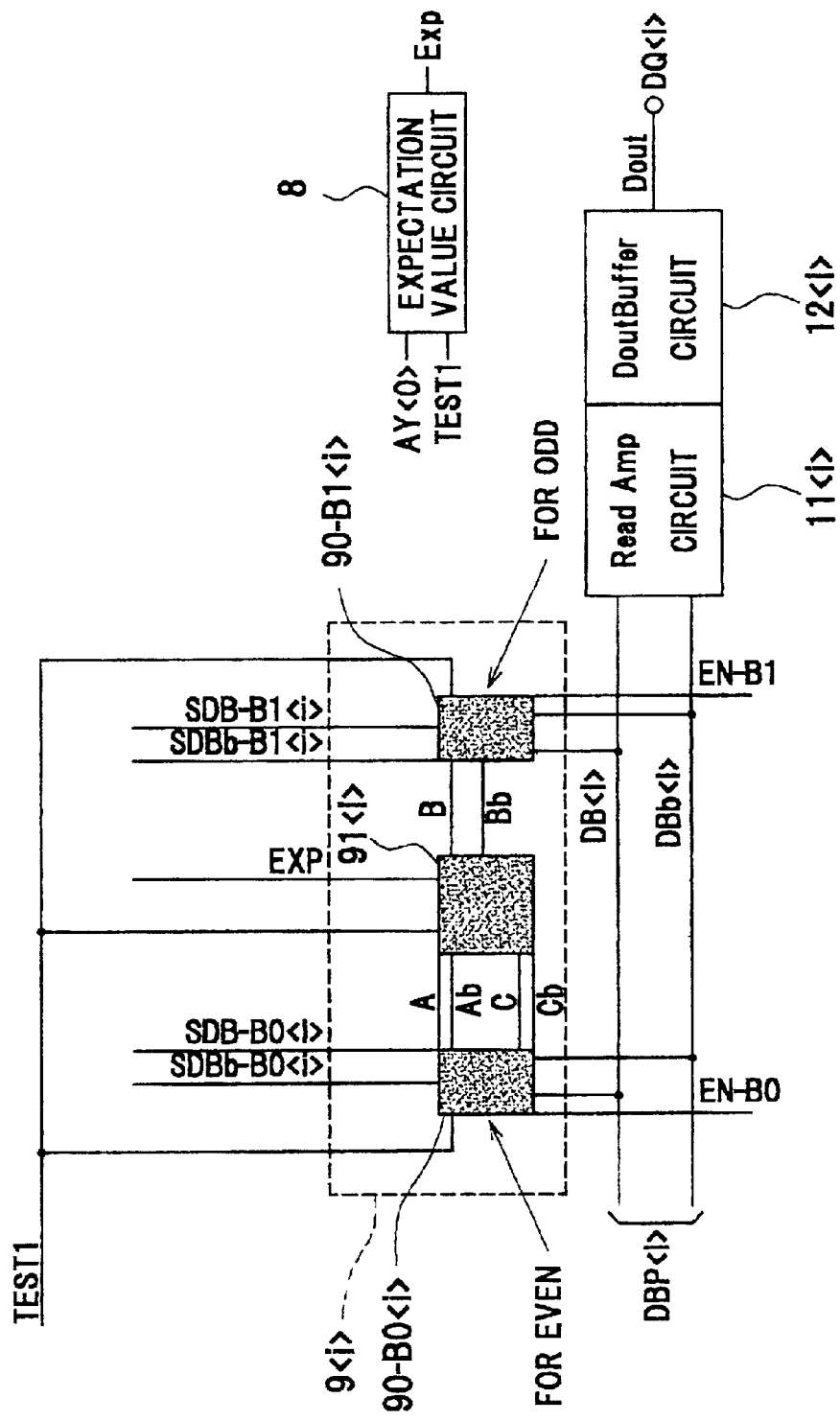
FIG. 7 is a diagram indicating the configuration of a read sense amplifier circuit portion in the semiconductor memory device as shown in FIG. 1.

FIGS. 7 shows the configuration of RSAMP circuit portions 9<i>. In FIGS. 7 and 2, a RSAMP circuit portion 9<i> includes an EVEN read sense amplifier circuit 90-B0<i>, an ODD read sense amplifier circuit 90-B1<i>, and a judgement circuit 91<i>. In the normal mode data read operation, this RSAMP circuit portion 9<i> amplifies the data that is read out from the memory cell portion to the EVEN subdata bus pair SDBP-B0<i> or the ODD subdata bus pair SDBP-B1<i> in the block A or B, and then outputs the amplified data to data bus pair DBP<i>. In the data read operation of the test mode (parallel test), two data as read out to both of the above subdata bus pairs are judged by the judgement circuits 91<i>, and the resultant data of the judgement C and Cb are outputted to the data bus pair DBP<i>.

To the EVEN read sense amplifier circuit 90-B0<i> are the data of the EVEN subdata buses SDB-B0<i>, SDBb-B0<i> and signals EN-B0 and TEST1 inputted, while to the ODD read sense amplifier circuit 90-B1<i> are the data of the ODD subdata buses SDB-B1<i>, SDBb-B1<i> and signals EN-B1 and TEST1 inputted. The above signals EN-B0, EN-B1 and TEST1 are signals which may be generated in the semiconductor memory device as shown in FIG. 1 based on the above signal BUS, for instance. The signal EN-B0 is a control signal for controlling the data transfer timing between the EVEN read sense amplifier circuit 90-B0<i> and data buses DB<i>, DBb<i>. Furthermore, the signal EN-B1 is a control signal for controlling the data transfer timing between the ODD read sense amplifier circuit 90-B1 <i> and data buses DB<i>, DBb<i>.

The EVEN read sense amplifier circuit 90-B0<i> amplifies the data of the EVEN subdata buses SDB-B0<i>, SDBb-B0<i> and outputs the amplified data A, Ab to the judgement circuit 91<i>. The ODD read sense amplifier circuit 90-B1<i> also amplifies the data of the ODD subdata buses SDB-B1<i>, SDBb-B1<i> and outputs the amplified data B, Bb to the judgement circuit 91 <i>.

In the test mode, the judgement circuit 91 <i> judges the parallel test with regard to the data A, Ab from the EVEN read sense amplifier circuit 90-B0<i> and the data B, Bb from the ODD read sense amplifier circuit 90-B1<i> based on the expectation signal TEST1 from the expected value circuit 8. Then, the judgement data C and Cb are outputted to the EVEN read sense amplifier circuit 90-B0<i>.

If the signal EN-B0 is activated, the EVEN read sense amplifier circuit 90-B0<i> outputs the read data A, Ab to the data bus pair DBP<i> in the normal mode, while it outputs the judgement data C, Cb to the data bus pair DBP<i> in the test mode. On one hand, if the signal EN-B1 is activated, the ODD read sense amplifier circuit 90-B1<i> outputs the read data B, Bb to the data bus pair DBP<i> in the normal mode, while it is fixed to the inactive state, that is, no data being outputted to the data bus pair DBP<i> in the test mode.

In the test mode, it is possible to adopt such a configuration that the judgement data C, Cb are outputted to the data bus pair DBP<i> through the ODD read sense amplifier circuit 90-B1<i>. If the configuration like this is adopted, the EVEN read sense amplifier circuit 90-B0<i> is fixed to the inactive state in the test mode.

Figure 8:
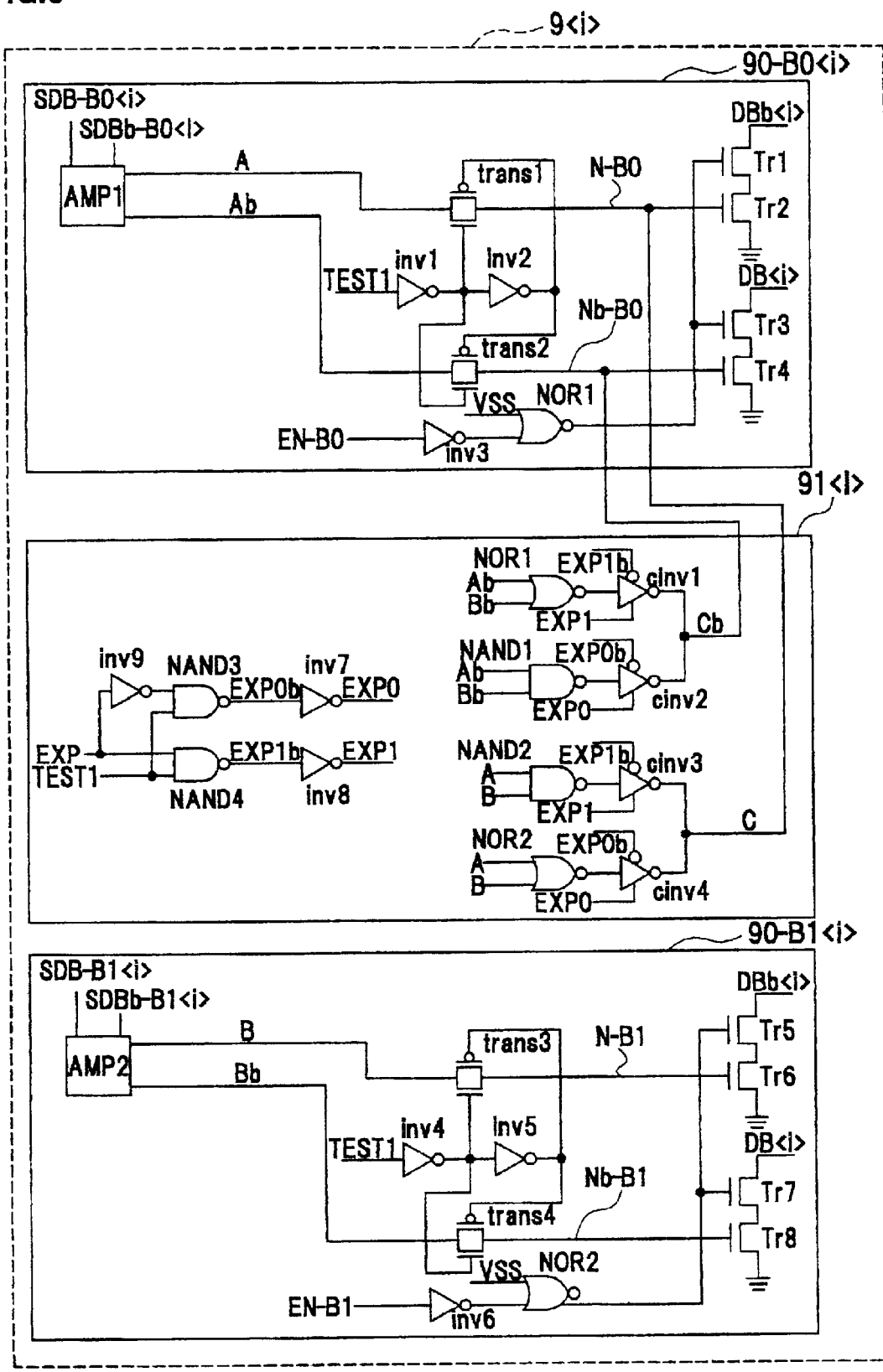
FIG. 8 shows circuit diagrams with respect to an EVEN read sense amplifier circuit, an ODD read sense amplifier circuit, and a judgement circuit in the read sense amplifier circuit portion as shown in FIG. 7.

FIG. 8 is circuit diagrams showing the EVEN read sense amplifier circuit 90-B0<i>, the ODD read sense amplifier circuit 90-B1<i>, and the judgement circuit 91<i> of the RSAMP circuit portion 9<i>. In this figure, the EVEN read sense amplifier circuit 90-B0<i> includes a read sense amplifier AMP1, inverter circuits inv1, inv2 and inv3, transfer gates trans1 and trans 2, a NOR circuit NOR1 of the 2-input type, and N-channel transistors Tr1, Tr2, Tr3 and Tr4.

The data of the EVEN subdata buses SDB-B0<i>, SDBb-B0<i> is amplified by the read sense amplifier AMP1, from which the amplified data A, Ab are outputted. The data A is inputted to the transfer gate trans1 while the data Ab is inputted to the transfer gate trans1. The data A, Ab are also outputted to the judgement circuit 91. The output of the transfer gate trans1 is connected with a node N-B0 while the output of the transfer gate trans2 is connected with a node Nb-B0. The node N-B0 is the gate of the N-channel transistor Tr2 while the node Nb-B0 is connected with the gate of the N-channel transistor Tr4.

The signal TEST1 is inputted to the inverter circuit inv1, of which the output is inputted to the inverter circuit inv2. The both outputs of inverter circuits inv1 and inv2 are inputted to transfer gates trans 1 and trans2, respectively. The EVEN transfer control signal EN-B0 is inputted to the inverter circuit inv3, of which the output is inputted to the NOR circuit NOR1 along with the ground level signal VSS. The output of the NOR circuit NOR1 is inputted to the both gates of transistors Tr1 and Tr3, respectively. The drain of the transistor Tr1 is connected with the data bus DBb<i> while the source of the transistor Tr1 is connected with the drain of the transistor Tr2, of which the source is connected with the ground. The drain of the transistor Tr3 is connected with the data bus DB<i> while the source of it is the drain of the transistor Tr4, of which the source is connected with the ground.

In the normal mode, transfer gates trans1 and trans2 are commonly opened, thereby the amplified data A, Ab of the EVEN subdata buses being outputted to the nodes N-B0 and Nb-B0. On one hand, in the test mode, transfer gates trans1 and trans2 are commonly closed and the judgement data C, Cb from the judgement circuit 91 are outputted to the nodes N-B0 and Nb-B0. Transistors Tr1 and Tr3 are turned ON/OFF according to signal formed from the EVEN transfer control signal EN-B0, thereby the amplified data A, Ab of the EVEN subdata or the judgement data C, Cb being outputted to the data buses DBb<i>, DB<i>.

In FIG. 8, the ODD read sense amplifier circuit 90-B1 <i> includes a read sense amplifier AMP2, inverter circuits inv4, inv5 and inv6, transfer gates trans 3 and trans4, NOR circuit of the 2-input type NOR2, and N-channel transistors Tr5, Tr6, Tr7 and Tr8.

The data of the ODD subdata buses SDB-B1<i>, SDBb-B1<i> are amplified by the read sense amplifier AMP2, from which the amplified data B and Bb are outputted. The data B is inputted to the transfer gate trans3 while the data Bb is inputted to the transfer gate trans4. The data B and Bb are also outputted to the judgement circuit 91. The output of the transfer gate trans3 is connected with the node N-B1 while the output of the transfer gate trans4 is connected with the node Nb-B1. The node N-B1 is connected with the gate of the transistor Tr6 while the node Nb-B1 is connected with the gate of the transistor Tr8.

The signal TEST1 is inputted to the inverter circuit inv4, of which the output is inputted to the inverter circuit inv5. The outputs of the inverter circuits inv4 and inv5 are outputted to the control terminals of the transfer gates trans3 and trans4, respectively. The ODD transfer control signal EN-B1 is inputted to the inverter inv6, of which the output is inputted to the NOR circuit NOR2 along with the signal TEST1. The output of the NOR circuit NOR2 is inputted to the transistors Tr5 and Tr7. The drain of the transistor Tr5 is connected with the data bus DBb<i> while the source of the same is connected with the drain of the transistor Tr6, of which the source is connected with the ground. The drain of the transistor Tr7 is connected with the data bus DB<i> while the source of the same is connected with the drain of the transistor Tr8, the source of which is connected with the ground.

In the normal mode, the transfer gates trans3 and trans4 are commonly opened, thereby the data B, Bb of the ODD subdata buses are outputted to the nodes N-B1 and Nb-B1. On one hand, in the test mode, the transfer gates trans3 and trans4 are commonly closed, thus no signal is supplied to the nodes N-B1 an Nb-B1. The transistors Tr5 and Tr7 are turned ON/OFF according to the logical signal as logically produced from the ODD transfer control signal EN-B1 and the signal TEST1 (i.e. the output signal of the NOR circuit NOR2), thereby the amplified data B and Bb of the ODD subdata buses being outputted to the data buses DB<i>, DBb<i>.

Furthermore, in FIG. 8, the judgement circuit 91<i> includes inverter circuits inv7, inv8 and inv9, NAND circuits of the 2-input type NAND1, NAND2, NAND3 and NAND4, NOR circuits of the 2-input type NOR1 and NOR2, and clock gate circuits cinv1, cinv2, cinv3 and cinv4.

After the data A and Ab of the EVEN subdata buses have been amplified by the EVEN read sense amplifier circuit 90-B0<i> and the data B and Bb of the ODD subdata buses have been amplified by the ODD read sense amplifier circuit 90-B1<i>, these amplified data A and B are inputted to the NAND circuit NAND2 and the NOR circuit NOR2, respectively, while the amplified Ab and Bb are inputted to the NAND circuit NAND1 and the NOR circuit NOR1, respectively. The outputs of the NAND circuit NAND1, the NOR circuit NOR1, the NAND circuit NAND2 and the NOR circuit NOR2 are inputted to clock gate circuits cinv1, cinv2, cinv3 and cinv4, respectively.

The expected value signal EXP from the expected value circuit 8 is inputted to the inverter circuit inv9, of which the output is inputted to the NAND circuit NAND3 together with the test signal TEST1. Furthermore, the expected value signal EXP and the test signal TEST1 are inputted to the NAND circuit NAND4. The output signal EXP0b from the NAND circuit NAND3 is inputted to the inverter circuit 7, from which the inverted signal EXP0 corresponding to the signal EXP0b is outputted. Furthermore, The output signal EXP0b from the NAND circuit NAND3 is inputted to the inverter circuit inv7, from which the inverted signal EXP0 corresponding to the signal EXP0b is outputted. The output signal EXP1b from the NAND circuit NAND4 is inputted to the inverter circuit inv8, from which the inverted signal EXP1 corresponding to the signal EXP1b is outputted.

The signals EXP1 and EXP1b are inputted to the control terminal of the clock gates cinv1 and cinv3, respectively, while the signals EXP0 and EXP0b are inputted to the control terminal of the clock gates cinv2 and cinv4, respectively. Each output terminal of the clock gates cinv1 and cinv2 is commonly connected with the node Nb-B0 of the EVEN read sense amplifier circuit 90-B0, while each output terminal of the clock gates cinv3 and cinv4 is commonly connected with the node N-B0 of the EVEN read sense amplifier circuit 90-B0.

To open and close the clock gates cinv1~cinv4 is controlled by signals EXP0, EXP0b, EXP1 and EXP1b which are produced in the inverter circuits inv7, inv8 and inv9 as well as in the NAND circuits NAND3 and NAND4 based on the expected value signal EXP and the signal TEST1.

In the test mode, the clock gate cinv2 is opened when the clock gate cinv1 is closed while the clock gate cinv2 is closed when the clock gate cinv1 is opened. The clock gate cinv4 is opened when the clock gate cinv3 is closed while the clock gate cinv4 is closed when the clock gate cinv3 is opened. Therefore, the output signal of either the NOR circuit NOR1 or the NAND circuit NAND1 becomes the judgement signal Cb, and the output signal of either the NOR circuit NOR2 or the NAND circuit NAND2 becomes the judgement signal C. These judgement data C and Cb are outputted to the nodes N-B0, Nb-B0 of the EVEN read sense amplifier circuit 90-B0<i>. In the normal mode, all the clock gates cinv1~cinv4 are closed.

Equalizer Circuit 10<i>

Figure 9:
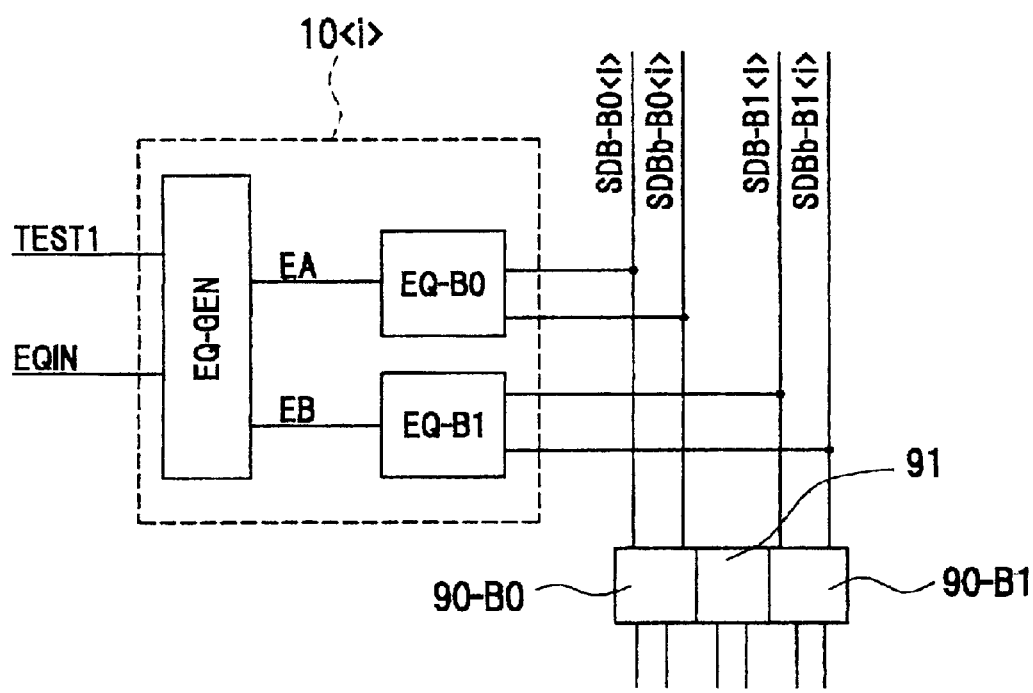
FIG. 9 is a indicating the configuration of an equalizer circuit in the semiconductor memory device as shown in FIG. 1.

Referring to FIG. 9, an equalizer circuit 10<i> includes an equalizing signal generation circuit EQ-GEN, an EVEN equalizer EQ-B0 and ODD equalizer EQ-B1.

The equalizing signal generation circuit EQ-GEN generates equalizing signal EA and EB according to the signals TEST1 and EQIN inputted thereto, and outputs the equalizing signals EA and EB to the EVEN equalizer EQ-B0 and the ODD equalizer EQ-B1, respectively. The above signal EQIN is a signal which may be produced in the semiconductor memory device as shown in FIG. 1, for instance, base on the aforementioned signal BUS.

The EVEN equalizer EQ-B0 equalizes the EVEN subdata buses SDB-B0<i>, SDBb-B0<i> according to the equalizing signal EA as inputted thereto, while the ODD equalizer EQ-B1 equalizes the ODD subdata buses SDB-B1<i>, SDBb-B1<i> according to the equalizing signal EB inputted thereto. This equalizing operation is the operation for making two subdata buses of the subdata bus pair be commonly at the level of (internal voltage-Vt). This (internal voltage) is equivalent to the data of "H," and the Vt is the threshold voltage of MOS transistors which constitute the output stages of the equalizers EQ-B0 and EQ-B1.

Read Amplifier Circuit 11 <i>

A read amplifier circuit 11<i> amplifies the data as outputted from the RSAMP circuit portion 9<i> to the data buses DB<i>, DBb<i>, and then converts the amplified data into the output data Dout of which the reference level is the ground or the internal voltage, and finally outputs it to an output buffer circuit 12<i>.

Output Buffer Circuit 12<i>

The output buffer circuit 12<i> outputs the data as inputted from the read amplifier circuit 11<i> to an data I/O pin DQ<i>.

The data read operation in the semiconductor memory device according to the first embodiment will now be described in the following with reference to timing charts indicated in FIG. 10. The figure includes two timing chart for column selection in the above semiconductor memory device, (a) being the timing chart in the normal mode operation and (b) being the timing chart in the test mode operation (parallel test). This FIG. 10 shows the timing chart at the time when the Y-address data AY addressing the Y-address #000 is inputted. Here, let us assume that the Y-address #000 is the Y-address of the block A. In FIG. 10, an abbreviation "CLK" stands for a clock signal externally inputted to the semiconductor memory device. FIG. 11 is also a timing chart relating to the equalizer circuit 10<i>, (a) being the timing chart in the normal mode operation and (b) being the same in the test mode operation. Furthermore, FIG. 12 is a truth table for explaining the operation of the expected value circuit 8 and the RSAMP circuit portion 9<i> in the parallel test.

Normal Mode Operation

Figure 10A:
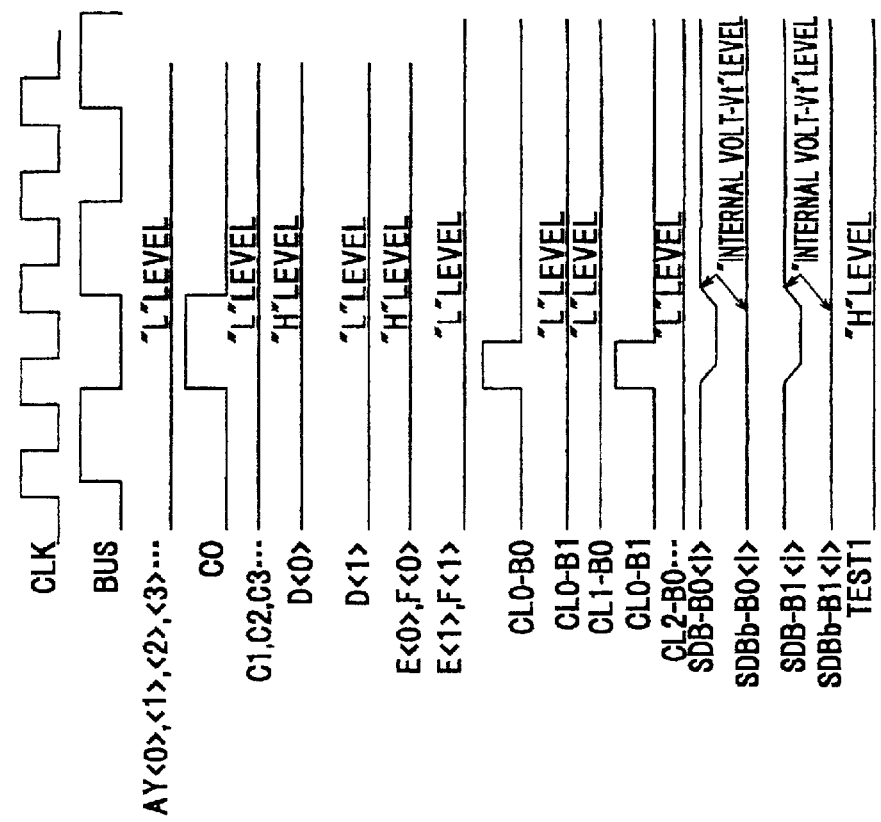
FIG. 10 shows timing charts describing the timing of column selection in the semiconductor memory device as shown in FIG. 1.

To begin with, let us consider when the signal TEST1 is "L" (low level). At this time, the operation becomes the normal mode operation. If the Y-address data AY of the Y-address #000 is inputted, the decode signal C0 from among the decode signals C0~Cm becomes "H" (high level) by the decode circuit 41<0> as indicated in FIG. 10(a), in other words, the decode signal C0 is activated by the decode circuit 41<0> in the Y-decode circuit 4 (see FIG. 3).

Also, signals E<0> and F<0> from among signals E<0>, E<1>, F<0> and F<1> become "H" by the Y-degeneration control circuit 2. Here, the above signals E<0>, E<1>, F<0> and F<1> are signals having the following functions. That is, the signal E<0> is a signal having the function of activating a column signal CL0-B0, the signal E<1> is a signal having the function of activating a column signal CL0-B1, the signal F<0> is a signal having the function of activating a column signal CL1-B0, and the signal F<1> is a signal having the function of activating a column signal CL1-B1.

Also, a signal D<0> of signals D<0> and D<1> becomes "H" by the BUSDRV circuit 3. The signal D<0> is a signal having the function of activating column signals CL0-B0 and CL1-B1 while the signal D<1> is a signal having the function of activating column signals CL0-B1 and CL1-B0.

Like this, if the decode signal C0 and the signal D<0> become "H," the signal E<0> becomes "H," and the signal F<1> becomes "L," only the column signal CL0-B0 becomes "H" by the Y-driver circuit 42<0> in the Y-decode circuit 4.

When the column signal CL0-B0 becomes "H," the sense amplifier SA0<i> of Y-address #000 (see FIG. 5) in the sense amplifier circuit 6-A (see FIG. 4) transfers the data to the EVEN subdata buses SDB-B0<i>, SDBb-B0<i>, the above data being outputted to the bit line BL0<i>, BLb0<i> from the memory cell MCL of the Y-address #000 selected from memory cells of word lines WL0~WLn by the word line of the X-address data.

Like this, in the normal mode operation, that is, when the signal TEST1 is "L," only one column of one Y-address is selected according to the Y-address data AY and the data of that Y-address is read out to the EVEN subdata buses or the ODD subdata buses.

When transferring the above data to the EVEN subdata buses SDB-B0<i>, SDBb-B0<i> of the block A, the switch circuit 7<i> connects, according to the signal BSL, these EVEN subdata buses SDB-B0<i>, SDBb-B0<i> of the block A with the EVEN read sense amplifier circuit 90-B0<i> of the RSAMP circuit portion 9<i>, and also connects the ODD subdata buses SDB-B1<i>, SDBb-B1<i> with the ODD read sense amplifier circuit 90-B1 <i> of the RSAMP circuit portion 9<i>. With this, the above data transferred to the EVEN subdata buses SDB-B0<i>, SDBb-B0<i> is inputted to the EVEN read sense amplifier circuit 90-B0<i>.

Figure 11B:
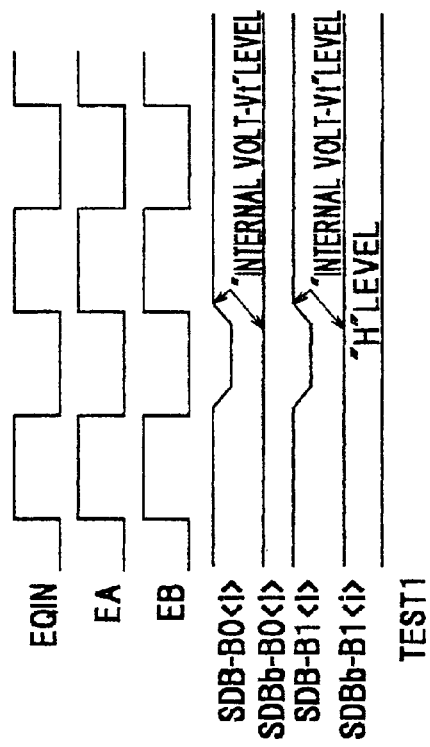
FIG. 11 shows timing charts of the equalizer circuit as shown in FIG. 9.
Figure 11A:
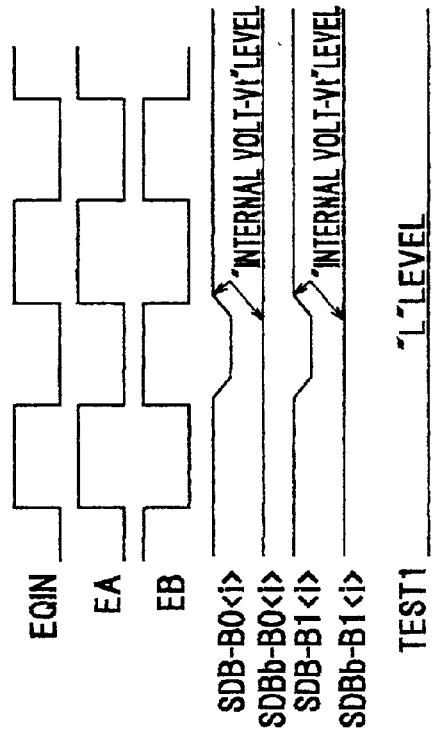

In this normal mode operation, the equalizer circuit 10<i> (see FIG. 9) generates equalizing signals EA and EB by means of the equalizing signal generation circuit EQ-GEN, the phase of signals EA and EB being made opposite to each other as shown in FIG. 11(a). Accordingly, when the above data is transferred to the EVEN subdata buses SDB-B0<i>, SDBb-B0<i>, the equalizing signal EA becomes "L" while the equalizing signal EB becomes "H," and the ODD subdata buses SDB-B1 <i>, SDBb-B1<i> are equalized to (internal voltage-Vt) by means of the ODD equalizer EQ-B1.

In the EVEN read sense amplifier circuit 90-B0<i> (see FIG. 8), the above data is amplified with the read sense amplifier AMP1 and the amplified data A and Ab are inputted to the gate of transistors Tr2 and Tr4, respectively, via the transfer gates trans1 and trans2, and the nodes N-B0 and N-Bb. At this time, if the signal EN-B0 becomes "H," the output of the NOR circuit NOR1 of the 2-input type becomes "H," so that the transistors Tr1 and Tr3 are turned ON, the above data A and Ab are transmitted to the data buses DB<i>, DBb<i>.

When the signal EN-B0 is "H," the signal EN-B1 becomes "L." In the ODD read sense amplifier circuit 90-B1<i>, if the signal EN-B1 becomes "L," the output of the NOR circuit NOR2 of the 2-input type becomes "L" because the signal TEST1 is "L," so that the transistor Tr5 and Tr7 are turned OFF. At this time, as the signal TEST 1 is "L," the signals EXP0b and EXP1b become commonly "H" and the signals EXP0 and EXP1 become commonly "L," so that all the clock gates cinv1~cinv4 are closed.

The read-out data transmitted to the data buses DB<i>, DBb<i> is amplified by the read sense amplifier circuit 11<i> and at the same time, converted into the output data Dout, and is outputted to the data I/O pin DQ<i> through the output buffer 12<i>.

Test Mode Operation

Figure 10B:
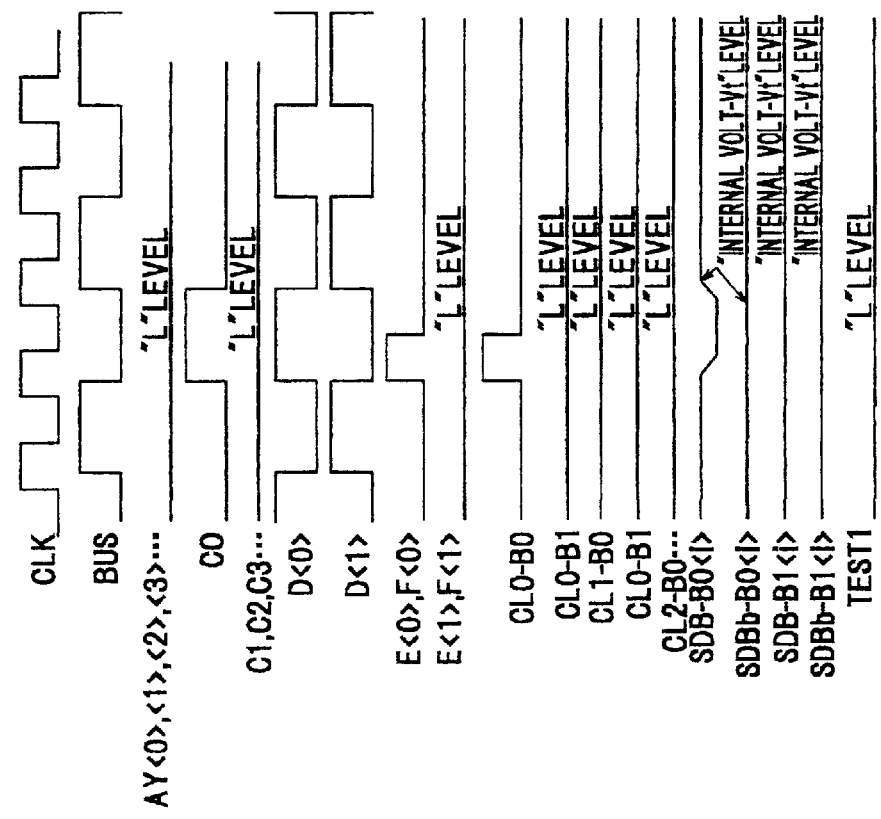

When the signal TEST1 is "H," the operation is carried out in the test mode. As shown in FIG. 10(b), in the test mode, the signals E<0> and F<0> are fixed to "H" by the Y-degenerate control circuit 2 while the signals E<1> and F<1> are fixed to "L" by the Y-degenerate control circuit 2. Like this, in the test mode operation where the signals E<0> and F<0> are fixed, if the Y-address data AY of the Y-address #000 or #001 is inputted, the data of Y-address #000 is read out to the EVEN subdata buses while the data of Y-address #001 is read out to the ODD subdata bus. To the contrary, in the test mode operation where the signals E<1> and F<1> are fixed, if the Y-address data AY of the Y-address #000 or #001 is inputted, the data of Y-address #000 is read out to the ODD subdata buses while the data of Y-address #001 is read out to the EVEN subdata bus. Furthermore, in the test mode operation, the signal D<0> is fixed by means of the BUS-DRV circuit 3 while the signal D<1> is fixed by means of the same.

If the Y-address data AY of Y-address #000 or #001 is inputted, the decode signal C0 from among decode signals C0~Cm is made to be "H" by means of the decode circuit 41<0> of the Y-decode circuit 4 (see FIG. 3). The Y-address data AY<0:k+1> of the Y-address #000 and #001 are different from one another with respect to only the least significant bit AY<0> but are identical to one another with respect to all the other bits AY<1:k+1>.

Like this, if the decode signal C0 and the signal D<0> become "H", and the signal E<0> and F<0> commonly become "H", the column signals CL0-B0 and CL1-B1 are made to be "H" at the same time by the V-driver circuit 42<0> of the Y-decode circuit 4.

When the column signals CL0-B0 and CL1-B1 become "H," the sense amplifier circuit SA0<i> of Y-address #000 in the sense amplifier circuit portion 6-A (see FIG. 4) transfers the data to the EVEN subdata buses SDB-B0<i>, SDBb-B0<i>, the data being that which is outputted to the bit line BL0<i>, BLb0<i> from the memory cell of Y-address #000 selected by the word line. On one hand, the sense amplifier circuit SA1<i> of Y-address #001 in the above sense amplifier circuit portion 6-A transfers the data to the ODD subdata buses SDB-B1<i>, SDBb-B1<i>, the data being that which is outputted to the bit line BL1<i>, BLb1<i> from the memory cell of Y-address #000 selected by the above word line.

As described above, in the test mode where the signal TEST1 is "H," two columns are simultaneously selected, one being the column of the Y-address of the Y-address data AY and the other being the column of the Y-address which is subject to the degenerate substitution along with the above Y-address in the column redundant substitution, and two data of these two addresses are simultaneously read out to the EVEN subdata buses as well as to the ODD subdata bus.

When the data of the Y-address #000 is transferred to the EVEN subdata buses SDB-B0<i>, SDBb-B0<i> of the block A and at the same time, the data of the Y-address #001 is transferred to the ODD subdata buses SDB-B1<i>, SDBb-B1<i> of the block A, the switch circuit 7<i> connects the EVEN subdata buses SDB-B0<i>, SDBb-B0<i> of the block A with the EVEN read sense amplifier circuit 90-B0<i> of the RSAMP circuit portion 9<i> and also connects the ODD subdata buses SDB-B1<i>, SDBb-B1<i> with the ODD read sense amplifier circuit 90-B1<i> of the RSAMP circuit portion 9<i>. With this, the data of Y-address #000 transferred to the EVEN subdata buses SDB-B0<i>, SDBb-B0<i> of the block A is inputted to the EVEN read sense amplifier circuit 90-B0<i>, while the data of Y-address #001 transferred to the ODD subdata buses SDB-B1<i>, SDBb-B1<i> is inputted to the ODD read sense amplifier circuit 90-B1-<i>.

In this test mode operation, the equalizer circuit 10<i> (see FIG. 9) generates, as shown by FIG. 11(b), equalizing signals EA and EB with the phase identical to each other by means of the equalizing signal generation circuit EQ-GEN.

When the data of Y-address #000 is transferred to the EVEN subdata buses SDB-B0<i>, SDBb-B0<i> and at the same time, the data of Y-address #001 is transferred to the ODD subdata buses SDB-B1<i>, SDBb-B1<i>, the equalizing signals EA and EB commonly becomes "L." With this, the EVEN subdata buses and the ODD subdata buses are able to transfer, without equalizing either of them, the data of Y-address #000 and the data of Y-address #001 to the EVEN read sense amplifier circuit 90-B0<i> and the ODD read sense amplifier circuit 90-B1<i>, respectively.

In the EVEN read sense amplifier circuit 90-B0<i> (see FIG. 8), the above data of Y-address #000 is amplified by the read sense amplifier AMP1 and the amplified data A and Ab are inputted to the NAND circuit of the 2-input type NAND1, NAND2 and the NOR circuit of the 2-input type NOR1, NOR2 of the judgement circuit 91<i>. At this time, the transfer gates trans1 and trans2 are closed, so that the data B and Bb are not allowed to be transmitted to the nodes N-B1 and Nb-B1.

Furthermore, in the ODD read sense amplifier circuit 90-B1<i>, the data of the above Y-address #001 is amplified by the read sense amplifier AMP2 and the amplified data B and Bb are inputted to the NAND circuit of the 2-input type NAND1, NAND2 and the NOR circuit of the 2-input type NOR1, NOR2 of the judgement circuit 91<i>. At this time, the transfer gates trans3 and trans4 are closed, so that the data B and Bb are not allowed to be transmitted to the nodes N-B1 and Nb-B1. Furthermore, as the signal TEST1 is "H", the output of the NOR circuit NOR2 of the 2-input type is fixed to "L", the transistors Tr5 and Tr7 are kept in the OFF state, and the ODD read sense amplifier circuit 90-B1<i> is in the state separated from the data buses DB<i>, DBb<i>, so that the data of nodes N-B1, Nb-B1 can not be transmitted to the data buses DB<i>, DBb<i>.

In the parallel test of the degenerate Y-address, the value of the data written to the memory cell (i.e. the expected value of the correct read data) is inputted to the semiconductor memory device with the least significant bit AY<0>. As the signal TEST1 is "H", the expectation signal EXP A<0> is generated in the expected value 8(see FIG. 6) and is then transferred to the judgement circuit 91<i>.

Here, let us add some definitions with regard to the digital level of the reference characters appearing on the truth table of FIG. 12 and representing various data and signals, for easy and better understanding the table and the description related thereto. In the figure, the AY<0> is defined as "H" when the written data is "1" while AY<0> is defined as "L" when the written data is "0." The expectation value signal EXP is defined as "H" in the parallel test of the expected value "1" while the expected value signal EXP is defined as "L" in the parallel test of the expected value "1." When the data "1" written to the memory cell has been correctly read out, the subdata bus SDB-B0<i> or SDB-B1<i> is defined as "H," the subdata bus SDBb-B0<i> or SDBb-B1<i> is defined as "L," the data A or B is defined as "H" and the data Ab or Bb is defined as "L." Also, when the data "0" written to the memory cell has been correctly read out, the subdata bus SDB-B0<i> or SDB-B1<i> is defined as "L," the subdata bus SDBb-B0<i> or SDBb-B1<i> is defined as "H," the data A or B is defined as "L" and the data Ab or Bb is defined as "H."

The judgement circuit 91<i> (see FIG. 8) judges if the data A and B as read from the memory cell of Y-address #000 are correct or not, and also judges if the data B and Bb as read from the memory cell of Y-address #001 are correct or not, according to the expected value signal EXP as inputted from the expected value circuit 8.

As shown in FIG. 12, when the expected value is "1" (i.e. AY<0> and EXP are commonly "H"), the signals EXP0 and EXP1b become commonly "L" and the signals EXP0b and EXP1 become commonly "H" in the judgement circuit 91<i>, so that the clock gates cinv1 and cinv3 are opened, but the clock gates cinv2 and cinv4 are kept in the closed state. With this, the judgement data C and Cb become "H" and "L," respectively, only when the read data of Y-address #000 is "1" (data A="H," Ab="L") and the read data of Y-address #001 is "1" (data B="H," Bb="L"). On one hand, the judgement data C and Cb become "H" and "L," respectively, when the read data of Y-address #000 is "0" (data A="L," Ab="H") and the read data of Y-address #001 is "1" (data B="H," Bb="L"), when the read data of Y-address #000 is "1" (data A="H," Ab="1") and the read data of Y-address #001 is "0" (data B="L," Bb="H"), and when the read data of Y-addresses #000 and #001 are commonly "0."

Furthermore, as shown in FIG. 12, when the expected value is "0," the signals EXP0 and EXP1 become "H" and the signals EXP0b and EXP1 become "L" in the judgement circuit 91<i>, thereby the clock gates cinv2 and cinv4 are opened while the clock gates cinv1 and cinv3 are kept in the closed state. With this, the judgement data C and Cb become "L" and "H," respectively, only when the read data of Y-address #000 is "0" (data A="L," Ab="H") and the read data of Y-address #001 is "0" (data B="L," Bb="H"). On one hand, the judgement data C and Cb become "H" and "L," respectively, when the read data of Y-address #000 is "1" (data A="H," Ab="L"), when the read data of Y-address #001 is "1" (data B="H," Bb="L"), and when the read data of Y-addresses #000 and #001 are commonly "1."

Like this, the judgement circuit 91<i> determines that the result of the parallel test is normal only when two read data are commonly equal to the expected value, and then, it outputs the judgement data C=EXP and Cb=EXP (i.e. inverted data of EXP). On one hand, the judgement circuit 90<i> determines that two data include the error, thus the result of the parallel test being abnormal, if both of two read data are different from the expected value or are different from each other, and then, it outputs the judgement data C=rEXP and Cb=EXP.

The judgement data C and Cb generated by the judgement circuit 91<i> are transmitted to the EVEN read sense amplifier circuit 90-B0<i> and then inputted to the transistors Tr2 and Tr4 through the nodes N-B0 and Nb-B0. Then, if the signal EN-B0 becomes "H," the NOR circuit of the 2-input type NOR1 becomes "H," so the transistors Tr1 and Tr3 are turned on, thus the above judgement data C and Cb are transmitted to the data buses DBb<i>, DB<i>.

When the judgement data C and Cb are transmitted from the judgement circuit 91<i> to the nodes N-B0 and Nb-B0 of the EVEN read sense amplifier circuit 90-B0<i>, the transfer gate trans1 and trans2 are closed, so that there is no chance for the read data A outputted from the read sense amplifier AMP1 to collide with the judgement data C and Cb. On one hand, when the judgement data C and Cb are transmitted from the EVEN read sense amplifier circuit 90-B0<i> to the data buses DBb<i>, DB<i>, the transfer gates trans3 and trans4 of the ODD read sense amplifier circuit 90-B1<i> are closed, so that the transistors Tr5 and Tr7 are fixed to the OFF state. With this, the ODD read sense amplifier 90-B1 are fixed inactive state, so that the read data B and Bb as outputted from the read sense amplifier AMP1 are made to be transmitted to neither the data bus DBb<i> nor the data bus DB<i>.

The judgement data transmitted to the data buses DB<i>, DBb<i> are amplified and then converted into the output data Dout by means of the read amplifier circuit 11<i> to be outputted to the data I/O pin DQ<i> via the output buffer 12<i>.

In the FIG. 12, if the result of the parallel test carried out with the expected value signal of "H" is normal and the judgement data C and Cb are "H" and "L," respectively, the data buses DB<i>, DBb<i> become "H" and "L," respectively, and the data Dout of "H" is outputted to the data I/O pin DQ<i>. To the contrary, if the result of the above parallel test is abnormal and the judgement data C and Cb are "L" and "H," respectively, the data buses DB<i>, DBb<i> become "L" and "H" and the data Dout of "L" is outputted to the data I/O pin DQ<i>.

Also, in the FIG. 12, if the result of the parallel test carried out with the expected value signal of "L" is normal and the judgement data C and Cb are "L" and "H," respectively, the data buses DB<i>, DBb<i> become "L" and "H," respectively, and the data Dout of "L" is outputted to the data I/O pin DQ<i>. To the contrary, if the result of the above parallel test is abnormal and the judgement data C and Cb are "H" and "L," respectively, the data buses DB<i>, DBb<i> become "H" and "L" and the data Dout of "H" is outputted to the data I/O pin DQ<i>.(105)

As described above, if the result of the parallel test is normal, the data buses DB<i>, DBb<i> become EXP and rEXP (i.e. inverted data of EXP), respectively, and the data equal to the expected value (i.e. data equal to AY<0> and the EXP) is outputted to the data I/O pin DQ<i>. To the contrary, if the result of the parallel test is abnormal, the data buses DB<i>, DBb<i> become rEXP and EXP, respectively, and the data opposite to the expected value (i.e. data opposite to AY<0> and the EXP) is outputted to the data I/O pin DQ<i>.

In the test mode, it is possible to use such a configuration that the judgement data C and Cb are outputted to the data bus pair DBP<i> through the ODD read sense amplifier circuit 90-B1 <i>. In the configuration like this, however, each logical level of the EN-B0 and EN-B1 is inverted in the truth table of FIG. 12, respectively, and as shown in FIG. 8, the signal TEST1 is inputted to the NOR1 of the EVEN read sense amplifier circuit 90-B0<i> while the signal VSS (signal of the ground level) is inputted to the NOR2 of the ODD read sense amplifier circuit 90-B1 <i>.

The parallel test of the degenerate Y-address in the first embodiment is applicable to the parallel test including the column redundant substitution, in which the memory cell of the degenerate Y-address as judged to be abnormal is replaced by the redundant memory cell portion according to the steps as described with reference to FIG. 36. Because a plurality of Y-addresses made to be degenerate in the parallel test are a plurality of Y-addresses (columns) in the same block to be substituted by the degenerate substitution in the column redundant substitution.(108)

The semiconductor memory device according to the first embodiment is characterized by the seven points as described in the following.

First Feature: Degenerate Y-Address Parallel TEST

The first feature of the semiconductor memory device according to the first embodiment is that a plurality of columns to be substituted by the degenerate substitution in the column redundant substitution are simultaneously activated, and the data are read out from a plurality of memories selected by the above activated columns, thereby executing the parallel test with respect to a plurality of the degenerate Y-addresses to be substituted by the degenerate substitution.

Figure 13:
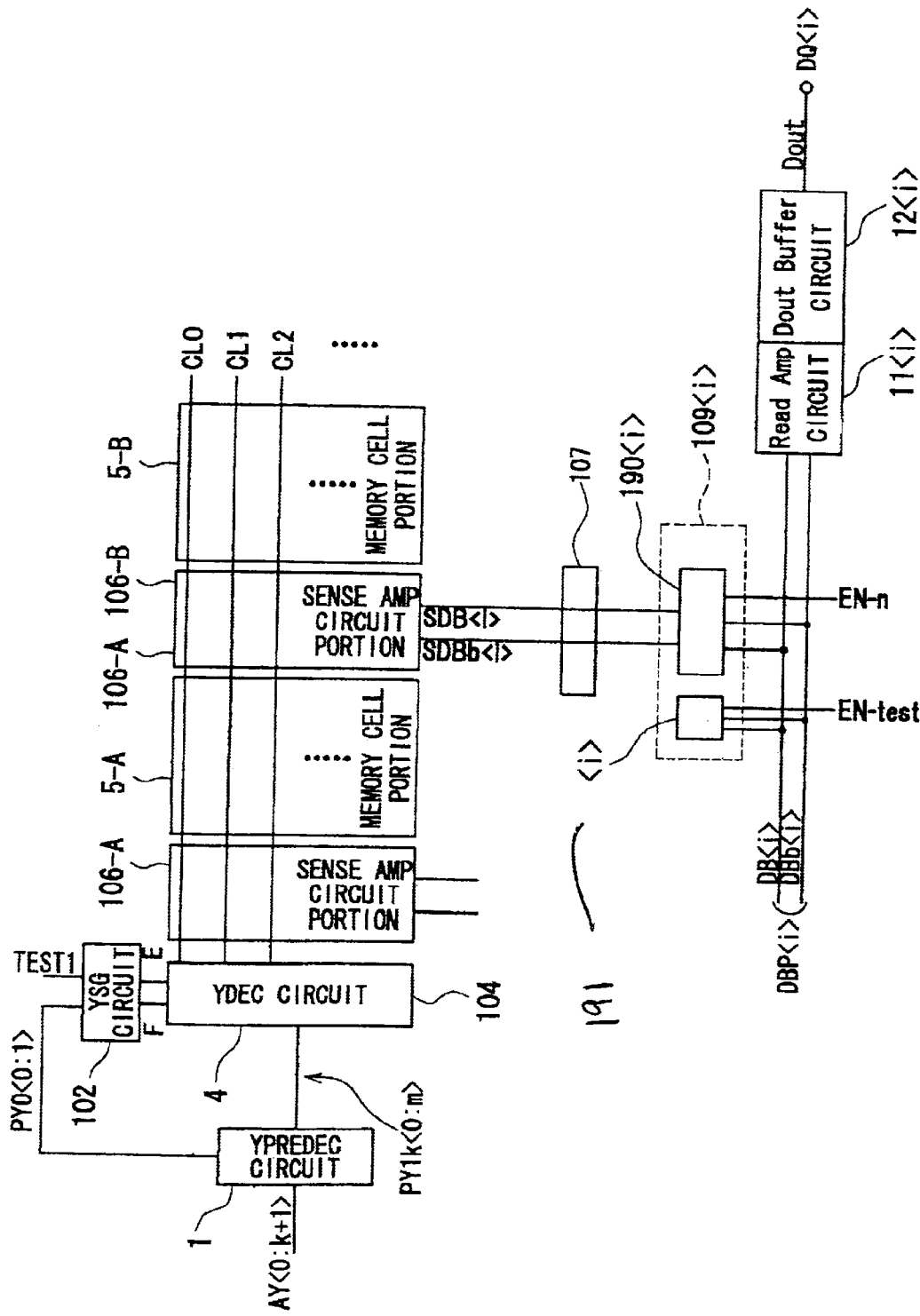
FIG. 13 is a diagram indicating the configuration of the semiconductor memory device for use in explanation of the first feature of the first embodiment.

FIG. 13 is a diagram showing the configuration of the semiconductor memory device for explaining the first feature thereof. In this figure, like parts as indicated in FIGS. 1 through 9 are indicated with like reference numerals, signs and characters. The semiconductor memory device shown in this figure may be obtained base on the semiconductor memory device according to the first embodiment as shown in FIG. 2, that is, by first deleting the bus drive circuit 3, the expected value circuit 8, and the equalizer circuit 10<i>, secondarily changing the Y-degenerate control circuit 2, the Y-decode circuit 4, the sense amplifier circuits 6<i>-A and 6<i>-B, the switch circuit 7<i>, the RSAMP circuit portion 9<i>, and the equalizer circuit 10<i> to a Y-degenerate control (YSG) circuit 102, a Y-decode (YDEC) circuit 104, a sense amplifier circuit portions 106<i>-A and 106<i>-B, a switch circuit 107, and a RSAMP circuit portion 109<i>, and thirdly deleting the ODD subdata bus pair SDBP-B1<i> and constituting the EVEN subdata pair SDBP-B0<i> as a subdata bus pair SDBP<i>. In the parallel test in the semiconductor memory device of FIG. 13, it is assumed that the same data is written to all the memory cells thereof.

Figure 14:
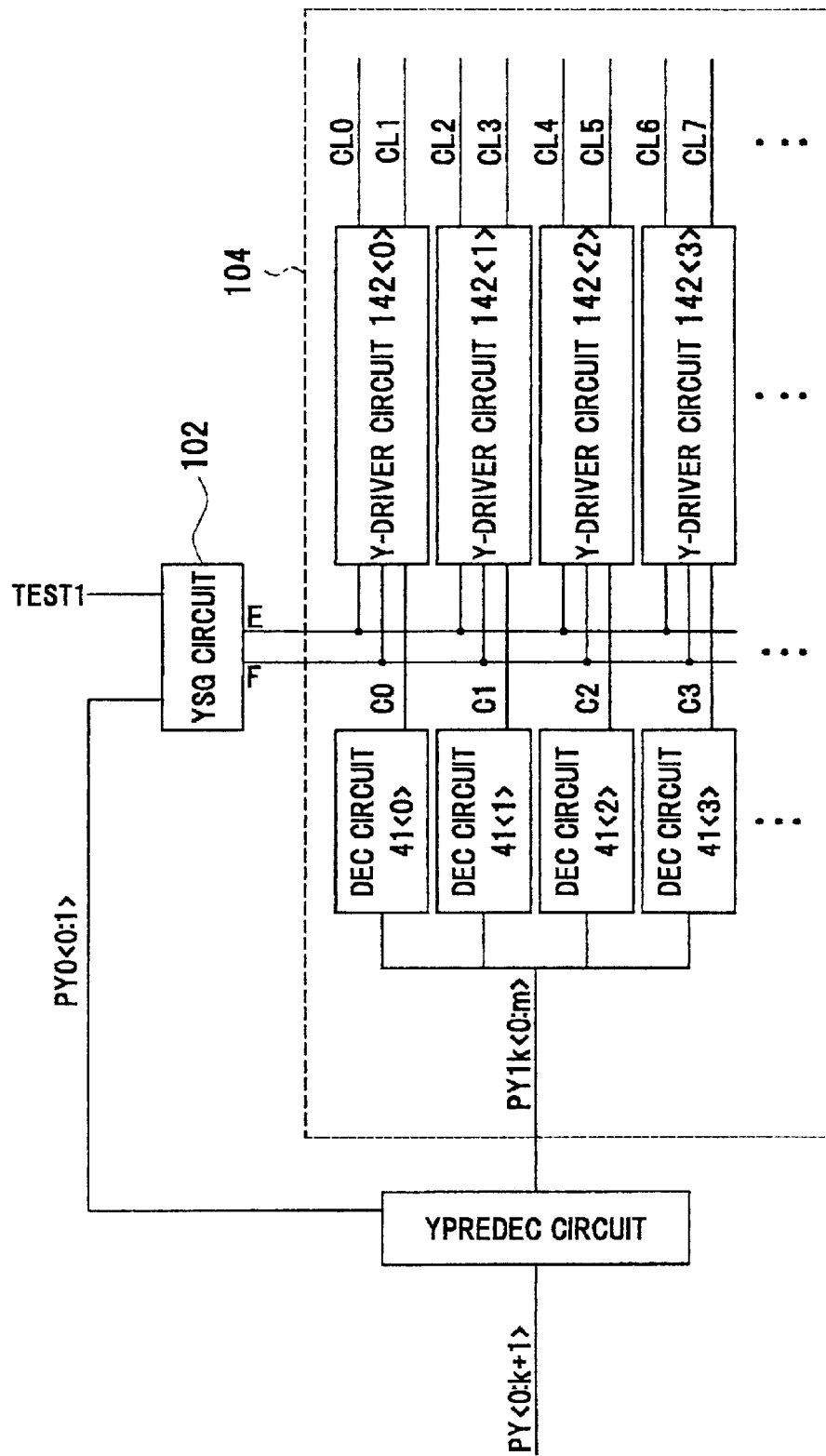
FIG. 14 is a diagram showing the configuration of the Y-decoder circuit and peripheral circuit thereof in the semiconductor memory device as shown in FIG. 13.

FIG. 14 is a diagram showing the constitution of a Y-decode circuit 104 and peripheral circuits thereof of the semiconductor memory device as shown in FIG. 13. In FIG. 14, like parts shown in FIGS. 1 through 3 are designated with like reference numerals, signs and characters. In FIG. 14, the Y-degenerate control circuit 102 generates signals E and F according to the signals PY0<0:1> and TEST1 inputted thereto and outputs the generated signals E and F to the Y-decode circuit. The Y-decode circuit 104 includes decode (DEC) circuits 41<0>, 41<1>, 41<2>, 41<3>, ..., 41<m>, and Y-driver circuits 142<0>, 142<1>, 142<2>, 142<3>, ..., 142<m>as well. (112)

The signals E and F generated by the Y-degenerate control circuit 102 are inputted to the Y-river circuits 142<0>~142<m>. Furthermore, to the Y-driver circuits 142<0>, 142<1>, 142<2>, 142<3>, ..., 142<m>, there are inputted the signals C0, C1, C2, C3, ..., Cm which are generated by the decode circuits 41<0>, 41<1>, 41<2>, 41<3>, ..., 41<m>, respectively. The Y-driver circuits 142<0>~142<m> generates the column signals CL0, CL1, ...,CL7, ..., CLm according to the signals inputted thereto.

Figure 15:
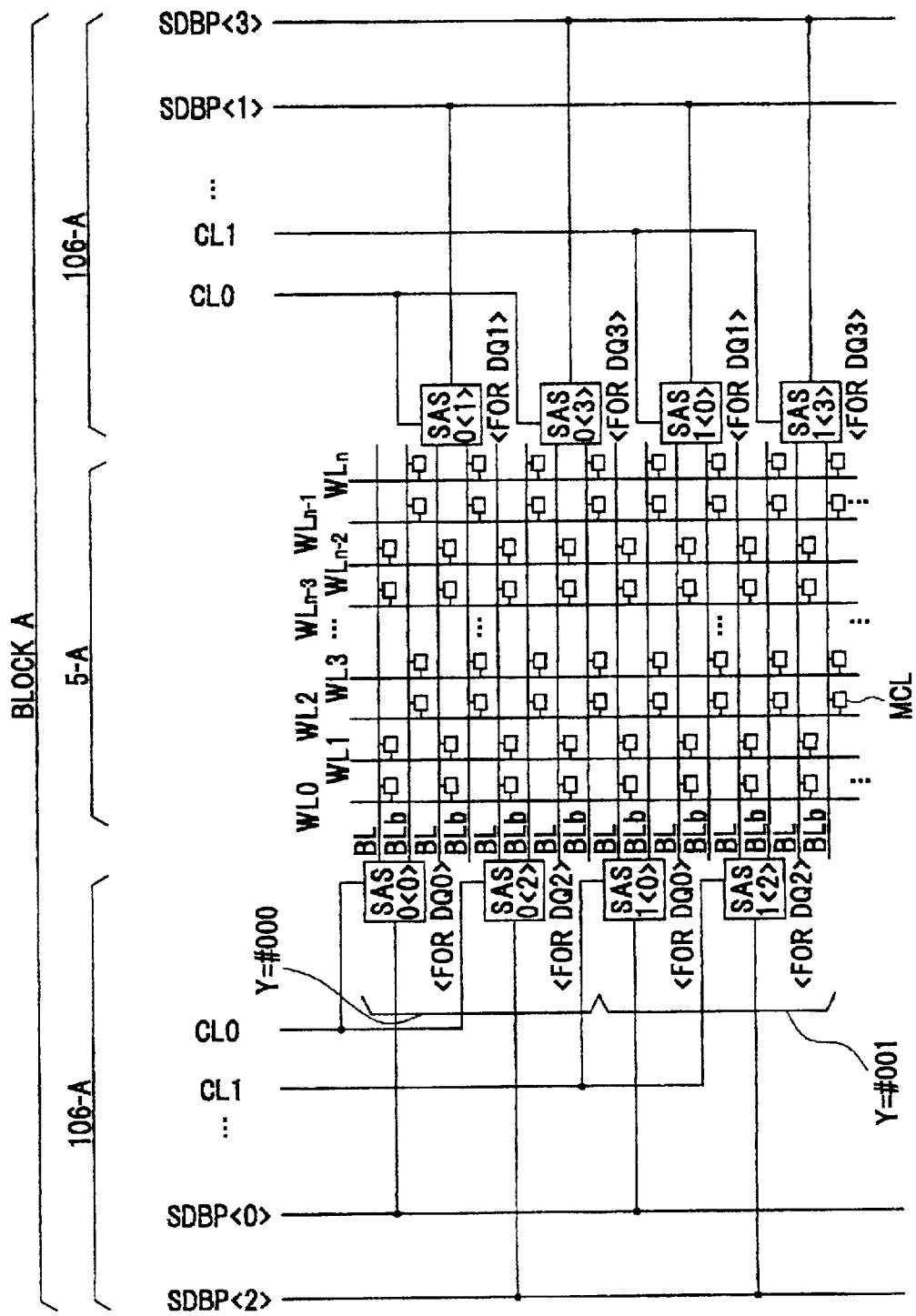
FIG. 15 is a diagram showing the configuration of the sense amplifier circuit portion in the semiconductor memory device as shown in FIG. 13.

FIG. 15 is a diagram showing the constitution of the sense amplifier circuit portion 106-A of the semiconductor memory device as shown in FIG. 13, wherein like parts in FIG. 4 is indicated by like reference numerals, signs and characters. The sense amplifier circuit portion 106-B of the block B has the same constitution as that (106-A) of the block A. The sense amplifier circuit portion 106 is obtained by changing the sense amplifier circuits SA0<i>, SA1<i>, ..., SAm<i> of the sense amplifier circuit portion 6-A shown in FIG. 4 to the sense amplifier circuits SAS0<i>, SAS1<i>, ...,SAm<i>, and connecting these sense amplifier circuits SAS0<i>~SAm<i>with the subdata pair SDBP<i>. To the sense amplifier circuits SAS0<i>, SAS1<i>, . . . ,SAm<i> are the column signals CL0, CL1, ..., CLm inputted, respectively.

Figure 16:
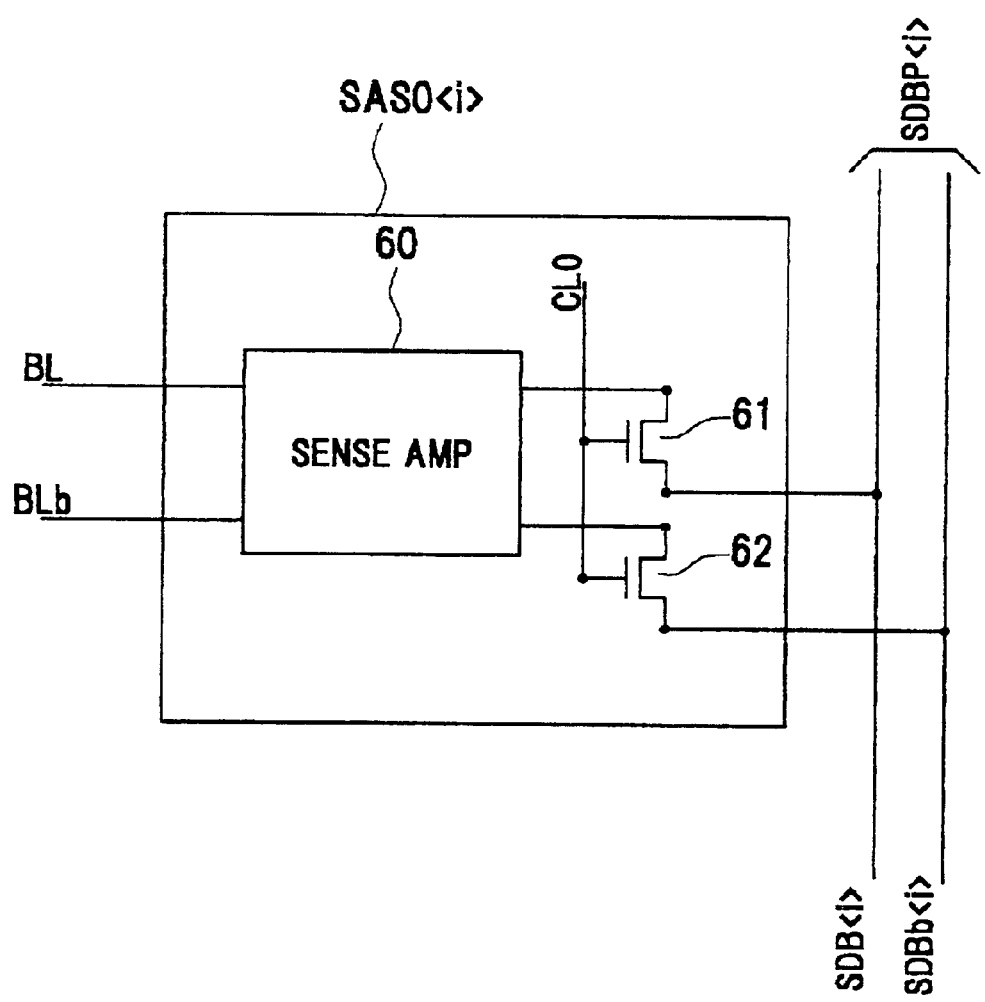
FIG. 16 is a circuit diagram of the sense amplifier circuit in the sense amplifier circuit portion as shown in FIG. 13.

FIG. 16 is a circuit diagram showing the sense amplifier circuit SAS0<i> as shown in FIG. 15. Like parts as used in FIG. 5 are designated with like reference numeral, signs and characters. The sense amplifier circuit SAS0<i> of FIG. 16 is obtained by deleting transistors 63 and 64 of the sense amplifier circuit SA0<i> in FIG. 5 and inserting transistors 61 and 62 between nodes 61, 62 and subdata buses SDB<i>, SDBb<i>. The column signal CL0 is inputted to each gate of the transistors 61 and 62.

The switch circuit 107 connects the RSAMP circuit portion 109<i> with either the subdata bus pair SDBP-B0<i> arranged in the block A or the subdata bus pair SDBP-B0<i> arranged in the block B according to the signal BSL as inputted.

Referring to FIG. 13, the RSAMP circuit portion 109<i> includes the read sense amplifier circuit 190<i> and the judgement circuit 191 <i>. The data transmission between the read sense amplifier circuit 190<i> and the data buses DB<i>, DBb<i> is controlled by the signal EN-n while the data transmission between the judgement circuit 191<i> and the data buses DB<i>, DBb<i> is controlled by the signal EN-test. These signals EN-n and EN-test may be generated in the semiconductor memory device of FIG. 13 by using the above signals BUS and TEST1, for instance. In the normal mode operation, the signal EN-n controls the data transmission timing between the read sense amplifier circuit 190<i> and the data buses DB<i>, DBb<i>, while in the test mode operation, it works as the signal for fixing the read sense amplifier circuit 190-B1<i> to the inactive state. On the other hand, in the normal mode operation, the signal EN-test fixes the judgement circuit 191<i> to the inactive state, while in the normal mode, it works as a signal for controlling the data transmission timing between the judgement circuit 191<i> and the data buses DB<i>, DBb<i>.

In the normal mode operation, the read sense amplifier circuit 190<i> amplifies the data read out from the memory cell to the subdata bus pair SDBP<i> and outputs the amplified data to the data bus pair DBP<i>, while in the test mode operation, it amplifies the data as read out to the subdata bus pair SDBP<i> and outputs the amplified data to the judgement circuit 191. The judgement circuit 191<i> judges the read data inputted from the read sense amplifier circuit 190<i> and outputs the judgement data to the data bus pair DBP<i>.

In the parallel test of the degenerate X-address in the prior art semiconductor memory device, the data of two memory cells of two degenerate X-addresses were simultaneously read out to the same data buses DB<i>, DBb<i>. Similar to this, in the parallel test of the degenerate Y-address in the semiconductor memory device of FIG. 13, the data of two memory cells of two degenerate Y-addresses are simultaneously read out to two subdata buses SDB<i>, SDBb<i>. For this, the same data are written to all the memory cells, so that if the subdata buses SDB<i>, SDBb<i> are precharged, SDB<i>, SDBb<i> become "H" and "L," respectively, or SDB<i>, SDBb<i> become "L" and "H," respectively, as far as two data as simultaneously read out are commonly correct. If either of two data as read simultaneously is faulty, the subdata buses SDB<i>, SDBb<i> become "L" commonly.

In the parallel test of the degenerate X-address in the prior art semiconductor memory device, whether or not the data as read out to data buses DB<i>, DBb<i> are correct, was judged by examining whether or not they are identical to each other, so that the judgement circuit for use in the parallel test of the degenerate X-address was made up in the form of an exclusive NOR circuit of the 2-input type, to which the data as read out to the data buses DB<i>, DBb<i> are inputted as two inputs. Similar to the above, in the parallel test of the degenerate Y-address in the semiconductor memory device of FIG. 13, whether or not the data read out to subdata buses SDB<i>, SDBb<i> are correct, is judged by examining whether or not they are identical to each other, so that the judgement circuit for use in the parallel test of the degenerate Y-address is made up in the form of an exclusive NOR circuit of the 2-input type to which the data read out to the subdata buses SDB<i>, SDBb<i> are inputted as two inputs.

The data read operation in the semiconductor memory device of FIG. 13 will now be described in the following.

Figure 17:
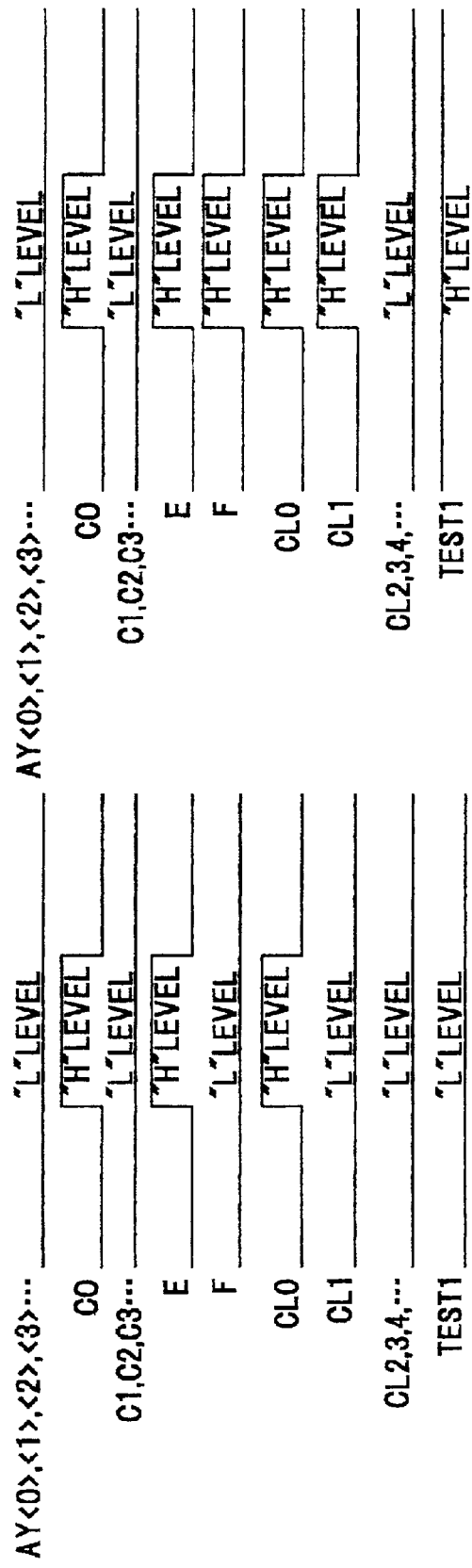
FIG. 17 shows timing charts for explaining the operation of the Y-decoder circuit in the semiconductor memory device as shown in FIG. 13.

FIG. 17 includes two timing charts for explaining the operation of the Y-decode circuit 104 as shown in FIG. 13, the charts (a) and (b) corresponding to the normal mode operation and the test mode operation, respectively. These timing charts are prepared assuming that the Y-address data accessing the Y-address #000 has been inputted to the Y-decode circuit. The Y-address #000 is in the block A.

When the signal TEST1 is "L," the operation is carried out in the normal mode. Referring to FIG. 17(a), if the Y-address data AY of the Y-address #000 is inputted to the Y-decode circuit 104 (see FIG. 14), the decode signal C0 of the decode signals C0~Cm becomes "H" through the decode circuit 41<0> as shown in FIG. (a), and also the signal E of the signals E and F becomes "H" through the Y-degenerate control circuit 2. Like this, if the decode signals C0 and the signal E become "H," only the column signal CL0 becomes "H" through the Y-driver circuit 142<0> of the Y-decode circuit 104.

When the column signal CL0 becomes "H," the sense amplifier circuit SAS0<i> of Y-address #000 (see FIG. 16) of the sense amplifier circuit portion 106-A (see FIG. 15) transmits the data to the subdata buses SDB<i>, SDBb<i>, the data being outputted to the bit lines BL0<i>, BLb<i> from the memory cell MCL of Y-address #000 as selected by the word line.

Like this, in the normal mode operation wherein the signal TEST1 is "L," only one column corresponding to one Y-address is selected according to the Y-address data AY and the data of that Y-address is read out to the above subdata buses.

When the above data is transmitted to the subdata buses SDB<i>, SDBb<i> of the block A, the switch circuit 107<i> connects the subdata buses SDB<i>, SDBb<i> with the read sense amplifier circuit 190<i> of the RSAMP circuit portion 109<i>. With this, the above data transmitted to the subdata buses SDB<i>, SDBb<i> are inputted to and amplified by the read sense amplifier circuit 190<i>, and the amplified read out data are transmitted to the data buses DB<i>, DBb<i>.

The read-out data transmitted to the data buses DB<i>, DBb<i> are amplified and converted into the output data Dout by the read amplifier circuit 11<i> to be outputted to the data I/O pin DQ<i> via the output buffer 12<i>.

In the next, when the signal TEST1 is "H," the operation is carried out in the test mode operation (i.e. parallel test). In this test mode operation referred to FIG. 17(b), if the Y-address data AY of the Y-address #000 is inputted to the Y-decode circuit 104 (see FIG. 14), the decode signal C0 of the decode signals C0~Cm becomes "H" through the decode circuit 41<0>, and also the signals E and F become "H" commonly through the Y-degenerate control circuit 2. Like this, if the decode signals C0 and signals E, F become "H," the column signal CL0 and CL1 simultaneously become "H" through the Y-driver circuit 142<0> of the Y-decode circuit 104.

When the column signals CL0 and CL1 become "H," the sense amplifier circuit SAS0<i> of Y-address #000 in the sense amplifier circuit portion 106-A (see FIG. 15) transmits the data to the subdata buses SDB<i>, SDBb<i>, the data being outputted to the bit lines BL0<i>, BLb<i> from the memory cell MCL of Y-address #000 as selected by the word line. On one hand, the sense amplifier SAS1 of the Y-address #001 transmits the data to the same subdata buses SDB<i>, SDBb<i>, data being outputted to the bit lines BL0<i>, BLb<i> from the memory cell MCL of Y-address #001 as selected by the word line.

Like this, in the test mode operation wherein the signal is "H," there are simultaneously selected the column of the address corresponding to that of the Y-address data AY and the column of the address to be substituted along with the above Y-address by the degenerate substitution in the column redundant substitution, and the two data of these two Y-addresses are simultaneously read out to the subdata buses.

When the data of the Y-addresses #000 and #001 are transmitted to the subdata buses SDB<i>, SDBb<i>, respectively, the switch circuit 107<i> connects the subdata buses SDB<i>, SDBb<i> of the block A with the read sense amplifier circuit 190<i> of the RSAMP circuit portion 109<i>. With this, the data of Y-addresses #000 and #001 as simultaneously read out to the subdata buses SDB<i>, SDBb<i> of the block A are inputted to and amplified by the read sense amplifier circuit 190<i>, and then transmitted to and outputted from the judgement circuit 191<i>.

The judgement circuit 191<i> judges whether or not the inputted read-out data of Y-addresses #000 and #001 are correct, and transmits the judgement data to the data buses DB<i>, DBb<i>, respectively. When pre-charging the sub-data buses SDB<i> and SDBb<i> to make them "H" in such a state that the identical data are written to all the memory cells, if two data as simultaneously read out are commonly correct, SDB<i> becomes "H" and SDBb<i> becomes "L," or SDB<i> becomes ."L" and SDBb becomes "H," while if not, SDB<i> and SDBb<i> equally become "L." Accordingly, the judgement circuit 191<i> judges that the result of the parallel test is normal when SDB<i> is "H" and SDBb<i> is "L," or SDB<i> is "L" and SDBb<i> is "H."On the other hand, the judgement circuit 191 <i> judges that the result of the parallel test is abnormal when SDB<i> and SDBb<i> are commonly "L."

The judgement data transmitted to the data buses DB<i>, DBb<i> are amplified and converted into the output data Dout by the read amplifier circuit 11<i> to be outputted to the data I/O pin DQ<i> via the output buffer 12<i>.(133)

The degenerate Y-address parallel test with regard to the semiconductor memory device as shown in FIG. 13 is applicable to the parallel test including the redundant column substitution. In this parallel test including the redundant column substitution, if the memory cell of the degenerate Y-address is judged to be abnormal, such an abnormal memory cell is replaced by a normal memory cell in the redundant memory portion. Because the a plurality of degenerate Y-addresses in the parallel test are a plurality of Y-addresses (a plurality of columns) within the same block, which are to be substituted by the degenerate substitution in the column redundant substitution.

Like this, the degenerate Y-address parallel test with regard to a plurality of Y-addresses substituted by the degenerate substitution can be performed by simultaneously selecting a plurality of Y-addresses (a plurality of columns) in the same block, which are to be substituted by the degenerate substitution in the column redundant substitution, and by simultaneously reading out the data from a plurality of memory cells of these Y-addresses. According to this degenerate Y-address parallel test, the parallel test can be carried out EVEN when the column redundant substitution is included in the test, and it becomes possible to advantageously shorten the period of time needed for executing the parallel test.

In order to execute the prior art degenerate X-address parallel test, it was necessary to separately arrange the RSAMP circuit portion 109<i> for each of blocks. In the above novel degenerate Y-address parallel test, however, the switch circuits 107<i> are provided by the necessary minimum number of them so that each block can commonly use the RSAMP circuit portion 109<i> with the other. For instance, in the semiconductor memory device of FIG. 13, four RSAMP circuit portions 109<0>~109<3> are provided. However, in order to perform the prior art degenerate X-address parallel test, it would be required to provide the RSMAP circuit portions of the twice number of them i.e. eight number of them. Accordingly, the above degenerate Y-address parallel test can contributes to the decrease in the number of the RSAMP circuit portions as well as in realization of the semiconductor memory device with a compact size.

Second Feature: Adoption of EVEN/ODD System

The second feature of the semiconductor memory device according to the first embodiment is to adopt the EVEN/ODD system including two data transmission paths, one being an EVEN data transmission path making use of the EVEN subdata bus pair and the EVEN sense amplifier circuit, and the other being an ODD data transmission path making use of the ODD subdata bus pair and the ODD sense amplifier circuit. In the degenerated Y-address parallel test according to this system, the data of the first address and the data of the second Y-address, which is substituted by the degenerate substitution along with the first address, are simultaneously read out to the EVEN subdata bus pair and the ODD subdata bus pair, respectively. The result of the parallel test is judged by using these two data, that is, the first Y-address data as read to the EVEN subdata bus pair and the second Y-address data as read to the EVEN subdata bus pair.

Figure 18:
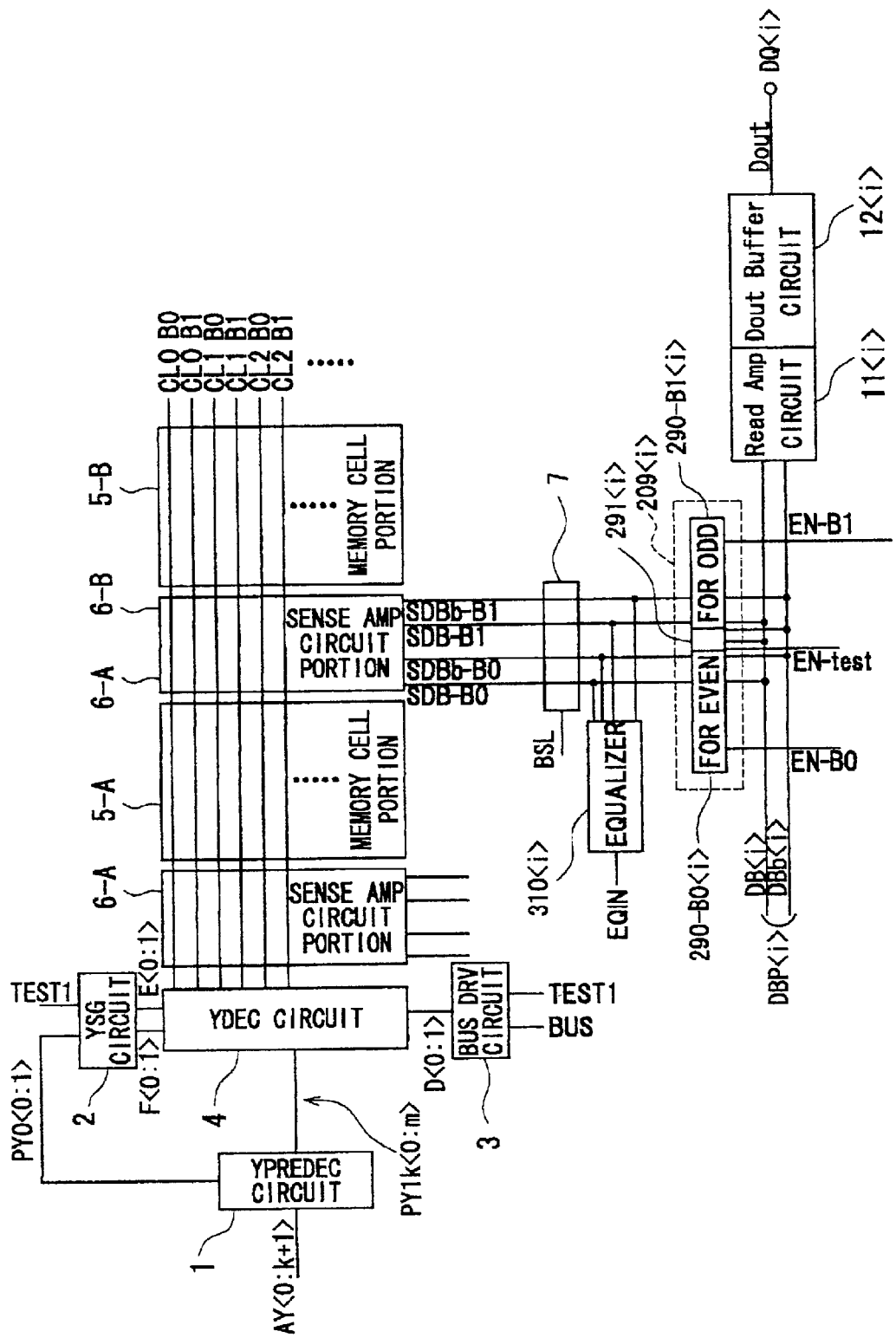
FIG. 18 is a diagram indicating the configuration of the semiconductor memory device for use in explanation of the second feature of the first embodiment.

FIG. 18 is a diagram showing the configuration of the semiconductor memory device for use in explanation of the above second feature. In this figure, like parts as shown in FIG. 2 or 13 are designated by like reference numerals, signs and characters. The semiconductor memory device shown in this figure may be attained by omitting the expected value circuit 8 from the semiconductor memory device of FIG. 2 and replacing the RSAMP circuit portion 9<i> and the equalizer circuit 10<i> by the RSAMP circuit portion 209<i> and the equalizer circuit 310 <i>, respectively, in the semiconductor memory device of FIG. 2. The equalizer circuit 310<i> will be described later in connection with the third feature of the semiconductor memory device according to the first embodiment.

When executing the degenerate Y-address parallel test in the semiconductor memory device of FIG. 18, the memory cell data of the first Y-address out of the degenerate first and second Y-addresses is read out to the EVEN subdata bus pair SDBP-B0<i> and at the same, the memory cell data of the second Y-address is read out to the ODD subdata bus pair SDBP-B1<i>. The RSAMP amplifier circuit portion 209<i> includes an EVEN read sense amplifier circuit 290-B0<i>, an ODD read sense amplifier circuit 290-B1<i>, and a judgement circuit 291<i>.

The data transmission between the EVEN read sense amplifier circuit 290-B0<i> and the data buses DB<i>, DBb<i>, the same between the ODD read sense amplifier circuit 290-B1<i> and the data buses DB<i>, DBb<i>, and the same between the judgement circuit 291<i> and the data buses DB<i>, DBb<i> are controlled by signals EN-B0, EN-B1 and EN-test, respectively. These signals EN-B0, EN-B1 and EN-test are signals which may be produced in the semiconductor memory device of FIG. 18 based on the above-mentioned signals BUS and TEST1, for instance. However, the above signal EN-B0 is different from the signal EN-B0 as used in the semiconductor memory device as shown in FIGS. 1 and 2, that is, it has the function of controlling the data transmission timing between the EVEN read sense amplifier circuit 290-B0<i> and the data buses DB<i>, DBb<i> in the normal mode operation, while in the test mode operation, it has the function of fixing the EVEN read sense amplifier circuit 290-B0<i> to the inactive state. Furthermore, the signal EN-B1 is also different from the signal EN-B1 as used in the semiconductor memory device as shown in FIGS. 1 and 2, that is, it has the function of controlling the data transmission timing between the ODD read sense amplifier circuit 290-B1 and the data buses DB<i>, DBb<i> in the normal mode operation, while in the test mode operation, it has the function of for fixing the ODD read sense amplifier circuit 290-B1<i> to the inactive state. Still further, the above signal EN-test has the function fixing the judgement circuit 291<i> to the inactive state in the normal mode operation while it has function of controlling the data transmission between the judgement circuit and the data buses DB<i>, DBb<i>. In the normal mode, the EVEN read sense amplifier circuit 290-B0<i> and the ODD read sense amplifier circuit 290-B1<i> are controlled by the signals EN-B0 and EN-B1 such that the above two read sense amplifier circuits 290-B0<i>, 290-B1<i> are not connected with the data buses DB<i>, DBb<i> at a time.

The EVEN read sense amplifier circuit 290-B0<i> amplifies the data as read out to the EVEN subdata bus pair SDBP-B0<i> and outputs it to the data bus pair DBP<i> in the normal mode operation while outputting it to the judgement circuit 291<i> in the test mode operation of the parallel test. On one hand, the ODD read sense amplifier circuit 290-B1<i> amplifies the data as read out to the ODD subdata bus pair SDBP-B1<i> and outputs it to the data buses pair DBP<i> in the normal mode operation while outputting it to the judgement circuit 291<i> in the test mode operation of the parallel test.

The judgement circuit 291<i> judges the two read data respectively inputted from the EVEN and ODD read sense amplifier circuits 290-B0<i>, 290-B1<i>, and outputs the judgement data to the data bus pair DBP<i>. This judgement circuit 291<i> is made up of an exclusive OR circuit of the 2-input type receiving the data transmitted from the EVEN subdata bus SDB-B0<i> and the data transmitted from the ODD subdata bus SDB-B1<i>, or an exclusive NOR circuit of the 2-input type receiving the data transmitted from the EVEN subdata bus SDB-B0<i> and the data transmitted from the ODD subdata bus SDB-B1<i>.

In case of the semiconductor memory device as shown in FIG. 13 of the type wherein two data are simultaneously read out from two degenerate Y-addresses to the same subdata buses SDB<i>, SDBb<i>, if either of the data as read out is faulty, the two data different from each other come to be read out so that these data might collide with each other in the subdata buses SDB<i>, SDBb<i>. Therefore, there might be happened that the judgement circuit makes a wrong judgement due to the above data collision.

In order to obviate such instability, the EVEN/ODD system is adopted in the first embodiment, in which the data in the memory cell of the first Y-address of two degenerate Y-addresses is read out to the EVEN subdata buses SDB-B0<i>, SDBb-B0<i> while the data in the memory cell of the second Y-address is read out to the ODD subdata buses SDB-B1<i>, SDBb-B1<i>. With this, the data of the first and second Y-address can be read out to the different subdata buses, thereby preventing the data collision from being occurred and reducing the faulty judgement in the degenerate Y-address parallel test.

Third Feature: Change of Equalization Timing

The third feature of the first embodiment, is to make the equalization timing of the EVEN and ODD subdata buses equal to each other in the degenerate Y-address parallel test.

Figure 19:
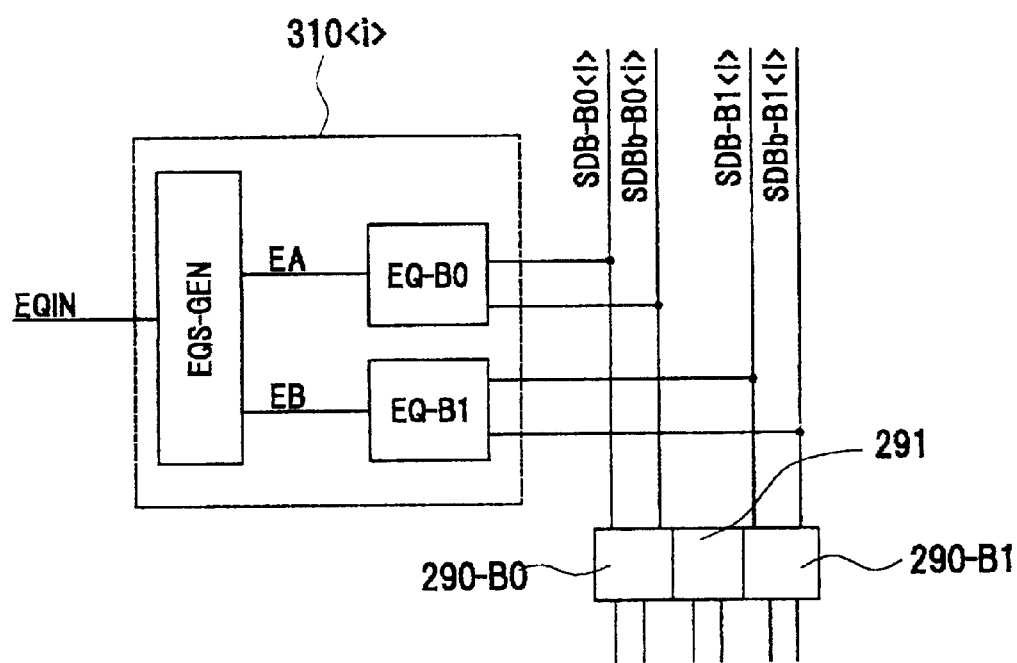
FIG. 19 is a diagram indicating the configuration of an equalizer circuit as shown in FIG. 18.

FIG. 19 is a diagram showing the configuration of the equalizer circuit 310<i> as shown in FIG. 18, which equalizes the subdata bus in the test mode operation with the same timing as that in the normal mode operation. In FIG. 19, like parts in FIG. 9 are designated by the like reference numerals, signs, and characters. FIG. 20 shows two timing charts with regard to the operation of the equalizer circuit 310<i> as shown in FIG. 19, (a) being the timing chart in the normal operation and (b) being the timing chart in the test mode operation.

The equalizer circuit 310<i> can be obtained by substituting an equalizing signal generation circuit EQS-GEN for the equalizing signal generation circuit EQ-GEN of the equalizer circuit 10<i> in FIG. 9. This equalizing signal generation circuit EQS-GEN generates equalizing signals EA and EB, which are outputted to the EVEN equalizer EQ-B0 and the ODD equalizer EQ-B1, respectively.

As shown in FIG. 20, the equalizer circuit 310<i> equalizes the EVEN and ODD subdata buses such that their equalization timing phases become opposite to each other regardless of the normal or test operation mode.

Figure 20B:
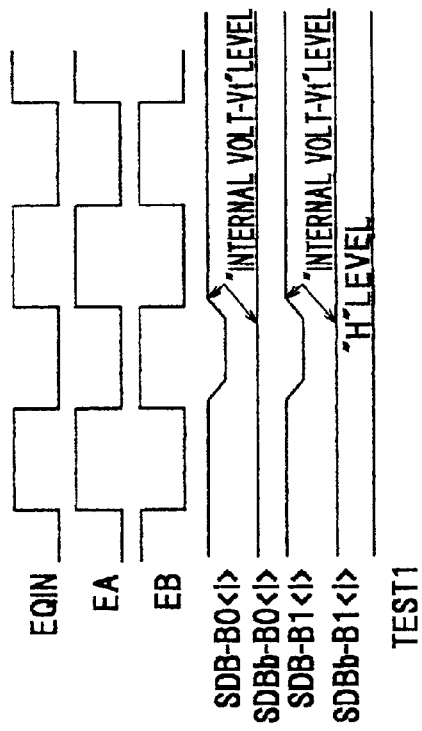
FIG. 20 shows timing charts of the equalizer circuit shown in FIG. 19.
Figure 20A:
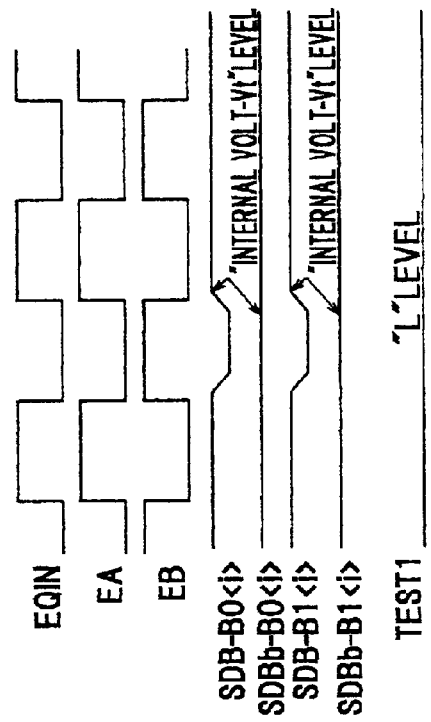

In the normal mode operation, one data is transmitted by using either the EVEN subdata buses or the ODD subdata buses, so that the electric potential of the unused subdata buses can be prevented from being changed EVEN though that of the subdata as used is changed, by oppositely setting the equalizing timing phases of both subdata buses as shown in FIG. 20(a) and equalizing only the subdata bus as unused.

In the degenerate Y-address parallel test, however, two data are transmitted by simultaneously using both of subdata buses, so that if the subdata buses are equalized with the same opposite timing phase as used in the normal mode operation as shown in FIG. 20(b), either one of both subdata buses is equalized at the time of the data transmission, and there might happens that the openness of the EVEN and ODD subdata bus pairs is different from each other. As the case may be, the equalized subdata bus pair is almost not opened depending on the equalization strength, so that EVEN if the data as read out to both subdata buses are correct, there is possibility that the judgement circuit judges the data "faulty."

Accordingly, in the first embodiment, as shown in FIGS. 9 and 11, there is provided the equalizer circuit 10i> which controls the equalization timing according to the signals EQIN and TEST1. This equalizer circuit 10<i> equalizes both subdata buses with the opposite timing in the normal operation mode, and does both subdata buses with the same timing in the parallel test mode, and does none of both subdata buses when the data are simultaneously read out to both subdata buses in the parallel test. With this, the data as respectively read out to the EVEN and ODD subdata buses can be correctly transmitted under the same condition up to the judgement circuit, thereby reducing the faulty operation of the judgement circuit.

Fourth Feature: Introduction of Logical Expected Value

The fourth feature of the semiconductor memory device according to the first embodiment is to introduce a logical expected value with regard to the judgement of the data as read out in the degenerate Y-address parallel test, thereby generating the correct expected value of the data as read out and judging whether or not the data is correct according to the above logical expected value.

Figure 21:
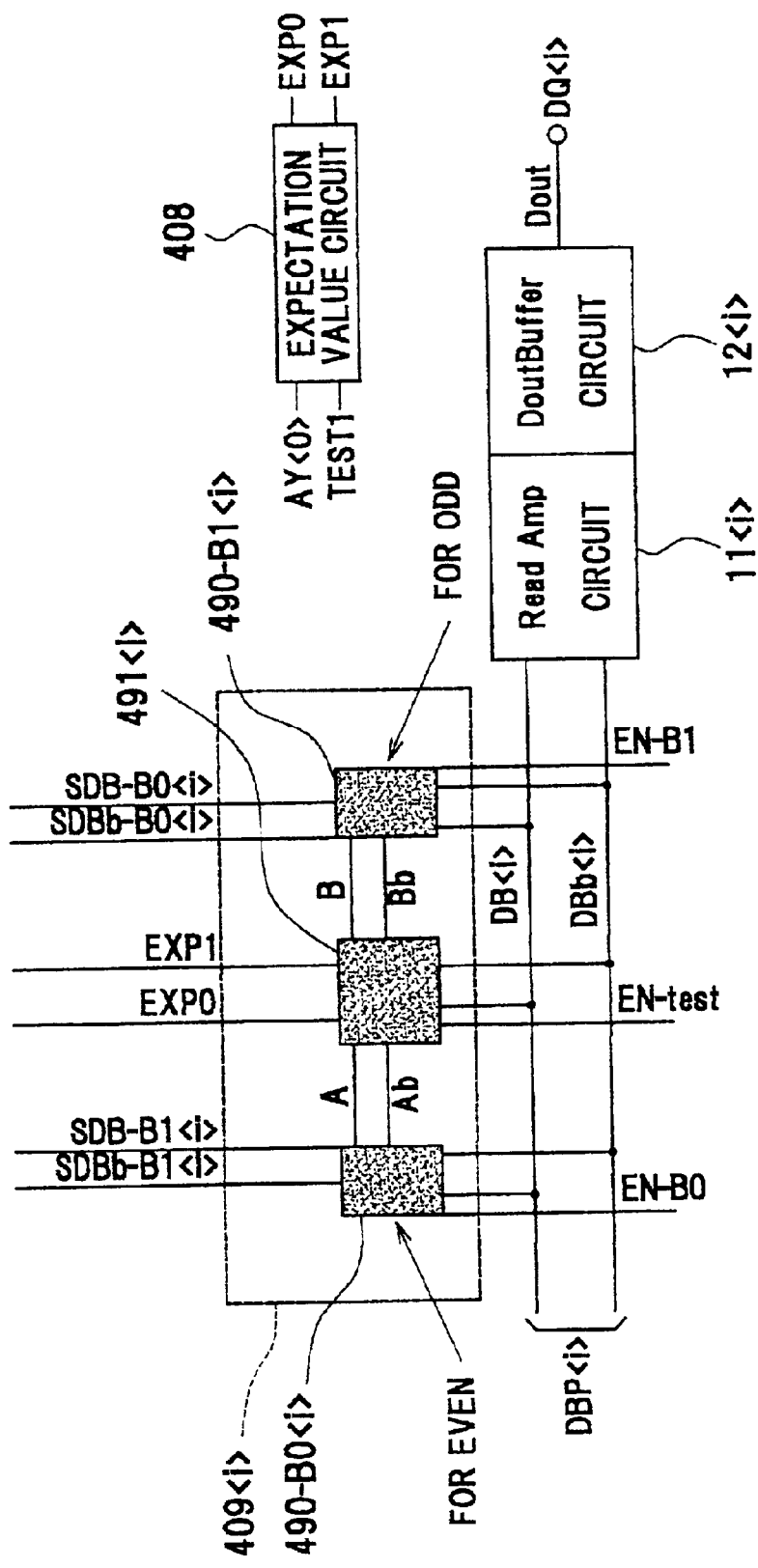
FIG. 21 is a diagram indicating the configuration of the expected value circuit and the read sense amplifier circuit portion for explaining the fourth feature of the first embodiment.

FIG. 21 is a diagram indicating the configuration of the expected value circuit and the read sense amplifier circuit portion for explaining the fourth feature of the first embodiment. In this figure, like parts as shown in FIGS. 7 and 18 are designated by like reference numerals, signs and characters. However, the signals EN-B0 and EN-B1 have the same function as those which are indicated in FIG. 18, but are different from the signals EN-B0 and EN-B1. The semiconductor memory device having introduced the logical expected value for judging the data as read out, can be obtained by adding an expected value circuit 408 to the semiconductor memory device of FIG. 18 and substituting a RSAMP circuit 409<i> for the RAMP 209<i> of FIG. 18.

In FIG. 21, the expected value circuit 408 generates expected value signals EXP0 and EXP1 according to the least significant bit AY<0> of the Y-address data AY and the signal TEST1, and outputs the them to the judgement circuit <i> of the RSAMP circuit portion 409<i>. In the degenerate Y-address parallel test, the above expected value signal EXP1 represents the expected value of the correct read-out data while the expected value signal EXP1 indicates the expected value of the faulty read-out data. In the degenerate Y-address parallel test, the value of the data written by using the least significant bit AY<0> of the Y-address data AY (i.e. the expected value of the correct read-out data) can be inputted to the semiconductor memory device. This expected value 408 outputs expected value signals EXP0= "L" and EXP1="H" when the signal TEST1="L," while it outputs the expected value signal EXP0=rAY<0> (i.e. the inverted data of AY<0>) when the signal TEST1="H."

The RSAMP circuit portion 409<i> includes an EVEN read sense amplifier circuit 490-B0<i>, an ODD read sense amplifier circuit 490-B1<i> and a judgement circuit 491<i>. Data transmission between the above three circuits 490-B0<i>, 490-B1<i>, 491<i> and the data buses DB<i>, DBb<i> is controlled by signals EN-B0, EN-B1 and EN-test, respectively.

The data A and Ab as read out from the EVEN subdata buses SDB-B0<i>, SDBb-B0<i> and amplified by the EVEN read sense amplifier circuit 490-B0 are outputted to the data buses DB<i>, DBb<i> in the normal mode operation, while they inputted to the judgement circuit 491<i> in the test mode operation. On one hand, The data B and Bb as read out from the ODD subdata buses SDB-B1<i>, SDBb-B1<i> and amplified by the ODD read sense amplifier circuit 490-B1 are outputted to the data buses DB<i>, DBb<i> in the normal mode operation, while they inputted to the judgement circuit 491<i> in the test mode operation.

The judgement circuit 491<i> executes the parallel test with regard to the data A, Ab from the EVEN read sense amplifier circuit 490-B0<i> as well as the data B, Bb from the ODD read sense amplifier circuit 490-B1<i>, according to the expected value signals EXP0 and EXP1 from the expected value circuit 408. The judgement data C and Cb resulting from the parallel test are outputted to the data buses DB<i>, DBb<i>, respectively.

Figure 22:
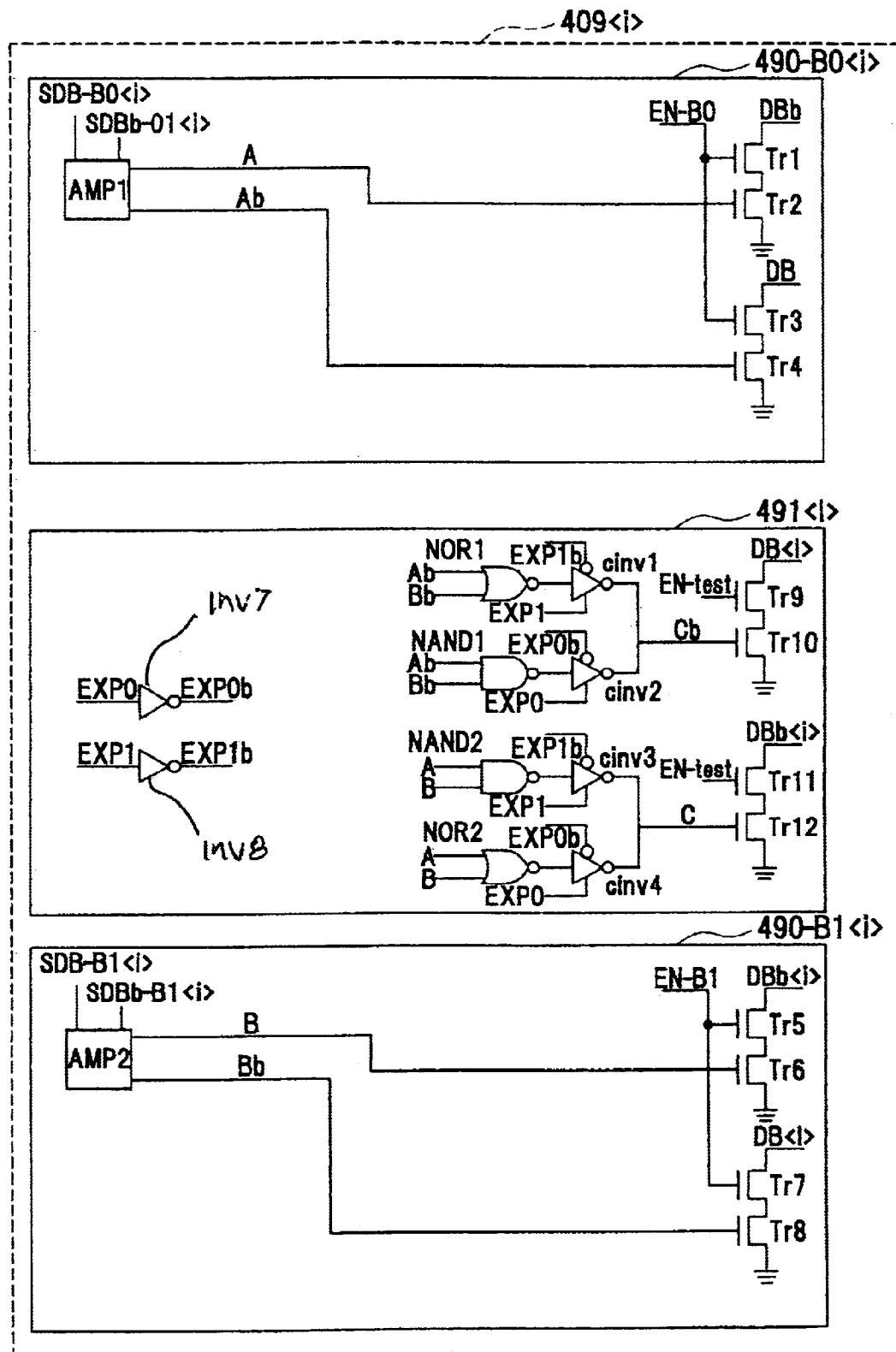
FIG. 22 is a circuit diagram of the read sense amplifier circuit portion as shown in FIG. 21.

FIG. 22 is a circuit diagram of the RSAMP circuit portion 409<i> as shown in FIG. 21, in which like parts of FIG. 8 are designated by like reference numerals, signs and characters. However, the signals EN-B0 and EN-B1 of FIG. 22 function in the same way as those of FIG. 18 but do in the different way from those of FIG. 8. The EVEN read sense amplifier circuit 490-B0<i> of FIG. 22 can be formed by first deleting, from the EVEN read sense amplifier circuit 90-B0<i> as shown in FIG. 8, the inverter circuits inv1, inv2 and inv3, the transfer gates trans1, trans2 and trans3, and the NOR circuit NOR1 of the 2-input type, and secondly wiring the transistors Tr1~Tr4 such that the signal EN-B0 is inputted to each gate of the transistors Tr1 and Tr3 while the data A and Ab as read out from the EVEN subdata buses DB-B0<i>, SDBb-B1<i> and then amplified are inputted to the gates of transistor Tr2 and Tr4, respectively.

Furthermore, the ODD read sense amplifier circuit 490-B1<i> of FIG. 22 can be formed by first deleting, from the ODD read sense amplifier circuit 90-B1<i> as shown in FIG. 8, the inverter circuits inv4, inv5 and inv6, the transfer gates trans3 and trans4, and the NOR circuit NOR2 of the 2-input type, and secondly wiring the transistors Tr5~Tr8 such that the control signal EN-B1 is inputted to each gate of the transistors Tr5 and Tr7 while the data B and Bb as read out from the ODD subdata buses SDB-B1<i>, SDBb-B1<i> and then amplified are inputted to the gates of transistor Tr6 and Tr8, respectively.

Still further, the judgement circuit 491<i> of FIG. 22 can be formed by first deleting, from the judgement circuit 91<i> of FIG. 8, the inverter circuit inv9, and the NAND circuits of the 2-input type NAND1 and NAND2, secondly wiring the inverter circuits inv7 and inv8 such that the signals EXP0 and EXP1 from the expected value circuit 408 are inputted to them, respectively, and thirdly adding N-channel transistors Tr9, Tr10, Tr11 and Tr12.

The train of the transistor Tr9 is connected with the data bus DB<i> while the source of the same Tr9 is connected with the drain of transistor Tr10. The source of the transistor Tr10 is grounded (connected with VSS). Furthermore, the drain of the transistor Tr11 is connected with the data bus DBb<i> while the source of the same Tr11 is connected with drain of the transistor Tr12. The source of the transistor Tr4 is grounded (connected with Vss). The signal EN-test is inputted to the gates of transistors Tr9 and Tr11, respectively.

Both of the outputs from the clock gates cinv1 and cinv2 are connected with the gate of the transistor TR10 to which the judgement data Cb is inputted. Both of the outputs from the clock gates cinv3 and cinv4 are connected with the gate of the transistor Tr12 to which the judgement data C is inputted.

The operation of the expected value circuit 408 and the RSAMP circuit portion 409<i> of FIG. 21 in the parallel test will now be described in the following. FIG. 22 shows a truth table for explaining the operation of the expected value circuit 408 and the RSAMP circuit portion 409<i> in the parallel test. As will be understood from FIGS. 23 and 11, the circuit made up of the expected value 408 of FIG. 21 and the inverter circuits inv7 and inv8 of the judgement circuit 491<i> of FIG. 22 is equivalent to the circuit made up of the expected value circuit 8 of FIG. 7, the inverter circuits inv7, inv8 and inv9, and NAND circuits NAND1 and NAND2 of the judgement circuit 91 <i> of FIG. 8, with regard to the point that the above two circuit generate signals EXP0, EXP0b, EXP1 and EXP1b according to the least significant bit AY<0> of the Y-address data AY and the signal TEST1.

In the degenerate Y-address parallel test, the value of the data written to the memory cell (equal to the expected value of the data as correctly read out) is inputted to the semiconductor memory device by means of the least significant bit AY(O) of the Y-address data. On one hand, in the expected value circuit 408, the signal TEST1 is "H," so that the expected value signal EXP1=AY<0> of the data as correctly read out and the expected value signal EXP0=rAY<0> of the data as wrongly read out are generated in response to the least significant bit AY(0) of the Y-address data. These expected value signals EXP0 and EXP1 are transmitted to the judgement circuit 491<i>.

The truth table of FIG. 23 is formed according to the following definitions, that is, AY<0> be "H" when the data "1" is written to the memory cell in the parallel test; AY<0> be "L" when the data "0" is written to the memory cell in the parallel test; the expected value signal EXP1 be "H" in the parallel test in which the data "1" is written and the expected value of the data as correctly read out is "1"; and the expected value signal EXP1 be "L" in the parallel test in which the data "0" is written and the expected value of the data as correctly read out is "0." Furthermore, when the data "1" as written to the memory cell is correctly read out, the subdata bus SDB-B0<i> or SDB-B1<i> be "H," the subdata bus SDBb-B0<i> or subdata bus SDB-B1<i> be "L," and data A or B be "H" and data Ab or Bb be "L." Still further, when the data "0" as written to the memory cell is correctly read out, the subdata bus SDB-B0<i> or SDB-B1<i> be "L," the subdata bus SDBb-B0<i> or subdata bus SDB-B1<i> be "H." and data A or B be "L" and data Ab or Bb be "H."

The judgement circuit 491<i> of FIG. 22 judges whether or not the data A, Ab as read out to the EVEN subdata buses SDB-B0<i>, SDBb-B0<i> and the data B, Bb as read out to the ODD subdata buses SDB-B1<i>, SDBb-B1<i> are correct according to the expected signals EXP0, EXP1 inputted from the expected value circuit 408.

As will be seen from FIG. 23, when the expected value of the correct read-out data is "1" (AY<0>=EXP1="H"), the clock gates cmv 1 and cinv 3 of the judgement circuit 491<i> are opened while the same cinv2 and cinv4 are kept in the closed state. With this, the judgement data C and Cb become "H" and "L," respectively, only when the data as read out to the EVEN subdata buses are "1" (the data A"H,"Ab="L") and the data as read out to ODD subdata buses are "1" (the data B"H," Bb"L"). On one hand, the judgement data C and Cb become "L" and "H," respectively, in the following cases, that is, when the data as read out to the EVEN subdata buses are "0" (the A="L," Ab="H") and the data as read out to ODD subdata buses are "1×(the data B="H," Bb="L"), or when the data as read out to the EVEN subdata buses are "1" (the A="H," Ab="L") and the data as read out to ODD subdata buses are "0" (the data B"L," Bb="H"), or when the data as read out to both of the EVEN and ODD subdata buses are commonly "0."

As will be also seen from FIG. 23, when the expected value of the correct read-out data is "0" (AY<0>=EXP1= "L"), the clock gates cinv2 and cinv4 of the judgement circuit 491<i> are opened while the same cmv1 and cinv3 remain in the closed state. With this, the judgement data C and Cb become "L" and "H," respectively, only when the data as read out to the EVEN subdata buses are "0" (the data A="L," Ab="H") and the data as read out to ODD subdata buses are "0" (the data B="L," Bb="H"). On one hand, the judgement data C and Cb become "H" and "L," respectively, in the following cases, that is, when the data as read out to the EVEN subdata buses are "1"(the A="H," Ab="L") and the data as read out to ODD subdata buses are "0" (the data B="L," Bb="H"), or when the data as read out to the EVEN subdata buses are "0" (the A="L," Ab="H") and the data as read out to ODD subdata buses are "1" (the data B="H," Bb="L"), or when the data as read out to both of the EVEN and ODD subdata buses are commonly "1."

As described above, in the judgement circuit 491<i>, only when both of two data as read out are commonly equal to the expected value of the data as correctly read out, it is judged that the above two data are commonly correct and the result of the parallel test is normal, and the judgement data C=EXP1 and Cb=EXP0 are generated. To the contrary, when both of two data as read out are commonly not equal to the expected value of the data as correctly read out, in other words, equal to the expected value of the data as wrongly read out, or when the two data as read out are different from each other, it is judged that the above data include an error and the result of the parallel test is abnormal, and the judgement data C=EXP0 and Cb=EXP1 are generated.

These judgement data C and Cb generated by the judgement circuit 491<i> are inputted to the transistors Tn12 and Tr10 through their gates, respectively. When the signal EN-test becomes "H," the transistors Tr11 and Tr9 are turned ON and the above judgement data C and Cb are transmitted to the data buses DBb<i>, DB<i>.

The judgement data transmitted to the subdata buses DB<i>, DBb<i> are amplified and converted into the output data Dout by the read sense amplifier circuit 11<i>, and outputted to the data I/O pin DQ<i> through the output buffer 12<i>.

Referring to FIG. 23, when the expected value signal EXP1 is "H," the result of the parallel test is normal, and the judgement data C and Cb are "H" and "L," respectively, the data buses DB<i>, DBb<i> become "H" and "L," respectively, and the data Dout of "H" is outputted to the data I/O pin DQ<i>. To the contrary, when the result of the parallel test is abnormal, and the judgement data C and Cb are "L" and "H," respectively, the data buses DB<i>, DBb<i> become "L" and "H," respectively, and the data Dout of "L" is outputted to the data I/O pin DQ<i>.

Again referring to FIG. 23, when the expected value signal EXP1 is "L," the result of the parallel test is normal, and the judgement data C and Cb are "L" and "H," respectively, the data buses DB<i>, DBb<i> become "L" and "H," respectively, and the data Dout of "L" is outputted to the data I/O pin DQ<i>. To the contrary, when the result of the parallel test is abnormal and the judgement data C and Cb are "H" and "L," respectively, the data buses DB<i>, DBb<i> become "H" and "L," respectively, and the data Dout of "H" is outputted to the data I/O pin DQ<i>.

Like this, when the result of the parallel test is normal, the data buses DB<i>, DBb<i> become EXP1 and EXP0, respectively, the data equal to the expected value of the data as correctly read out (i.e. the data equal to AY<0> and EXP1) is outputted to the data I/O pin DQ<i>. To the contrary, when the result of the parallel test is abnormal, the data buses DB<i>, DBb<i> become EXP0 and EXP1, respectively, the data equal to the expected value of the data as wrongly read out (i.e. the data equal to AY<0> and EXP0) is outputted to the data I/O pin DQ<i>.

In the degenerate Y-address parallel test with respect to the case where the same address is written to all the memory cells, the judgement circuit 291<i> as shown in FIG. 18 judges that the result of the parallel test is normal or not by examining whether or not two data as simultaneously read out are equal to each other, so that there is the possibility that it gives such a positive judgement that the result of the parallel test is normal, not only when two data as read out are commonly correct, but EVEN when the two data are commonly faulty. The occurrence probability of such an error that two data as read out are commonly faulty might be very much low comparing with the occurrence probability of the error that either one of two data as read out is faulty, but the former would never be zero.

Accordingly, in the first embodiment, the logical expected value is introduced for the reliable judgement of the parallel test result, and there is provided the expected value circuit capable of producing the expected value of the data as correctly read out. With this, the rightness or wrongness of two data as simultaneously read out is normally judged by using the above expected value, thereby enabling the judgement to say explicitly "abnormal" whenever two data as read out are commonly faulty. Like this, to introduce the logical expected value for the judgement of two data as read out makes it possible for the judgement to say explicitly "abnormal" whenever two data as read out are commonly faulty.

Accordingly, the occurrence of the erroneous judgement can be reduced to a great extent.

Fifth Feature: Reduction in Load Capacity of Data Bus

The fifth feature of the semiconductor memory device according to the first embodiment exists in that the judgement circuit is not connected with the data bus but the judgement data is connected with the data bus through the read sense amplifier circuit, thereby trying to have the load capacity of the data bus reduced.

Figure 24:
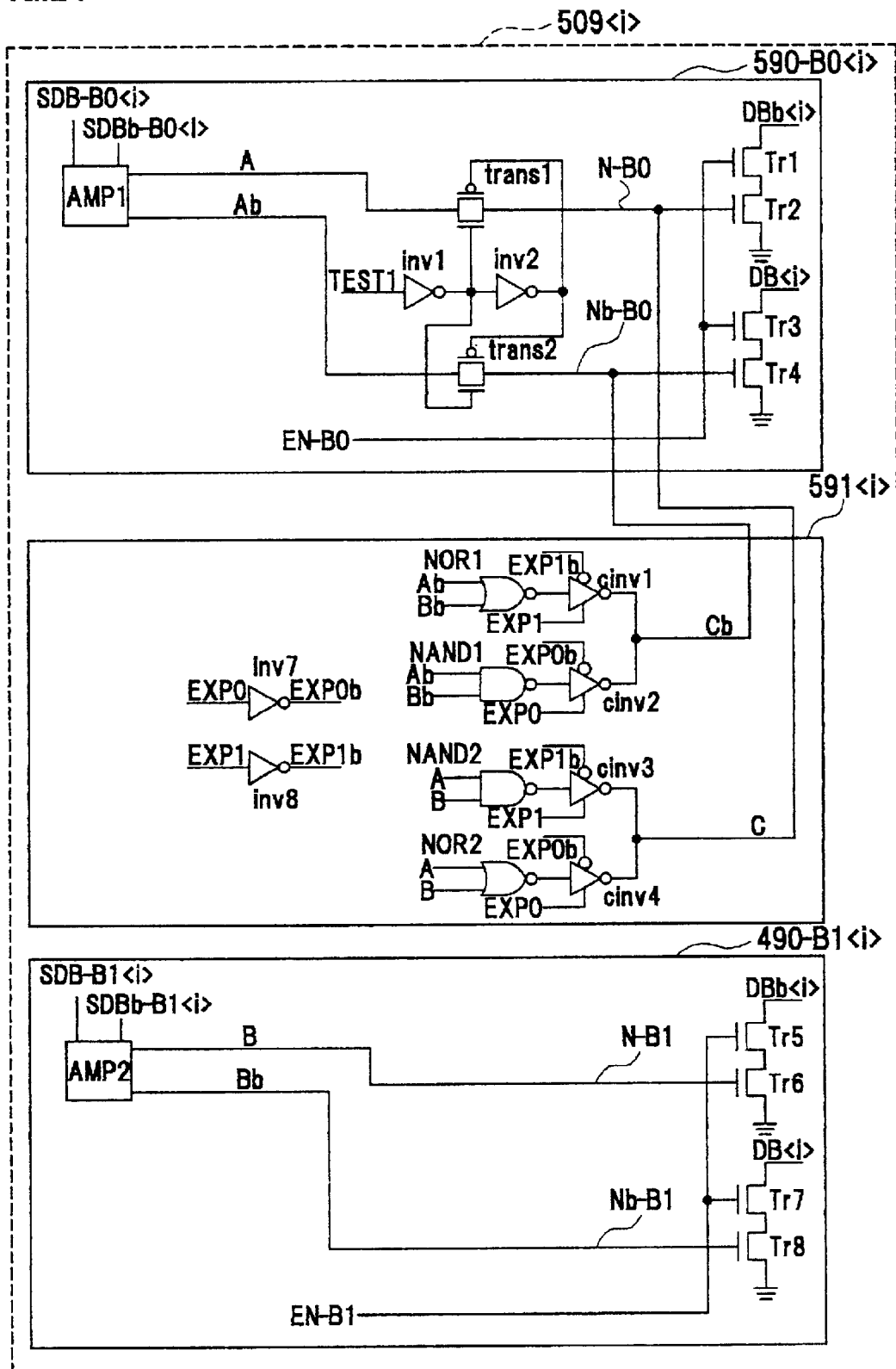
FIG. 24 is a circuit diagram of the read sense amplifier circuit portion for explaining the fifth feature of the first embodiment.

FIG. 24 is a circuit diagram of the RSAMP circuit portion for explaining the above fifth feature. This RSAMP circuit portion makes it possible to reduce the load capacity of the data bus. In FIG. 24, like parts as shown in FIG. 8 or 22 are designated by like reference numeral, signs and characters. The RSAMP circuit portion 509<i> of FIG. 24 can be obtained by substituting the EVEN read sense amplifier circuit 590-B0<i> and the judgement circuit 591<i> for the EVEN read sense amplifier circuit 490-B0<i> and the judgement circuit 491<i> in the RSAMP circuit portion 409<i> as shown in FIG. 22, respectively.

The EVEN read sense amplifier circuit 590-B0<i> as indicated in FIG. 24 is obtained by adding the inverter circuits inv1, inv2 and the transfer gates trans1, trans2 to the EVEN read sense amplifier circuit 490-B0<i> of FIG. 22, and then deleting the inverter circuit inv3 and the NOR circuit NOR1 of the 2-input type from the EVEN sense amplifier circuit 90-B0<i> as shown in FIG. 8 such that the control signal EN-B0 is inputted to each gate of the transistors Tr1 and Tr3.

The judgement circuit 591 <i> as shown in FIG. 24 is obtained by deleting the transistors Tr9~Tr12 from the judgement circuit 491<i> as indicated in FIG. 22 such that the judgement data C and Cb are outputted to the nodes N-B0 and Nb-B0 of the EVEN read sense amplifier circuit 590-<i> and are connected with neither the data bus DB<i> nor the same DBb<i>. Accordingly, this judgement circuit 591-<i> has the same configuration as the judgement circuit 91<i> of FIG. 8 except the configuration for generating signals EXP0, EXP0b, EXP1 and EXP1b.

In the test mode operation of the parallel test, the judgement circuit 591<i> outputs the judgement data C and Cb to the nodes N-B0 and Nb-B0, respectively. The EVEN read sense amplifier circuit 590-B0<i> closes the transfer gates trans1 and trans2 with the signal TEST1 and at the same time, turns on the transistors Tr1 and Tr3 with the signal EN-B0 to output the judgement data C and Cb to the data buses DBb<i>, DB<i>, respectively.

As described above, in the RSAMP circuit portion 409<i> as shown in FIG. 22, the EVEN sense amplifier circuit 490-B0<i> is connected with the data buses DBb<i>, DB<i> through the transistors Tr1 and Tr3. Furthermore, the ODD sense amplifier circuit 490-B1 is also connected with the data buses DBb<i>, DB<i> through the transistors Tr5 and Tr7. Still further, the judgement circuit 491<i> is also connected with the data buses DBb<i>, DB<i> through the transistors Tr9 and T11 in order to output the judgement data of the parallel test to the data buses.

As described above, if a single RSAMP circuit portion takes such a configuration that all of the EVEN sense amplifier circuit, the ODD sense amplifier circuit, and the judgement circuit included therein are connected with the data buses DB<i>, DBb<i>, the total load capacity of the data buses DB<i>, DBb<i> becomes (the load capacity necessary for one transistor)×3×(the number of RSAMP circuit portions), and the load capacity of the RSAMP circuit portion is remarkably increased by providing the EVEN sense amplifier circuit, the ODD sense amplifier circuit, and the judgement circuit within the RSAMP circuit portion. What is worse, the increase in the load capacity of the data bus sometimes invites the decrease in the data transmission ability of the data bus.

In the first embodiment, therefore, the judgement circuit is not connected with the data bus and the judgement data is once transmitted from the judgement circuit to the EVEN (or ODD) read sense amplifier circuit, and is then outputted therefrom. With this, the reduction of the load capacity of the data bus can be realized, and the fall of the data transmission ability of the data bus can be prevented. Furthermore, with this configuration, it becomes unnecessary to produce the signal EN-test for controlling the judgement circuit.

Sixth Feature: Fixing Read Sense Amplifier Circuit to Inactive State in Parallel TEST The sixth feature of the semiconductor memory device according to the first embodiment is to have the read sense amplifier circuit, to which the judgement data is not transmitted in the degenerated Y-address parallel test, fixed to the inactive state (i.e. the state that the data outputted from the above read sense amplifier is not outputted to the data bus), thereby prohibiting the output of the data to the data bus from this read sense amplifier circuit.

In the normal operation mode, the EVEN read sense amplifier circuit and the ODD read sense amplifier circuit are controlled by the signals EN-B0 and EN-B1, respectively, such that the data amplified by the EVEN read sense amplifier circuit and the data amplified by the ODD read sense amplifier circuit are outputted in the different timing. There may be the case that these signals EN-B0 and EN-B1 are produced by using the signals E<0:1> and F<0:1> outputted from the Y-degeneration control circuit 2 for the purpose of making the semiconductor memory device more compact by simplifying the circuit, reducing the pattern area and so forth.

However, in case of the test mode operation of the parallel test, as will be seen from FIG. 10, the signals E<0:1> and F<0:1> are fixed to "H" or "L." Accordingly, in the test mode operation, if controlling the output of the read sense amplifier circuit with the signals EN-B0 and EN-B1 produced by using the signals E<0:1> and F<0:1>, both of the read sense amplifiers are simultaneously activated, and it sometimes occurs that the data is outputted to the data bus from the read sense amplifier circuit (the ODD read sense amplifier circuit 90-B1 in the first embodiment) to which no judgement data is transmitted from the judgement circuit.

Accordingly, in the first embodiment, there is provided in the read sense amplifier circuit (the ODD read sense amplifier circuit 90-B1) to which the judgement data is not transmitted, a circuit which is made up of the inverter circuit inv6 and the NOR circuit 2 and generates the signal controlling the ON/OFF operation of the transistors Tr5 and Tr7 according to the signals EN-B1 TEST1. This circuit turns on/off the transistors Tr5 and Tr7 according to the signal N-B1 in the normal mode operation while it fixes the transistors Tr5 and Tr7 to the OFF state, thereby fixing the read sense amplifier, to which the judgement data is not transmitted, to the inactive state.

Furthermore, in the first embodiment, there is provided in the read sense amplifier circuit (the ODD read sense amplifier circuit 90-B1) to which the judgement data is not transmitted, a transfer gate circuit which is made up of the inverter circuits inv4, inv5 and the transfer gates trans3, trans4 and controls the output of the read sense amplifier AMP2 and the data transmission between the nodes N-B1 and Nb-B1. In the normal mode operation, the data B, Bb outputted from the read sense amplifier AMP2 are set such that they are set to be transmitted to the nodes N-B1 and Nb-B1 while in the test mode operation, the data B, Bb are set such that they are set to be transmitted to neither the node N-B1 nor the node Nb-B1, thereby fixing the read sense amplifier to which the judgement data is not transmitted, to the inactive state.

Like this, in the degenerate Y-address parallel test, if there is provided the circuit capable of fixing the read sense amplifier circuit, to which the judge data from the judgement circuit is not transmitted, to the inactive state, it becomes possible to prevent the read sense amplifier circuit from outputting the data therefrom to the data bus, and to surely output only the judgement data to the data bus.

Seventh Feature: Configuration Matching Between Both Read Sense Amplifier Circuits The seventh feature of the semiconductor memory device according to the first embodiment of the invention exists in that the EVEN read sense amplifier circuit and the ODD read sense amplifier circuit are realized by using an almost identical configuration, thereby the data transmission of both read sense amplifier circuits being executed under the same condition.

It is preferable that the transmission condition of the data from the EVEN read sense amplifier circuit to the data bus and the same from the ODD read sense amplifier circuit to the data bus are identical to each other, that is, matching to each other. For this, the configuration of both of the above read sense amplifier circuits is preferably matching to each other.

However, in the RSAMP circuit portion as shown in FIG. 24, only the EVEN read sense amplifier circuit 590-B0<i> includes the inverter circuits inv1, inv2 and the transfer gates trans1, trans2, so that the load of the node transmitted by the data outputted from the EVEN read sense amplifier circuit 590-B0<i> is different from that which is transmitted by the ODD read sense amplifier circuit, thus the data transmission condition (including the matching as to the load of the node) of both read sense amplifier circuits is not identical to each other.

Therefore, in the first embodiment, as shown in FIG. 8, there is provided in the nodes N-B1, Nb-B1 of the ODD read sense amplifier circuit 90-B1<i>, a circuit which is made up of the inverter circuits inv4, inv5 and transfer gate trans3, trans4 and matches the configuration of the ODD read sense amplifier circuit 90-B1 to that of the EVEN read sense amplifier circuit 90-B0. With this, the load condition of the nodes N-B1, Nb-B1 of the ODD read sense amplifier circuit 90-B1 is matched to that of the nodes N-B0, Nb-B0 of the EVEN read sense amplifier circuit 90-B0<i>.

Furthermore, in the first embodiment, as shown in FIG. 8, there is provided in the EVEN read sense amplifier circuit 90-B0<i>, a circuit which is made up of the inverter circuits inv3 and the NOR circuit NOR of the 2-input type and matches the configuration of the EVEN read sense amplifier circuit 90-B0 to that of the ODD read sense amplifier circuit 90-B1. With this, the load condition of the transistors Tr1, Tr3 of the EVEN read sense amplifier circuit 90-B0<i> is matched to that of the transistors Tr5, Tr7 of the ODD read sense amplifier circuit 90-B1 <i>.

As described above, the data transmission condition of two read sense amplifier circuits is matched to each other by providing the circuit which matches the configuration of either one of both read sense amplifier circuits to that of the other of both read sense amplifier circuits.

As discussed above, according to the first embodiment, the degenerated Y-address parallel test can be carried out by simultaneously activating a plurality of columns being subject to the degenerate substitution in the column redundant substitution and simultaneously reading out the data from the memory cells selected by the above activated columns, so that the parallel test becomes possible in the test including the column redundant substitute, thus the period of time needed for the test being shortened considerably.

Second Embodiment

Figure 25:
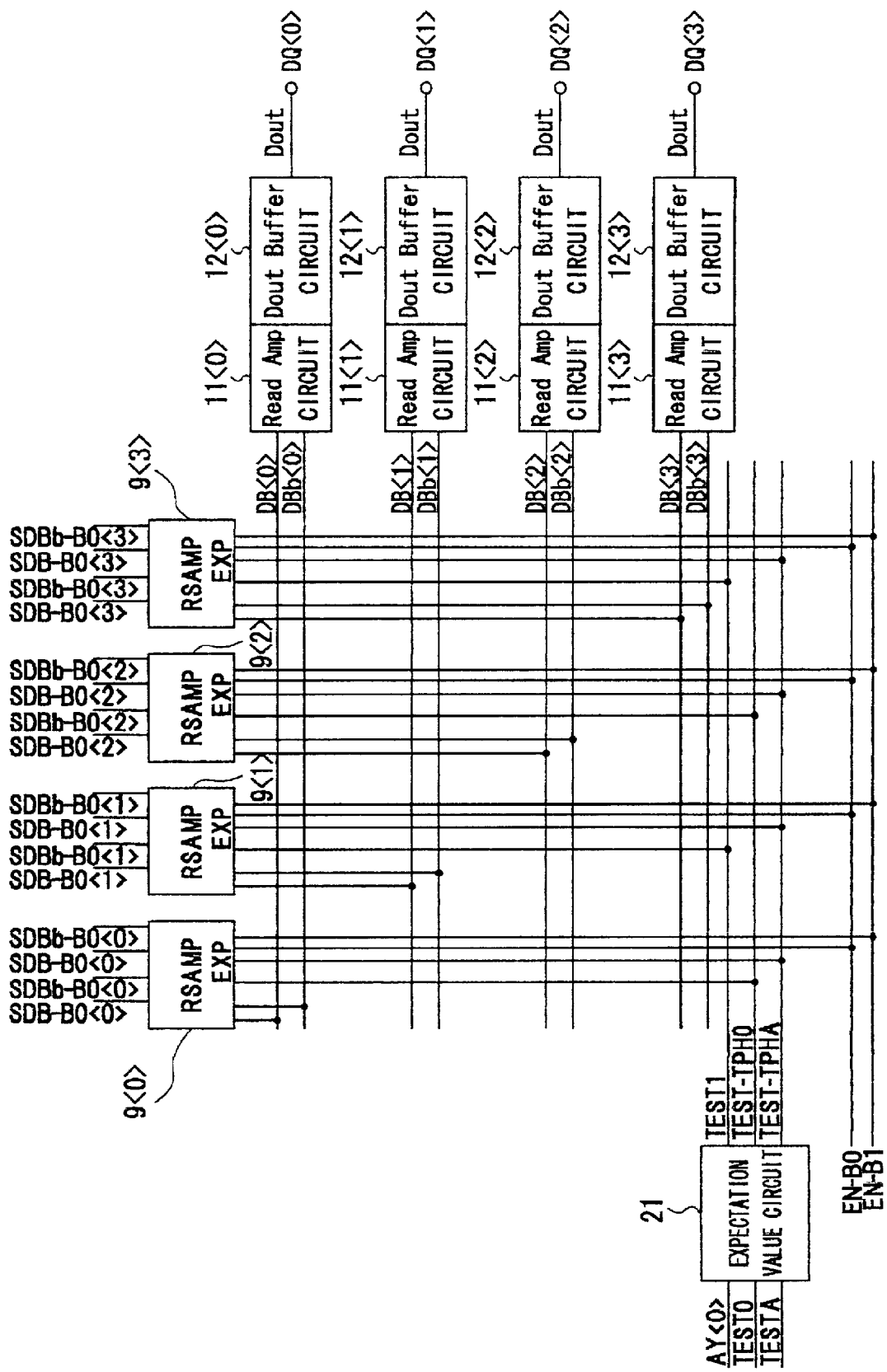
FIG. 25 is a diagram showing the configuration of a data output portion of the semiconductor memory device according to the second embodiment.

FIG. 25 is a diagram showing the configuration of a data output portion of the semiconductor memory device according to the second embodiment. The semiconductor memory device of this second embodiment is obtained by substituting an expected value circuit 21 of FIG. 25 for the expected value circuit 8 of the semiconductor memory device according to the first embodiment (see FIG. 1). The signal TEST1 is inputted to the semiconductor memory device according to the first embodiment while signals TEST0 and TEST1 are inputted to the semiconductor memory device of this second embodiment. The signal TEST1 is generated in the expected value circuit 21 and supplied to RSAMP circuit portions 9<1> and 9<3>, the degenerated Y-control circuit 2, and the bus drive circuit 3, respectively.

FIG. 26 shows timing charts for explaining the operation of bit line pairs when applying the in-phase and anti-phase tests to the semiconductor memory device, (a) being timing chart corresponding to the operation at the time of the in-phase test and (b) being the same corresponding to the operation at the time of the anti-phase test.

In the memory cell portions 5-A and 5-B, a plurality of memory cells MCL and bit line pairs (bit lines BL and BLb) are arranged as shown in FIG. 4. FIG. 26 shows the timing chart relating to four pairs of bit lines which are respectively connected with the four sense amplifier circuits having the same Y-address (sense amplifier circuits SA0<0>~SA0<3>, for instance), and writes/reads the data outputted to the data I/O pins DQ<0>~DQ<3>.

Figure 26A:
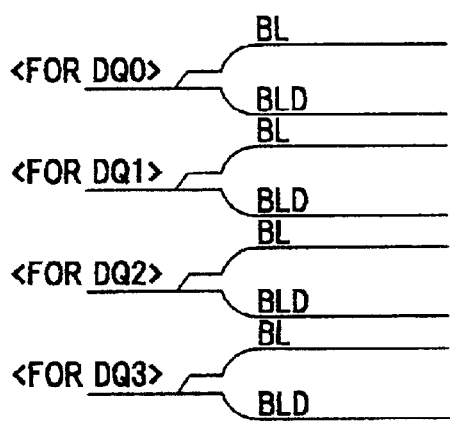
FIG. 26 shows timing charts for explaining the operation of a bit line pair at the time of applying the in-phase and anti-phase tests to the semiconductor memory device.
Figure 26B:
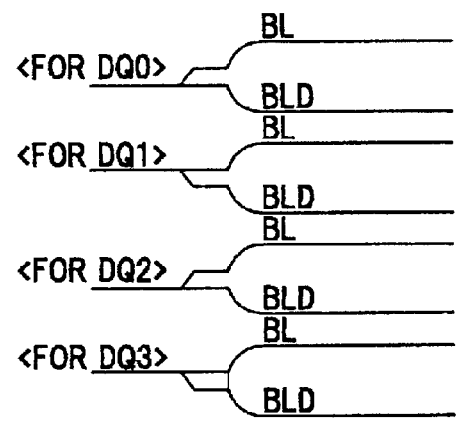

In the test of the semiconductor memory device, two kinds of tests are executed, one being a test called "in-phase test" (FIG. 26(a)) in which the adjacent bit line pairs are set to open in the same direction in consideration of the interference between bit lines and so forth, and the other being a test called "anti-phase test" (FIG. 26(b)) in which the adjacent bit line pairs are set to open in the opposite direction in consideration of the interference between bit lines and so forth. In the in-phase operation as shown in FIG. 26(a), the electric potential of the bit lines BL in the adjacent bit line pairs commonly rises up while that of the bit lines BLb in the adjacent bit line pairs commonly falls down. In the anti-phase operation as shown in FIG. 26(b), the electric potential of the bit lines BL falls down and that of the bit lines BLb rises up in the adjacent bit line pairs next to the adjacent bit line pairs wherein the electric potential of the bit lines BL commonly rises up while that of the bit lines BLb commonly falls down.

In the degenerate Y-address parallel test as previously described in connection with the first embodiment, the value of the expected value signal EXP is made equal with respect to all the read-out data, so that it is needed for all the memory cells to be written with the same data. In this case, the degenerate Y-address parallel in-phase test can be carried out, but it is not possible to carry out the degenerate Y-address parallel anti-phase test.

Therefore, in the second embodiment, there is newly provided an expected value circuit 21 capable of generating the expected value signal of which the value can be made different every adjacent bit line pairs, thereby enabling not only the degenerate Y-address parallel in-phase test but also the degenerate Y-address parallel anti-phase test to be executed.

The expected value circuit 21 generates signals TEST1, TEST-TPH0 and TEST-TPHA according to the inputted least significant bit AY<0> and signals TEST0 and TESTA. The signal TEST1 is inputted to the RSAMP circuit portions 9<1> and 9<3>. The signal TEST-TPH0 is inputted to the RSAMP circuit portions 9<0> and 9<2> as the expected value signal EXP. The signal TEST-TPHA is inputted to the RSAMP circuit portions 9<0> through 9<3> as the expected value signal EXP.

Figure 27:
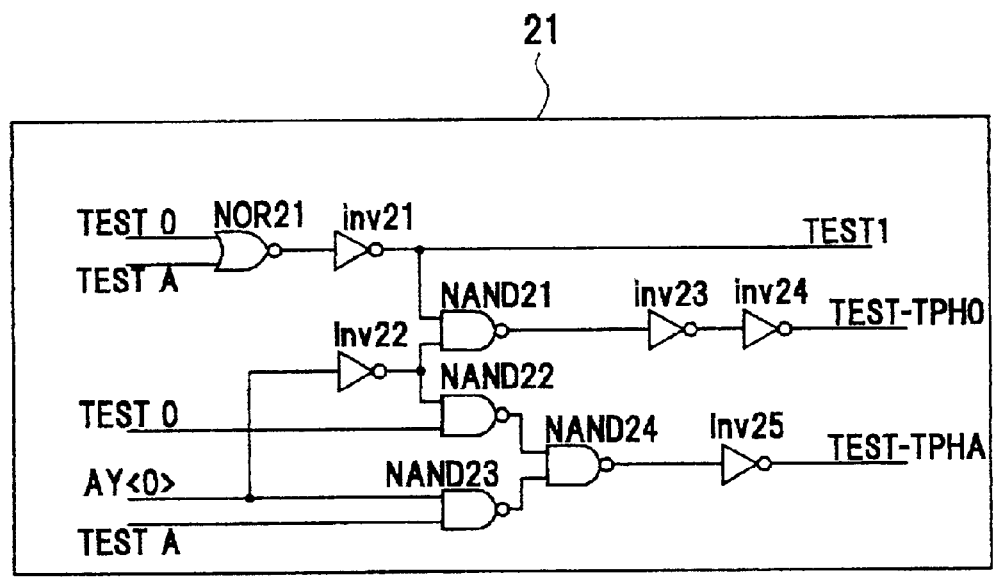
FIG. 27 is a circuit diagram of the expectation circuit in the semiconductor memory device as shown in FIG. 25.

FIG. 27 is a circuit diagram of the expected value circuit 21. In this figure, the expected value circuit 21 includes a NOR circuit of the 2-input type NOR21, NAND circuits of the 2-input type NAND21~NAND24, and inverter circuits inv21~inv25.

The signals TEST0 and TESTA are inputted to the NOR circuit NOR21, of which the output is inputted to the inverter circuit inv21. The output of the inverter circuit inv21 is outputted as the signal TEST1 and at the same time, is inputted to the NAND circuit NAND 21. The least significant bit AY<0> is inputted to the inverter circuit inv22 and the NAND circuit NAND23. The output from the inverter circuit inv22 is inputted to the NAND circuits NAND21 and NAND22. The signal TEST0 is inputted to the NAND circuit NAND22 and the signal TESTA is inputted to the NAND circuit NAND23. The output from the NAND circuit NAND21 is inputted to the inverter circuit inv23, of which the output is inputted to the inverter circuit inv24. The output from the inverter circuit inv24 is outputted as the signal TEST-TPH0. The outputs from the NAND circuits NAND22 and NAND23 are inputted to he NAND 24, of which the output is inputted to the inverter circuit inv25, of which the output is outputted as the signal TEST-TPHA.

When the input signals are TEST0="H" and TESTA="L" (in the test mode of the in-phase test), the expected value circuit 21 outputs signals TEST1="H," TEST-TPH0=AY<0> and TEST-TPHA=AY<0>. Furthermore, when the input signals are TEST0="L" and TESTA="H"(in the test mode of the anti-phase test), the expected value circuit 21 outputs signals TEST1="H," TEST-TPH0=AY<0> and TEST-TPHA=rAY<0> (inverted data of AY<0>). Still further, when the input signals are TEST0=TESTA="L" (in the normal mode), the expected value circuit 21 outputs signals TEST1="L," TEST-TPH0="L" and TEST-TPHA="L."

The operation of the semiconductor memory device according to the second embodiment will now be described in the following. FIG. 28 is a truth table for explaining the operation of the expected value circuit 21 and the RSAMP amplifier circuit portions 9<0>~9<3>, (a) being the truth table corresponding to the operation when input signals TEST0="H" and TESTA="L" and (b) being the truth table corresponding to the operation when input signals TEST0="L" and TESTA="H." The RSAMP circuit portion 9<i> represents RSAMP circuit portions corresponding to the output data of the data I/O pin DQ<0>~DQ<3>, and DQ<i> of FIG. 28 is the truth table with respect to the output data from the RSAMP circuit portion 9<i> and data I/O pin DQ<i>.

In the setting of the operational mode, if the signals TEST0="L" and TESTA="H" are inputted to the expected value circuit 21, it outputs the signals TEST1="L," TEST-TPH0="L" and TEST-TPHA="L," and then, the signals TEST1="L" and the expected value signal EXP="L" are inputted to the judgement circuit 91<0>~91<3>, that is, the signal TEST-TPH0 is inputted to the judgement circuits 9<0> and 9<2> while the signal TEST-TPHA is inputted to the judgement circuits 9<1> and 9<3>. With this, the operational mode is set for the normal mode operation. The operation in this normal mode is carried out in the same way as that in the first embodiment.

Furthermore, in the setting of the operational mode, if the signals TEST0="H" and TESTA="L" are inputted to the expected value circuit 21, it outputs the signals TEST1="H" and TEST-TPH0=AY<0> and TEST-TPHA=AY<0>, and then, the signals TEST1="H" and the expected value signal EXP=AY<0> are inputted to the judgement circuit 91<0>~91<3>, that is, the signal TEST-TPH0 is inputted to the judgement circuits 9<0> and 9<2> while the signal TEST-TPHA is inputted to the judgement circuits 9<1> and 9<3>. With this, the operational mode is set for the test mode of the degenerated Y-address in-phase parallel test. The operation in this in-phase parallel mode is carried out in the same way as the degenerate Y-address parallel test in the first embodiment.

In FIG. 28, the least significant bit AY<0> of the Y-address data AY="H," the EVEN subdata buses SDB-B0<i>="H" and SDBb-B0<i>="L," the ODD subdata buses SDB-B1<i>="H" and SDBb-B1<i>="L," the read-out data A="H" and Ab="L," and the read-out data B="H" and Bb="L" indicate that all of them are equivalent to the data "1." Furthermore, the least significant bit AY<0> of the Y-address data AY="L," the EVEN subdata buses SDB-B0<i>="L" and SDBb-B0<i>="H," the ODD subdata buses SDB-B1<i>="L" and SDBb-B1<i>="H," the read-out data A="L" and Ab="H," and the read-out data B="L" and Bb="H" indicate that all of them are equivalent to the data "0." If the judgement result of the parallel test executed with the write data "1" (i.e. as set with the write data "1"), is normal, the judgement data C and Cb become "H" and "L," respectively, and the data buses DB<i>, DBb<i> become "H" and "L," respectively. If the judgement result of the parallel test executed with the write data "0" (i.e. as set with the write data "0"), is normal, the judgement data C and Cb become "L" and "H," respectively, and the data buses DB<i>, DBb<i> become "L" and "H," respectively.

In the in-phase parallel test as shown in FIG. 28(a), as AY<0> is "H," rAY<0> becomes "L" and the expected value signal EXP="H" is inputted to the judgement circuit 91<0>~91<3> (see FIG. 8). With this, the signals produced by the judgement circuit 91<0>~91<3> become EXP0="L," EXP0b="H," EXP1="H" and EXP1b="L," respectively.

Furthermore, in the in-phase parallel test as shown in FIG. 28(a), the data "1" is written to all the memory cells MCL of the memory portion (see FIG. 4), and these data are simultaneously read out to the EVEN subdata buses SDB-B0<i>, SDBb-B0<i> and the ODD subdata buses SDB-B1<i>, SDBb-B1<i>. Then, the data as read out to the EVEN subdata buses are inputted to the EVEN read sense amplifier circuits 90-B0<i> while the data as read out to the ODD subdata buses are inputted to the ODD read sense amplifier circuits 90-B1<i>.

If the read-out data A and Ab from the EVEN subdata buses DB-B0<i>, DBb-B0<i> are "H" and "L," the read-out data B and Bb from the ODD subdata buses DB-B1<i>, DBb-B1<i> are "H" and "L," and these read-out data are normal, the judgement circuit 91<i> generates the judgement data C="H" and Cb="L," which are transmitted to the data buses DB<i>, DBb<i> through the EVEN read sense amplifier circuit 90-B0<i>, thereby the data buses DB<i>, DBb<i> becoming "H" and "L," and the data of "H" being outputted to the data I/O pin DQ<i>.

In the setting of the operational mode, if the signals TEST0="H" and TESTA="L" are inputted to the expected value circuit 21, it outputs the signals TEST1="H," TEST-TPH0=AY<0> and TEST-TPHA=rAY<0>, and then, the signals TEST1="H" and the expected value signal EXP=AY<0> (TEST-TPH0) are inputted to the judgement circuit 91<0> and 91<2>, while the signal TEST1="H" and the expected value signal EXP=rAY<0> (TEST-TPHA) are inputted to the judgement circuits 9<1> and 9<3>. With this, the operational mode is set for the test mode of the degenerated Y-address anti-phase parallel test.

In the anti-phase parallel test as shown in FIG. 28(b), as the AY<0> is "H," the rAY<0> becomes "L." The expected value signal EXP="L" is inputted to the judgement circuits 91<0> and 91<2>, which in turn generate the signals EXP0="L," EXP0b="H," EXP1="H," and EXP1b="L." To the contrary, the expected value signal EXP="H" is inputted to the judgement circuits 91<1> and 91<3>, which in turn generate the signals EXP0="H," EXP0b="L," EXP1="L," and EXP1b="H."

Furthermore, in the anti-phase parallel test as shown in FIG. 28(b), the data "1" is written to memory cells MCL connected with the sense amplifier circuits SA0<0>, SA0<2>, SA1<0>, SA1<2>. . . , (see FIG. 4) while the data "0" is written to memory cells MCL connected with the sense amplifier circuits SA0<1>, SA0<3>, SA1<1>, SA1<3>. . . (see FIG. 4). These data are read out to the EVEN subdata buses SDB-B0<i>, SDBb-B0<i> and the ODD subdata buses SDB-B1<i>, SDBb-B1<i> in the same way as that of the first embodiment, respectively, and then, these data as read out are correspondingly inputted to the EVEN read sense amplifier circuits 90-B0<i> and the ODD read sense amplifier circuits 90-B1<i> as well.

Then, if the data A and Ab as read out from the EVEN subdata buses DB-B0<0> and DBb-B0<0> are "H" and "L," the data B and Bb as read out from the ODD subdata buses DB-B1<0> and DBb-B1<0> are "H" and "L," and these read-out data are normal, the judgement circuit 91<0> generates the judgement data C="H" and Cb="L," which are transmitted to the data buses DB<0> and DBb<0> through the EVEN read sense amplifier circuit 90-B0<0>, thereby the data buses DB<0> and DBb<0> becoming "H" and "L," and the data of "H" being outputted to the data I/O pin DQ<0>. Similar to the above, if the data A and Ab as read out from the EVEN subdata buses DB-B0<2> and DBb-B0<2> are "H" and "L," the data B and Bb as read out from the ODD subdata buses DB-B1<2> and DBb-B1<2> are "H" and "L," and these read-out data are normal, the judgement circuit 91<2> generates the judgement data C="H" and Cb="L," which are transmitted to the data buses DB<2> and DBb<2> through the EVEN read sense amplifier circuit 90-B0<2>, thereby the data buses DB<2> and DBb<2> becoming "H" and "L," and the data of "H" being outputted to the data I/O pin DQ<2>.

Furthermore, if the data A and Ab as read out from the EVEN subdata buses DB-B0<1> and DBb-B0<1> are "L" and "H," the data B and Bb as read out from the ODD subdata buses DB-B1<1> and DBb-B1<1> are "L" and "H," and these read-out data are normal, the judgement circuit 91<1> generates the judgement data C="L" and Cb="H," which are transmitted to the data buses DB<1> and DBb<1> through the EVEN read sense amplifier circuit 90-B0<1>, thereby the data buses DB<1> and DBb<1> becoming "L" and "H," and the data of "L" being outputted to the data I/O pin DQ<1>. Similar to the above, if the data A and Ab as read out from the EVEN subdata buses DB-B0<3> and DBb-B0<3> are "L" and "H," the data B and Bb as read out from the ODD subdata buses DB-B1<3> and DBb-B1<3> are "L" and "H," and these read-out data are normal, the judgement circuit 91<3> generates the judgement data C="L" and Cb="H," which are transmitted to the data buses DB<3> and DBb<3> through the EVEN read sense amplifier circuit 90-B0<3>, thereby the data buses DB<3> and DBb<3> becoming "L" and "H," and the data of "H" being outputted to the data I/O pin DQ<3>.

As described above, in the anti-phase parallel test as shown in FIG. 28(b), the expected value is set to be "1" (i.e. the expected value signal EXP="H") with respect to DQ0 and DQ2 while the expected value is set to be "0" (i.e. the expected value signal EXP="L") with respect to DQ1 and DQ3. In the judgement circuits 90<0> and 90<2>, whether or not the read-out data is correct is judged based on the expected value signal="H," while in the judgement circuits 90<1> and 90<3>, whether or not the read-out data is correct is judged based on the expected value signal="L," and only when the values of two read-out data are commonly equal to the expected value, the data equivalent to the expected value is outputted to the DQ<i>.

As described above, according to the second embodiment, the same expected value is made to generate with regard to the adjacent bit line pairs in the setting of the in-phase test while the different expected value is made to generate with respect to the adjacent bit line pairs in the setting of the anti-phase test, thereby the judgement having introduced the logical expected value becoming possible not only in the in-phase parallel test but also in the anti-phase parallel test.

Figure 29:
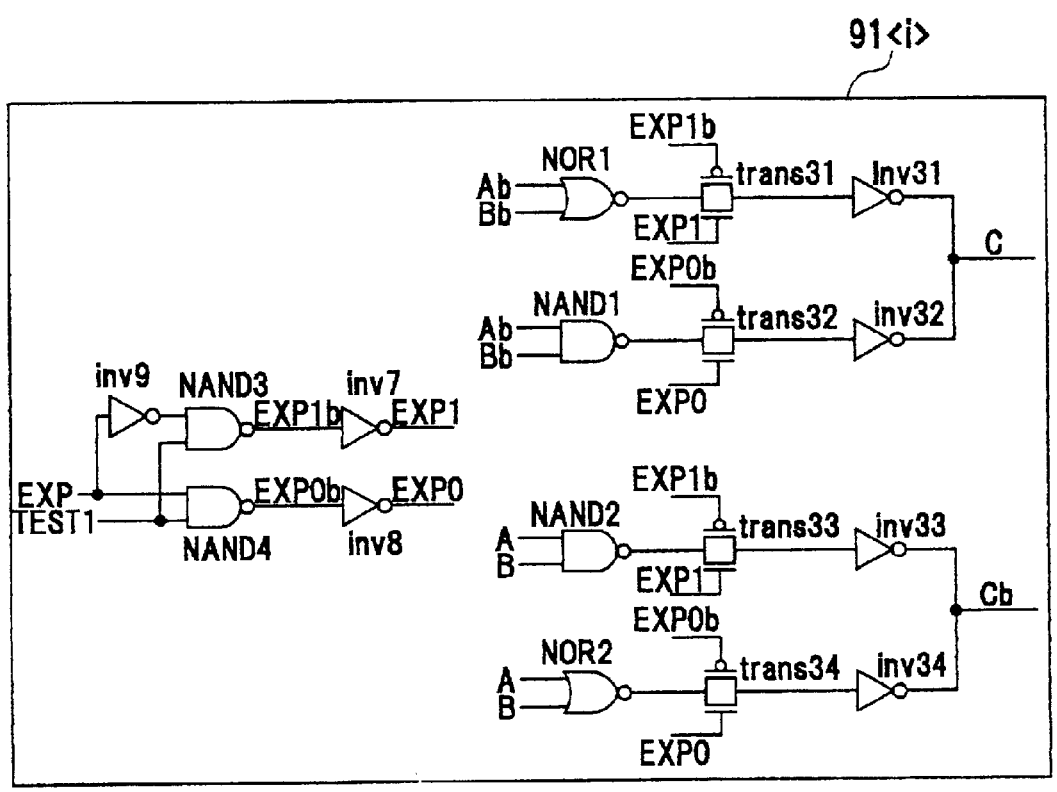
FIG. 29 is a diagram showing the configuration of other judgement circuit used by the semiconductor memory device according to the first or third embodiment.

In the first and second embodiments as described above, the judgement circuit 91<i> (see FIG. 8) is made up of clock gates cinv1~cinv4. As shown in FIG. 29, however, it also possible for the judgement circuit 91<i> to be made up of transfer gates trans31~trans34 and inverter circuits inv31~inv34.

Third Embodiment

Figure 30:
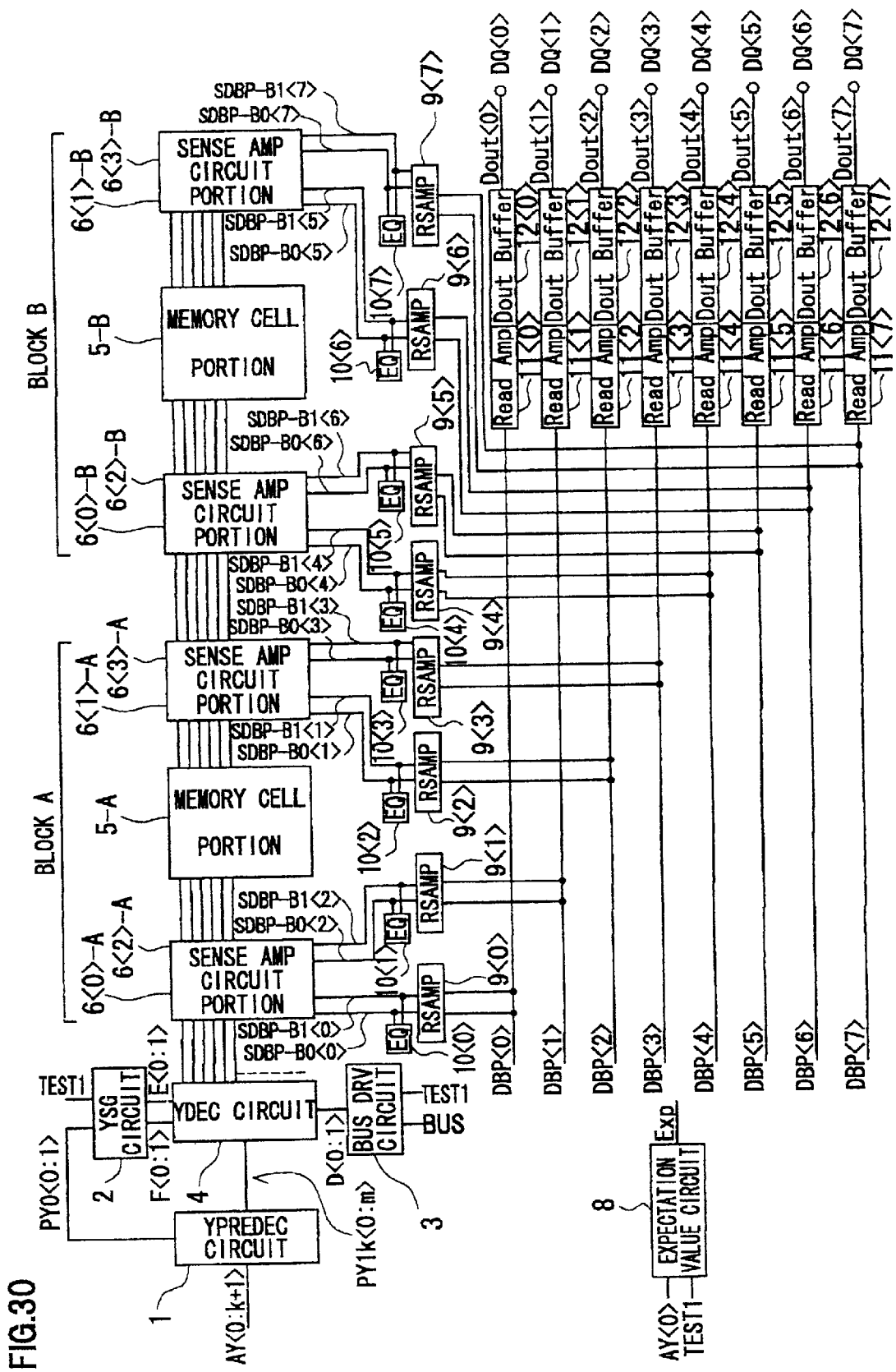
FIG. 30 is a diagram showing the configuration of a semiconductor memory device according to the third embodiment.

FIG. 30 is a diagram showing the configuration of a semiconductor memory device according to the third embodiment. In this figure, like parts as shown in FIG. 1 are designated with like reference numerals, signs and characters. The semiconductor memory device of FIG. 30 includes a Y-predecode (YPREDEC) circuit 1, a Y-degenerate control (YSG) circuit 2, a bus drive (BUSDVR) circuit 3, a Y-decode (YDEC) circuit 4, memory cell portions 5-A and 5-B, sense amplifier circuit portions 6-A (i.e. 6<0>-A~6<3>-A) and 6-B (i.e. 6<0>-B~6<3>-B), an expected value circuit 8, read sense amplifier (RSAMP) circuit portions 9<0>~9<7>, equalizer circuits 10<0>~10<7>, read amplifier (Read Amp) circuits 11<0>~11<7>, output buffer (Dout Buffer) circuits 12<0>~12<7>, EVEN subdata bus pairs SDBP-B0<0>~SDBP-B0<7>, ODD subdata bus pairs SDBP-B1<0>~SDBP-B1<7>, data bus pairs DBP<0>~DBP<7>, and data I/O pins DQ<0>~DQ<7>.

The semiconductor memory device according to the third embodiment is obtained by making double the bit configuration of the semiconductor memory device according to the first embodiment, that is, from 4-bit to 8-bit configuration, and further, by separating the EVEN subdata bus pairs SDBP-B0<0>~SDBP-B0<3> and the ODD subdata bus pairs SDBP-B1<0>~SDBP-B1<3> arranged in the block B from the EVEN subdata bus pairs SDBP-B0<0>~SDBP-B0<3> and the ODD subdata bus pairs SDBP-B1<0>~SDBP-B1<3> arranged in the block A, and further, by making the above EVEN and ODD subdata bus pairs having been arranged in the block B be the EVEN subdata bus pairs SDBP-B0<4>~SDBP-B0<7> and the ODD subdata bus pairs SDBP-B1<4>~SDBP-B1<7>, respectively.

Furthermore, in the semiconductor memory device according to the third embodiment, switch circuits 7<0>~7<3> are deleted, and the EVEN subdata bus pairs SDBP-B0<4>~SDBP-B0<7> and the ODD subdata bus pairs SDBP-B1<4>~SDBP-B1<7> in the block B are provided with RSAMP circuit portions 9<4>~9<7>, equalizer circuits 10<4>~10<7>, read amplifier circuits 11<4>~11<7>, output buffer circuits 12<4>~12<7>, data bus pairs DB<4>~DBb<7>, and data I/O pin DQ<4>~DQ<7>. The configuration of RSAMP circuit portions 9<4>~9<7>, equalizer circuits 10<4>~10<7>, read amplifier circuits 11<4>~11<7>, output buffer circuits 12<4>~12<7>, data bus pairs DB<4>~DBb<7>, and data I/O pin DQ<4>~DQ<7> is identical to that of RSAMP circuit portions 9<i>, equalizer circuits 10<i>, read amplifier circuits 11<i>, output buffer circuits 12<i>, data bus pairs DB<i>, and data I/O pin DQ<i> of the semiconductor memory device according to the first embodiment.

The operation of the semiconductor memory device according to the third embodiment in the normal mode as well as the test mode of the degenerate Y-address parallel test is the same as that of the semiconductor memory device according to the first embodiment. However, in this third embodiment, 4-bit each of the 8-bit data of the same Y-address are written to the blocks A and B, respectively, and the above 8-bit data (the total bit data of two Y-addresses becomes 16-bit data in the degenerate Y-address parallel test) are simultaneously read out from the blocks A and B. These 8-bit data as read out (judgement data of 8-bit in the degenerate Y-address parallel test) are outputted to the data I/O pin DQ<0>~DQ<7>.

In case of the semiconductor memory device according to the first embodiment, the most significant bit AY<k+1> is used for selecting the block. The 4-bit data of the same Y-address are written to and read out from either the block A or B. In contrast to this, in the semiconductor memory device according to the third embodiment, the above block selection bit of the Y-address is not used, and the 4-bit each of the 8-bit data of the same Y-address are written to and read out from the blocks A and B.

In an actual semiconductor memory device of the 8-bit configuration, similar to the first embodiment, the 8-bit data of the same Y-address are written to either block A or B and read out from that block which the data is written to. In an actual semiconductor memory device of the 16-bit configuration, similar to the third embodiment, the 8-bit each of the 16-bit data of the same Y-address are written to the blocks A and B and read out from those which the data are written to. In this semiconductor memory device of the 16-bit configuration, similar to the first embodiment, the blocks A and B are not allowed to commonly have the RSAMP circuit portion, so that there are provided 16 RSAMP circuit portions.

In the above semiconductor memory device of the 8-bit configuration, if 8 each of the 16 RSAMP circuit portions are provided for the respective blocks, it becomes possible to simultaneously read out the data of the block A and the data of the Block B as well to the same data bus by making the X-addresses degenerate, so that the prior art degenerate X-address parallel test could be carried out.

However, in such a semiconductor memory device having no function of selecting the block like the above semiconductor memory device of 16-bit configuration, the 8-bit data of the block A are read out to the 8 data buses of the 16 data buses while the 8-bit data of the block B are read out to the other 8 data buses, so that the data of the block A and the data of the block B can not be simultaneously read out to the same data bus, thus the prior art degenerate X-address parallel test having been not carried out. However, if adding blocks C, D, and further adding the block bit for selecting either blocks A, B or blocks C, D to the most significant bit of the Y-address, and still further providing 32 RSAMP circuit portions, it becomes possible to carry out the prior art degenerate X-address parallel test.

In this third embodiment, the degenerate Y-address parallel test is executed by simultaneously selecting a plurality of Y-addresses (columns) and simultaneously reading out the data from a plurality of memory cells of those Y-addresses as selected. In this degenerate Y-address parallel test, there is no need for a plurality of data to be read out to the same data bus, so that the parallel test can be performed in the semiconductor memory device having no function of selecting the block.

As described above, according to the third embodiment, the degenerate Y-address parallel test wherein there is no need for a plurality of data to be read out to the same data bus, can executed by simultaneously selecting a plurality of Y-addresses (columns) and simultaneously reading out the data from a plurality of memory cells of those Y-addresses as selected. Accordingly, the time needed for the test can be shortened.

The semiconductor memory device according to the third embodiment can be achieved by making double the bit configuration of the semiconductor memory device of the first embodiment. However, it is possible to apply the configuration of the semiconductor memory device of the third embodiment to the semiconductor memory device of the second embodiment, and then, to make double the bit configuration of the semiconductor memory device of the second embodiment.

Fourth Embodiment

Figure 31:
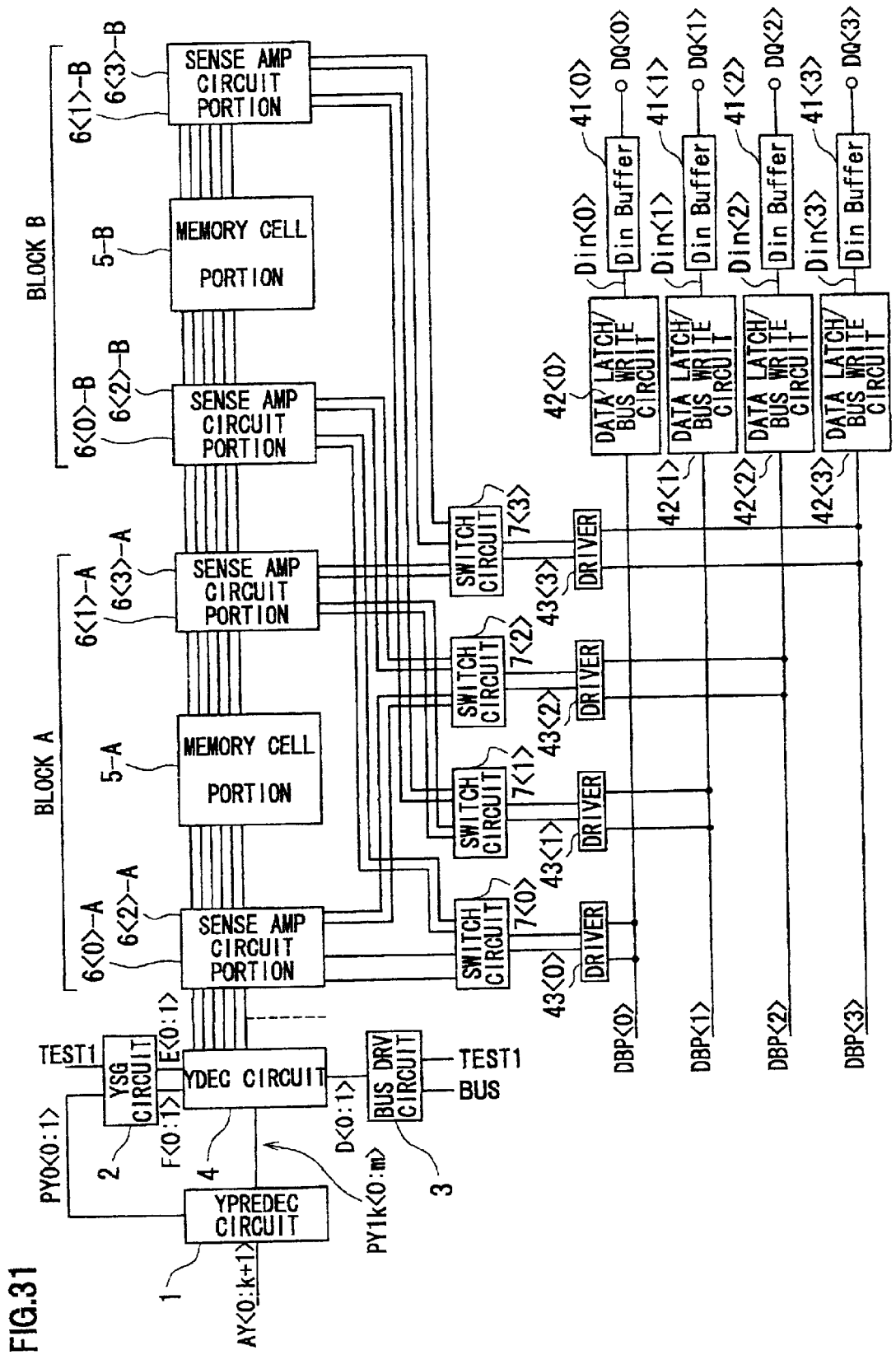
FIG. 31 is a diagram showing the configuration of a semiconductor memory device according to the fourth embodiment.
Figure 32:
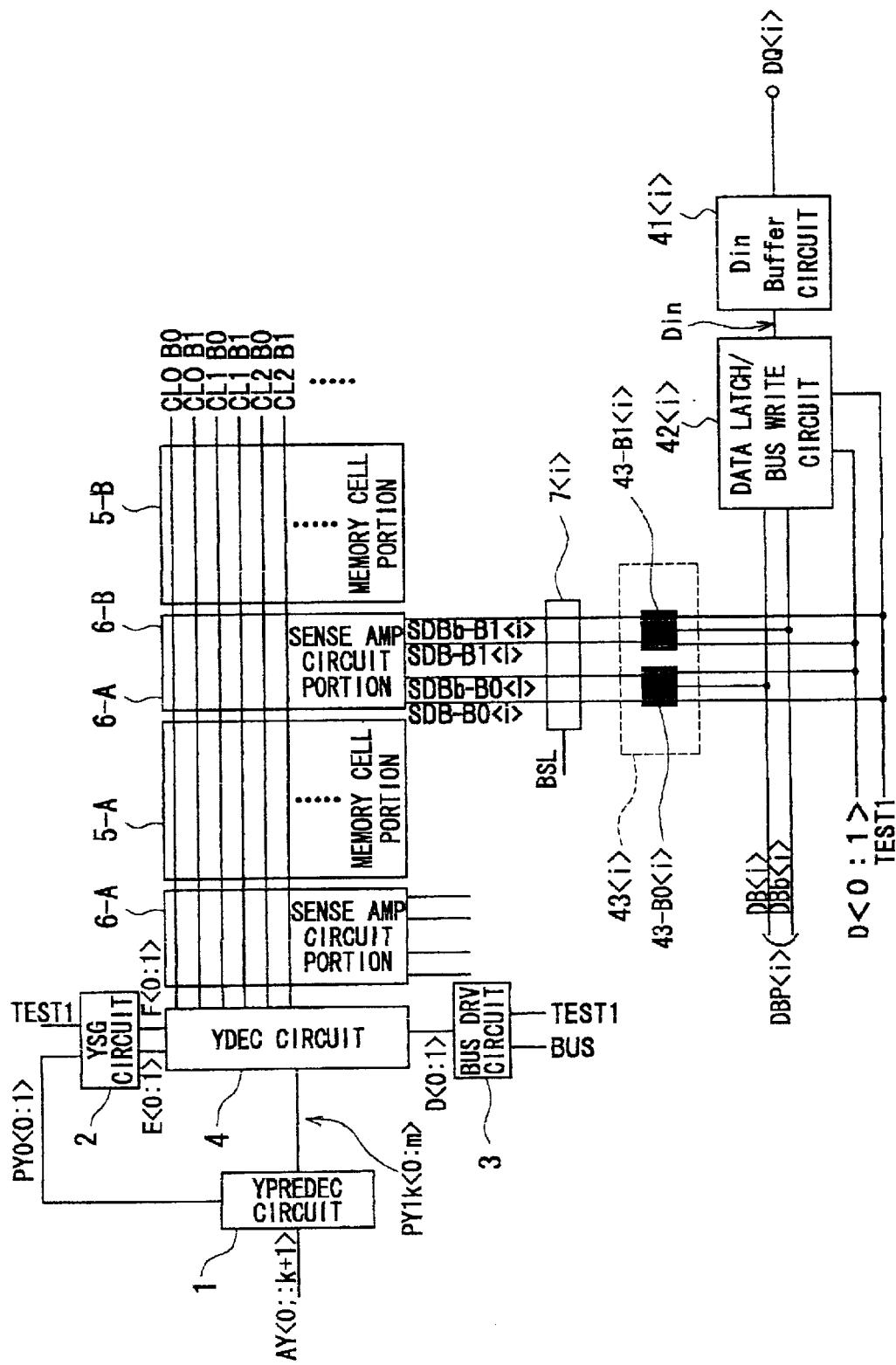
FIG. 32 is a diagram showing the simplified configuration of the semiconductor as shown in FIG. 31.

FIG. 31 is a diagram showing the configuration of a semiconductor memory device according to the fourth embodiment. Like parts as shown in FIG. 1 are designated with the like reference numerals, signs, and characters. The semiconductor memory device of FIG. 31 includes a Y-predecode (YPREDEC) circuit 1, a Y-degenerate control (YSG) circuit 2, a bus drive (BUSDVR) circuit 3, a Y-decode (YDEC) circuit 4, memory cell portions 5-A and 5-B, sense amplifier circuit portions 6-A and 6-B, switch circuit 7<0>~7<3>, EVEN subdata bus pairs SDBP-B0<0>~SDBP-B0<3>, ODD subdata bus pairs SDBP-B1<0>~SDBP-B1<3>, data bus pairs DBP<0>~DBP<3>, data I/O pins DQ<0>~DQ<3>, input buffer (Din Buffer) circuits 41<0>~41<3>, data write latch/bus write circuits 42<0>~42<3>, and write driver (WDRV) circuits 43<0>~43<3>. FIG. 32 is a diagram showing the simplified configuration of the semiconductor as shown in FIG. 31. In FIGS. 31 and 32, there are omitted the circuit for data read and the circuit for decoding the X-address, thereby controlling the word line.

The semiconductor memory device of this fourth embodiment is characterized in that it simultaneously activates a plurality of columns being subject to the degenerate substitution in the column redundant substitute, and simultaneously writes the data to a plurality of memory cells selected by the above activated columns, thereby executing the degenerate Y-address parallel writing in the test.

Input Buffer Circuit 41<i>

The input buffer circuit 41<i> sends the data Din inputted to the data I/O pin DQ<i> to the data latch/bus write circuit 42<i>.

Data Latch/Bus Write Circuit 42<i>

To this data latch/bus write circuit 42<i>, there are inputted the write data Din inputted to the data I/O pin DQ<i>, the control signals D<0>, D<1> generated in the bus drive circuit 3, and the signal TEST1. This data latch/bus write circuit 42<i> writes the input data Din to the data buses DB<i>, DBb<i> according to the timing of the control signals WBUS0, WBUS1 (i.e. drives the data buses DB<i>, DBb<i> according to the input data Din).

Figure 33:
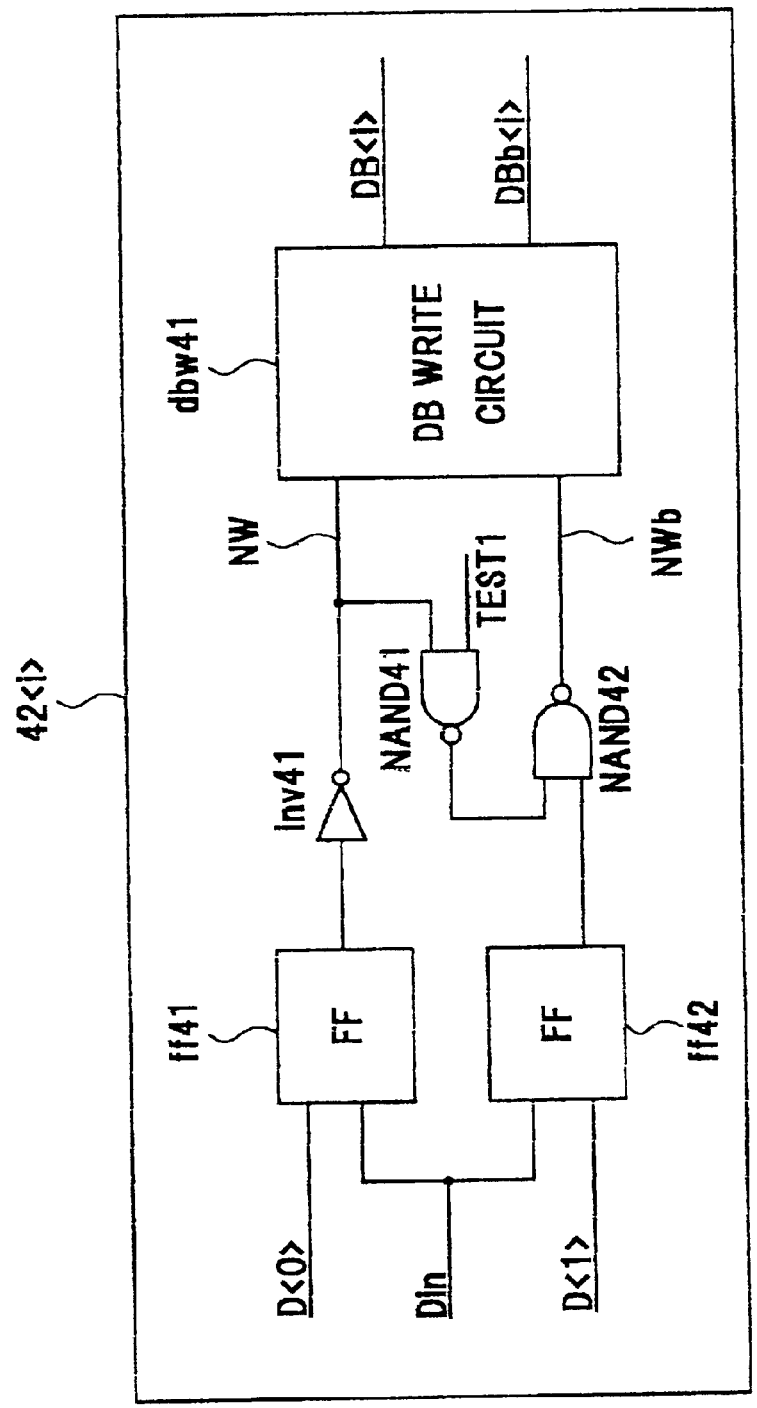
FIG. 33 is a circuit diagram of a data latch/bus write circuit in the semiconductor memory device as shown in FIG. 31.

FIG. 33 is a circuit diagram of the data latch/bus write circuit 42<i>. In this figure, the data latch/bus write circuit 42<i> includes flop-flip circuits ff41 and ff42, an inverter circuit inv41, NAND circuits NAND41 and NAND42 of the 2-input type, and a data bus write (DB WRITE) circuit dbw41.

To the flip-flop circuit ff41, there are inputted the signal D<0> generated by the bus drive circuit 3 and the input data Din, while to the flip-flop circuit ff42, there are inputted the signal D<1> generated by the bus drive circuit 3 and the input data Din. The flip-flop circuit ff41 latches and outputs the input data Din, at the data latch timing, if the signal D<0> is activated, and outputs "H" if the signal D<0> is not activated. The flip-flop circuit ff42 latches and outputs the input data Din, at the data latch timing, if the signal D<1> is activated, and outputs "H" if the signal D<1> is not activated.

The input data Din as latched by the flip-flop circuit ff41 is inputted to the inverter circuit inv41, of which the output is inputted to the data bus write circuit dbw41 through the node NW. To the NAND41, there are inputted the output (signal of the node NW) of the inverter circuit inv41 and the signal TEST1. To the NAND42, there are inputted the Din as latched by the flip-flop ff41 and NAND41, and the output of the NAND42 is inputted to the data bus write circuit dbw41 through the node NWb.

This data bus write circuit dbw41 drives the data bus DB<i> to be "H" when the node NW is "L" while it drives the data bus DB<i> to be "L" when the node NW is "H." Also, the data bus write circuit dbw41 drives the data bus DBb<i> to be "H" when the node NW is "L"while it drives the data bus DBb<i> to be "L" when the node NW is "H."

Write Driver Circuit Portion 43<i>

As shown in FIG. 32, the write driver circuit portion 43<i> includes the EVEN write driver circuit 43-B0<i> and the ODD write driver circuit 43-B1<i>. The EVEN write driver circuit 43-B0<i> drives the EVEN subdata buses SDB-B0<i>, SDBb-B0<i> according to the data as written to the data bus DB<i> if the data D<0> is activated at the drive timing of the subdata bus. Furthermore, when the signal TEST1 is "L," the ODD write driver circuit 43-B1<i> drives the ODD subdata buses SDB-B1<i>, SDBb-B1<i> according to the data as written to the data bus DBb<i> if the data D<1> is activated at the drive timing of the subdata bus. When the signal TEST1 is "H," the ODD write driver circuit 43-B1<i> also drives the ODD subdata buses SDB-B1<i>, SDBb-B1<i> according to the data as written to the data bus DBb<i> if the data D<0> is activated at the drive timing of the subdata bus.

The operation of the semiconductor memory device according to the fourth embodiment will now be described in the following. FIG. 34 shows timing charts of the data latch/bus write circuit 42<i> and the drive circuit portion 43<i>, (a) being the timing chart in the normal mode operation and (b) being the timing chart in the test mode operation.

Normal Mode Operation

To begin with, let us discuss the normal mode operation which starts with the signal TEST1="L." At this time, in the data latch/bus write circuit 42<i>, the output from the flip-flop circuit ff41 is transmitted to the node NW through the inverter circuit inv41 and inputted to the data bus write circuit dbw41. As the output of the NAND circuit NAND41 becomes "H," the data of the node NW is not transmitted to the node NWb, and the output of the flip-flop circuit ff42 is transmitted to the node NWb through the NAND circuit NAND42 and inputted to the data bus write circuit dbw41.

Figure 34B:
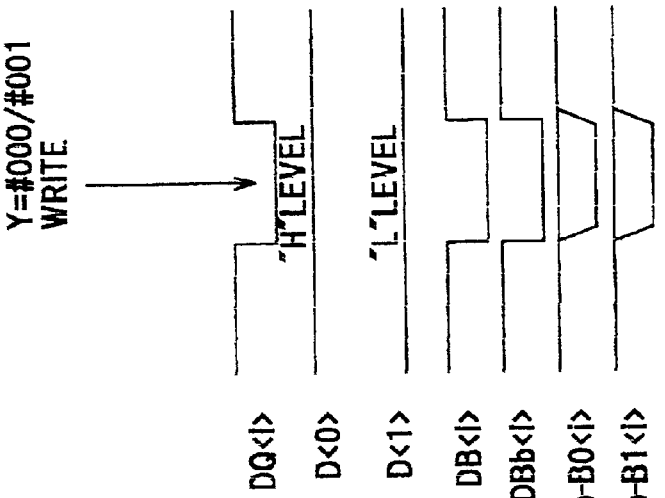
FIG. 34 shows timing charts for explaining the operation of the semiconductor memory device as shown in FIG. 31.
Figure 34A:
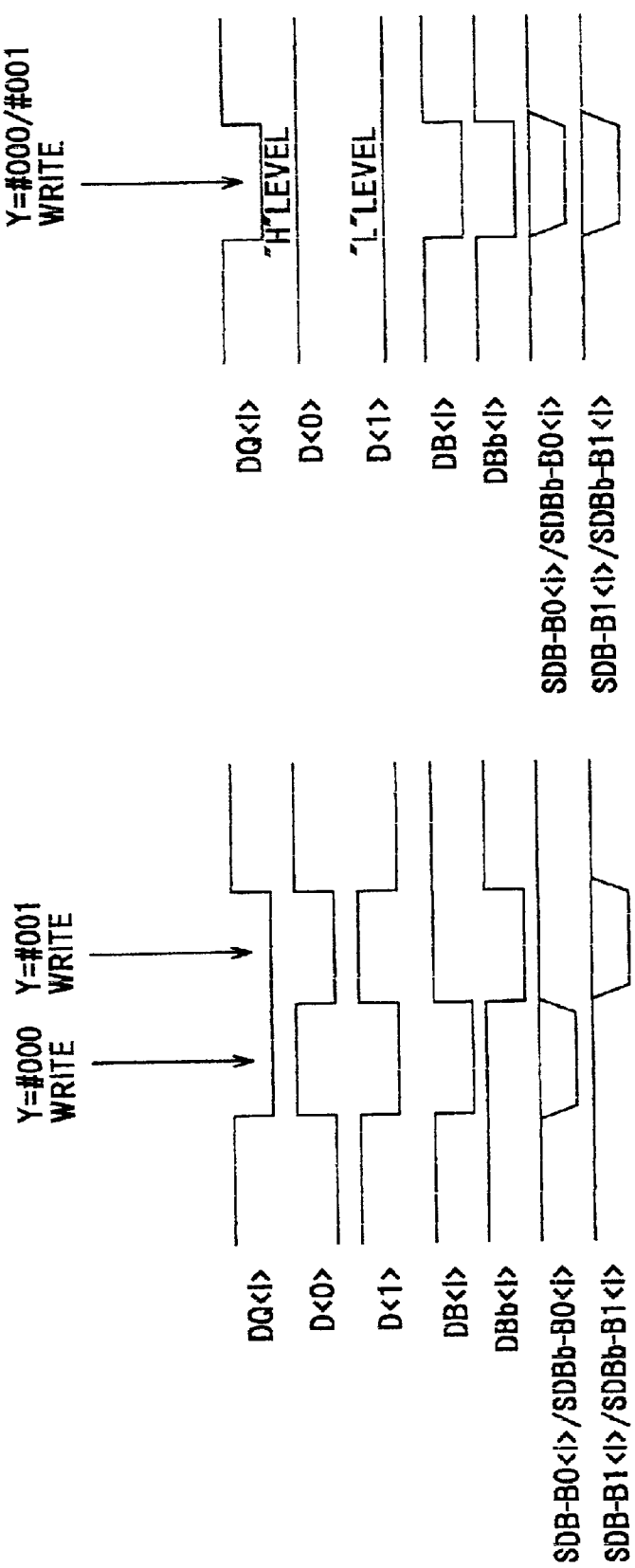
Figure 35:
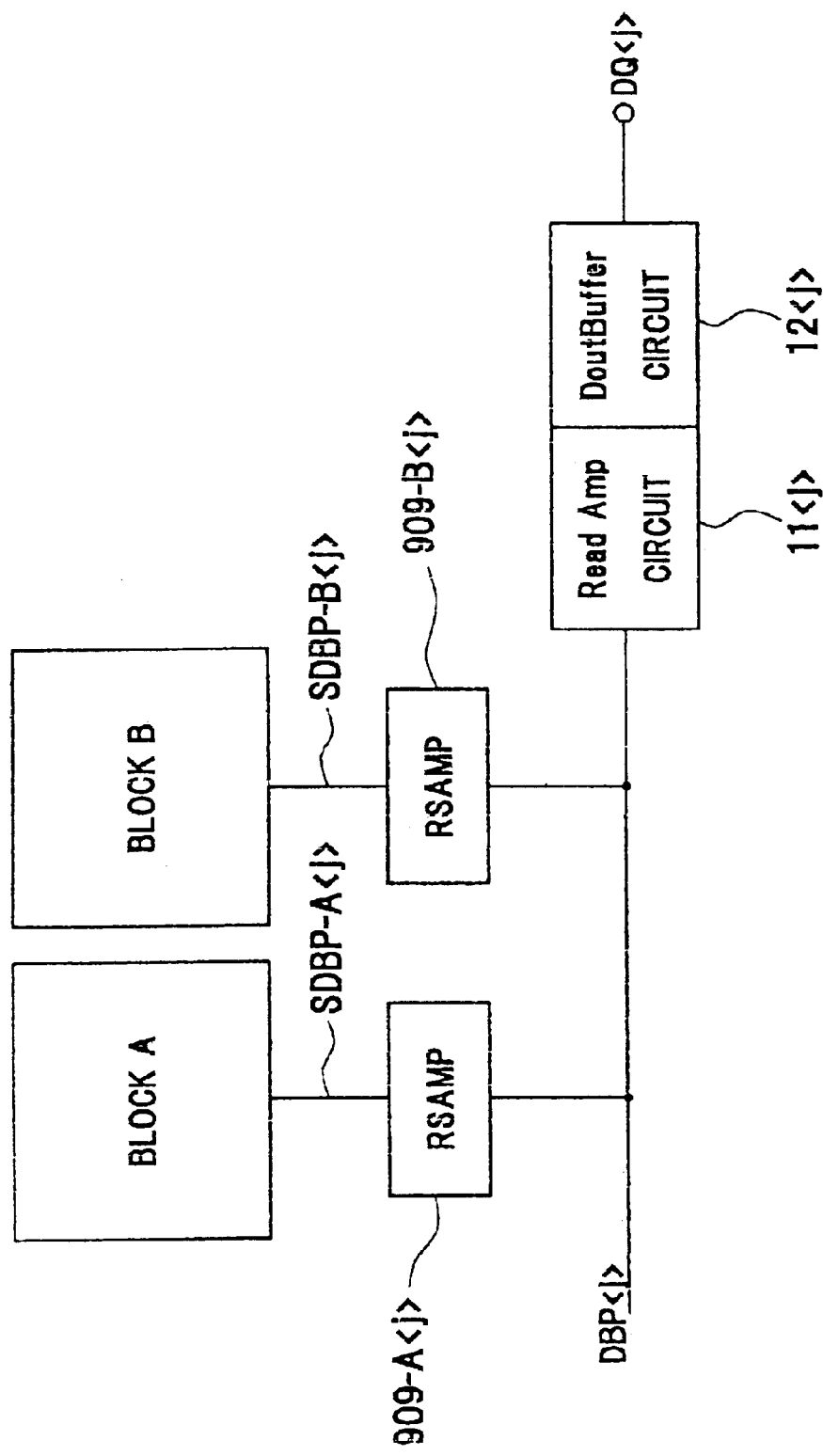
FIG. 35 is a diagram for explaining the data read test in the prior art semiconductor memory device.

In FIG. 34(a), if the data Din (Din="L" in this figure) to be written to the Y-address=#000 is inputted to the data latch/bus write circuit 42<i> through the data I/O pin DQ<i> and the input buffer circuit 41<i>, and the Y-address data AY of the Y-address=#000 is further inputted to the Y-predecode circuit 1, signals D<0> and D<1> become "H" and "L," respectively. With this, in the data latch/bus write circuit 42<i>, the flip-flop circuit ff41 latches the input data Din, the flip-flop circuit ff42 holds its output at the level of "H," and the data bus write circuit dbw41 drives the data bus DB<i> according to the input data Din and holds the data bus DBb<i> at the level of "H."

Furthermore, the EVEN write driver circuit 43-B0<i> drives the EVEN subdata buses SDB-B0<i>, SDBb-B0<i> according to the data Din written to the data bus DB<i>, but the ODD write driver circuit 43-B1<i> drives none of the ODD subdata buses SDB-B1<i>, SDBb-B1 <i>.

Still further, if the column signal CL0-B0 (see FIG. 4) is activated by the Y-decode circuit 4, the data of the EVEN subdata buses SDB-B0<i>, SDBb-B0<i> are transmitted to the bit lines BL and BLb by the sense amplifier circuit SA0<i> of the Y-address=#000 and then written to the memory cell MCL of Y-address=#000.

Again, in FIG. 34(a), if the data Din (Din="L" in this figure) to be written to the Y-address=#001 is inputted to the data latch/bus write circuit 42<i> through the data I/O pin DQ<i> and the input buffer circuit 41<i>, and the Y-address data AY of the Y-address=#001 is further inputted to the Y-predecode circuit 1, signals D<0> and D<1> become "L" and "H," respectively. With this, in the data latch/bus write circuit 42<i>, the flip-flop circuit ff41 holds its output at the level of "H," the flip-flop circuit ff42 latches the input data Din, and the data bus write circuit dbw41 drives the data bus DB<i> to the level "H," and drives the data bus DBb<i> according to the input data Din.

Furthermore, the EVEN write driver circuit 43-B0<i> drives none of the EVEN subdata buses SDB-B0<i>, SDBb-B0<i> but the ODD write driver circuit 43-B1<i> drives the ODD subdata buses SDB-B1<i>, SDBb-B1<i> according to the data Din written to the data bus DB<i>.

Still further, if the column signal CL1-B1 (see FIG. 4) is activated by the Y-decode circuit 4, the data of the ODD subdata buses SDB-B1<i>, SDBb-B1<i> are transmitted to the bit lines BL and BLb by the sense amplifier circuit SA1<i> of the Y-address=#001 and then written to the memory cell MCL of Y-address=#001.

As described above, in the data write operation in the normal mode, the data is transmitted to either the EVEN subdata buses SDB-B0<i>, SDBb-B0<i> or the ODD subdata buses SDB-B1<i>, SDBb-B1<i> and sequentially written to Y-address by Y-address.

Test Mode Operation

In the next, let us discuss the test mode operation which begins when the signal TEST1="H." In this test mode, as shown in FIG. 34(b), as signals D<0> and D<1> are "H" and "L," respectively, the output of the flip-flop circuit ff42 in the data latch/bus write circuit 42<i> becomes "H" and only the flip-flop circuit ff41 operates to latch the input data Din. With this, the output of the flip-flop circuit ff41 is transmitted to the node NW through the inverter circuit inv41 and inputted to the data bus write circuit dbw41, and is also transmitted to the node NWb through the NAND circuits NAND41 and NAND42 and inputted to the data bus write circuit dbw41.

In FIG. 34(b), if the write data Din (Din="L" in this figure) is inputted to the data latch/bus write circuit 42<i> through the data I/O pin DQ<i> and the input buffer circuit 41<i>, and the Y-address data AY of the Y-address=#000 is further inputted to the Y-predecode circuit 1, the flip-flop circuit ff41 in the data latch/bus write circuit 42<i> latches the input data Din, and the data bus write dbw41 drives both of data buses DB<i>, DBb<i> according to the input data Din.

Furthermore, the EVEN write driver circuit 43-B0<i> drives the EVEN subdata buses SDB-B0<i>, SDBb-B0<i> according to the data Din written to the data bus DB<i> while the ODD write driver circuit 43-B1<i> drives the ODD subdata buses SDB-B1<i>, SDBb-B1<i> according to the data Din written to the data bus DBb<i>.

Still further, if the column signals CL0-B0 and CL1-B1 (see FIG. 4) are activated by the Y-decode circuit 4, the data of the EVEN subdata buses SDB-B0<i>, SDBb-B0<i> are transmitted to the bit lines BL and BLb by the sense amplifier circuit SA0<i> of the Y-address=#000 and then written to the memory cell MCL of Y-address=#000. At the same time, the data of the ODD subdata buses SDB-B1<i>, SDBb-B1<i> are transmitted to the bit lines BL and BLb by the sense amplifier circuit SA0<i> of the Y-address=#001 and then written to the memory cell MCL of Y-address=#001.

Again, in FIG. 34(b), if the Y-address data of the Y-address=#010; is inputted to the Y-predecode circuit 1, the flip-flop circuit ff41 in the data latch/bus write circuit 42<i> latches the input data Din (Din="L" in FIG. 34(b)) and the data bus write circuit dbw41 drives the data buses DB<i>, DBb<i> according to the input data.

Furthermore, the EVEN write driver circuit 43-B0<i> drives the EVEN subdata buses SDB-B0<i>, SDBb-B0<i> according to the data Din written to the data bus DB<i> while the ODD write driver circuit 43-B1<i> drives the ODD subdata buses SDB-B1<i>, SDBb-B1<i> according to the data Din written to the data bus DBb<i>.

Still further, if the column signals CL1-B0 and CL3-B1 (see FIG. 4) are simultaneously activated by the Y-decode circuit 4, the data of the EVEN subdata buses SDB-B0<i>, SDBb-B0<i> are transmitted to the bit lines BL and BLb by the sense amplifier circuit SA2<i> of the Y-address=#010, and at the same time, the data of the ODD subdata buses SDB-B1<i>, SDBb-B1<i> are transmitted to the bit lines BL and BLb by the sense amplifier circuit SA3<i> of the Y-address=#011 and then written to the memory cell MCL of Y-address=#011.

As described above, in the data write operation in the test mode, the data is simultaneously transmitted to both of the EVEN subdata buses SDB-B0<i>, SDBb-B0<i> and the ODD subdata buses SDB-B1 <i>, SDBb-B1 <i> and simultaneously written to two degenerate Y-addresses.

As discussed above, according to the fourth embodiment, a plurality of columns being subject to the degenerate substitution in the column redundant substitution are simultaneously activated, and the data are simultaneously written to a plurality of the memory cells selected by the above activated columns, so that the parallel write becomes possible in the test, thus the period of time needed for the test being shortened to a great extent.

Furthermore, as discussed above, according to the present invention, a plurality of columns being subject to the degenerate substitution in the column redundant substitution are simultaneously activated, and the data are simultaneously read out from a plurality of the memory cells selected by the above activated columns or simultaneously written to the above memory cells, so that there can be obtained such advantageous effects that the parallel test becomes possible even in the semiconductor memory device having no function of executing the test including the redundant substitute, block selection and so forth, thus the period of time needed for the test being shortened to a great extent.

What is claimed is:

1. A semiconductor memory device having a memory portion wherein data read/write is carried out by means of an EVEN/ODD system provided with an EVEN subdata bus and an ODD subdata bus, the semiconductor memory device comprising:

a column control circuit that simultaneously activates a plurality of columns which are subject to degenerate substitution in column redundant substitution;

a data read-out circuit that simultaneously reads out data from a plurality of memory cells as selected by said plurality of columns, said data read-out circuit reading out data of the memory cells of a first address to said EVEN subdata bus and reading out data of memory cells of a second address to said ODD subdata bus, with regard to simultaneously activated columns of the first and second addresses; and a judgement circuit that judges the data as read out to said EVEN subdata bus and the data as read out to said ODD subdata bus.

2. The semiconductor memory device as claimed in claim 1, further comprising an equalizer that equalizes said EVEN subdata bus and said ODD subdata bus at a same timing.

3. The semiconductor memory device as claimed in claim 1, further comprising an expected value circuit that generates an expected value of a correct read-out data, according to which said judgement circuit judges if a plurality of data as simultaneously read out are correct or not.

4. The semiconductor memory device as claimed in claim 1, further comprising:

an EVEN read sense amplifier that amplifies the data as read out to said EVEN subdata bus and outputs the amplified data to said judgement circuit; and an ODD read sense amplifier that amplifies the data as read out to said ODD subdata bus and outputs the amplified data to said judgement circuit;

wherein either said EVEN read sense amplifier or said ODD read sense amplifier outputs said judgement data transmitted from said judgement circuit to a data bus.

5. The semiconductor memory device as claimed in claim 4, further comprising:

a fixing circuit that fixes the EVEN and ODD read sense amplifier circuits to which no judgement data is transmitted, to a non-activated state.

6. The semiconductor memory device as claimed in claim 4, wherein there is provided in either said EVEN read sense amplifier or said ODD read sense amplifier circuit, a circuit that matches a configuration of one of said EVEN and ODD read sense amplifier circuits to that of an other of said EVEN and ODD read sense amplifier circuits.

7. The semiconductor memory device as claimed in claim 3, wherein with respect to adjacent bit line pairs, said expected value circuit generates the same expected values under a first setting condition while it generates different expected values under a second setting condition.

8. The semiconductor memory device as claimed in claim 1, further comprising:

a data write circuit that simultaneously writes data to a plurality of memory cells selected by a plurality of said activated columns.

9. The semiconductor memory device as claimed in claim 1, further comprising:

a data write circuit that simultaneously writes data to a plurality of memory cells selected by a plurality of said activated columns, wherein with respect to the simultaneously activated columns of the first address and the simultaneously activated columns of the second address, said data write circuit simultaneously transmits the data to said EVEN subdata bus and said ODD subdata bus, and writes the data to a memory cell of the first address through said EVEN subdata bus while it writes the data to a memory cell of the second address through said ODD subdata bus.

10. A semiconductor memory device having a memory portion wherein data read/write is carried out by means of an EVEN/ODD system provided with an EVEN subdata bus and an ODD subdata bus, the semiconductor memory device comprising:

a column control circuit that simultaneously activates a plurality of columns which are subject to degenerate substitution in a column redundant substitution; and a data write circuit that simultaneously writes data to a plurality of memory cells as selected by said plurality of columns, wherein with respect to the simultaneously activated columns of a first address and the simultaneous activated columns of a second address, said data write circuit simultaneously transmits data to said EVEN subdata bus and said ODD subdata bus, and writes the data to a memory cell of the first address through said EVEN subdata bus while it writes the data to a memory cell of the second address through said ODD subdata bus.

* * * * *